(12) United States Patent
Cheng

(10) Patent No.: US 12,101,926 B2
(45) Date of Patent: *Sep. 24, 2024

(54) CAPACITOR, MEMORY DEVICE, AND METHOD

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/352,738

(22) Filed: Jul. 14, 2023

(65) Prior Publication Data

US 2023/0363145 A1 Nov. 9, 2023

Related U.S. Application Data

(63) Continuation of application No. 17/196,221, filed on Mar. 9, 2021, now Pat. No. 11,729,967.

(Continued)

(51) Int. Cl.
*H10B 12/00* (2023.01)
*H01L 21/02* (2006.01)
(Continued)

(52) U.S. Cl.
CPC ........ *H10B 12/33* (2023.02); *H01L 21/02603* (2013.01); *H01L 21/2251* (2013.01);
(Continued)

(58) Field of Classification Search
CPC ...... H10B 12/33; H10B 12/036; H10B 12/05; H10B 12/36; H10B 12/056; H01L 21/02603; H01L 21/2251; H01L 29/0673; H01L 29/42392; H01L 29/66181; H01L 29/66742; H01L 29/78696; H01L 29/94; H01L 29/1079; H01L 28/60; H01L 29/0847; H01L 29/775; H01L 27/0629; H01L 25/0657; H01L 24/06; H01L 24/09; H01L 24/94; H01L 27/0688; H01L 29/0665; H01L 29/41791; B82Y 10/00
(Continued)

(56) References Cited

U.S. PATENT DOCUMENTS 9,236,267 B2  1/2016  De et al.
9,502,265 B1  11/2016  Jiang et al.
(Continued)

FOREIGN PATENT DOCUMENTS

CN  1482667 A  3/2004

*Primary Examiner* — Tong-Ho Kim
(74) *Attorney, Agent, or Firm* — Seed IP Law Group LLP

(57) ABSTRACT

A device includes a substrate. A first nanostructure is over the substrate, and includes a semiconductor having a first resistance. A second nanostructure is over the substrate, is offset laterally from the first nanostructure, is at about the same height above the substrate as the first nanostructure, and includes a conductor having a second resistance lower than the first resistance. A first gate structure is over and wrapped around the first nanostructure, and a second gate structure is over and wrapped around the second nanostructure.

20 Claims, 37 Drawing Sheets

Related U.S. Application Data

(60) Provisional application No. 63/049,525, filed on Jul. 8, 2020.

(51) Int. Cl.
   *H01L 21/225* (2006.01)
   *H01L 29/06* (2006.01)
   *H01L 29/423* (2006.01)
   *H01L 29/66* (2006.01)
   *H01L 29/786* (2006.01)
   *H01L 29/94* (2006.01)

(52) U.S. Cl.
   CPC .... *H01L 29/0673* (2013.01); *H01L 29/42392* (2013.01); *H01L 29/66181* (2013.01); *H01L 29/66742* (2013.01); *H01L 29/78696* (2013.01); *H01L 29/94* (2013.01); *H10B 12/036* (2023.02); *H10B 12/05* (2023.02)

(58) Field of Classification Search
   USPC ........................................................ 257/296
   See application file for complete search history.

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 11,729,967 B2 * | 8/2023 | Cheng .................. H01L 29/775 |
| 2007/0126044 A1 | 6/2007 | Shioya et al. |
| 2017/0256611 A1 | 9/2017 | Kim et al. |
| 2018/0083046 A1 | 3/2018 | Cheng et al. |
| 2019/0051734 A1 | 2/2019 | Lin et al. |
| 2020/0044087 A1 | 2/2020 | Guha et al. |
| 2020/0194435 A1 | 6/2020 | Lilak et al. |

* cited by examiner

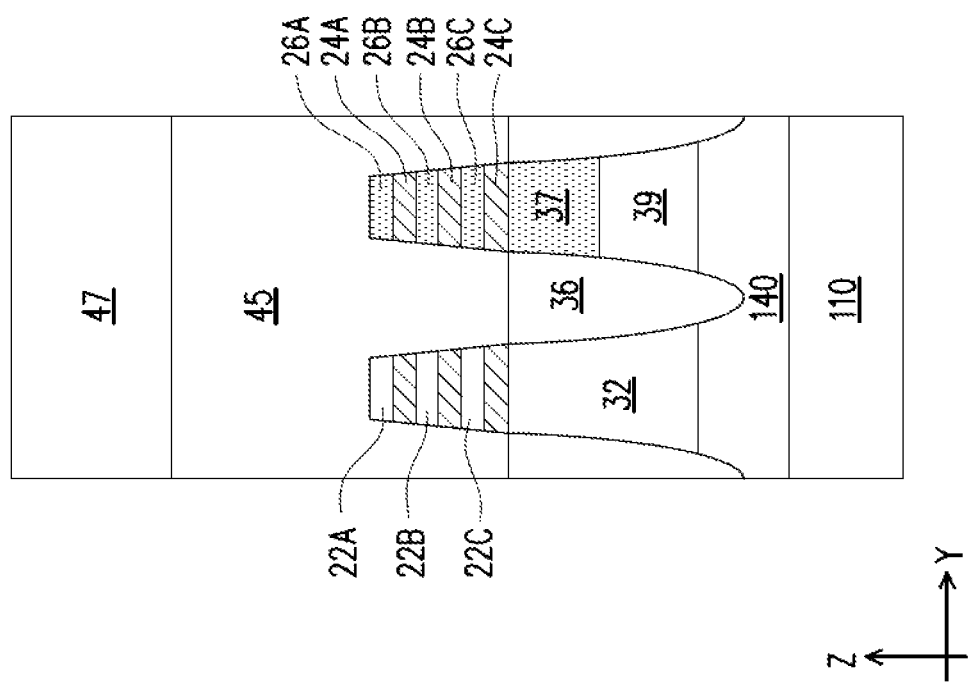
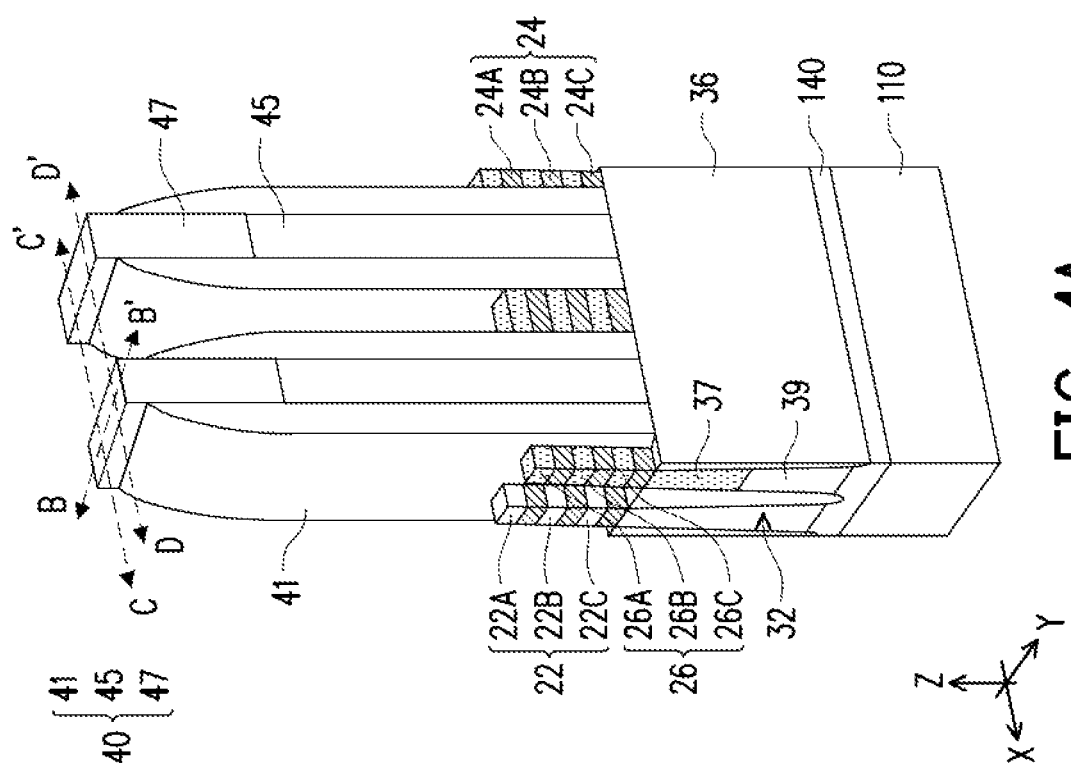
FIG. 4B
FIG. 4A

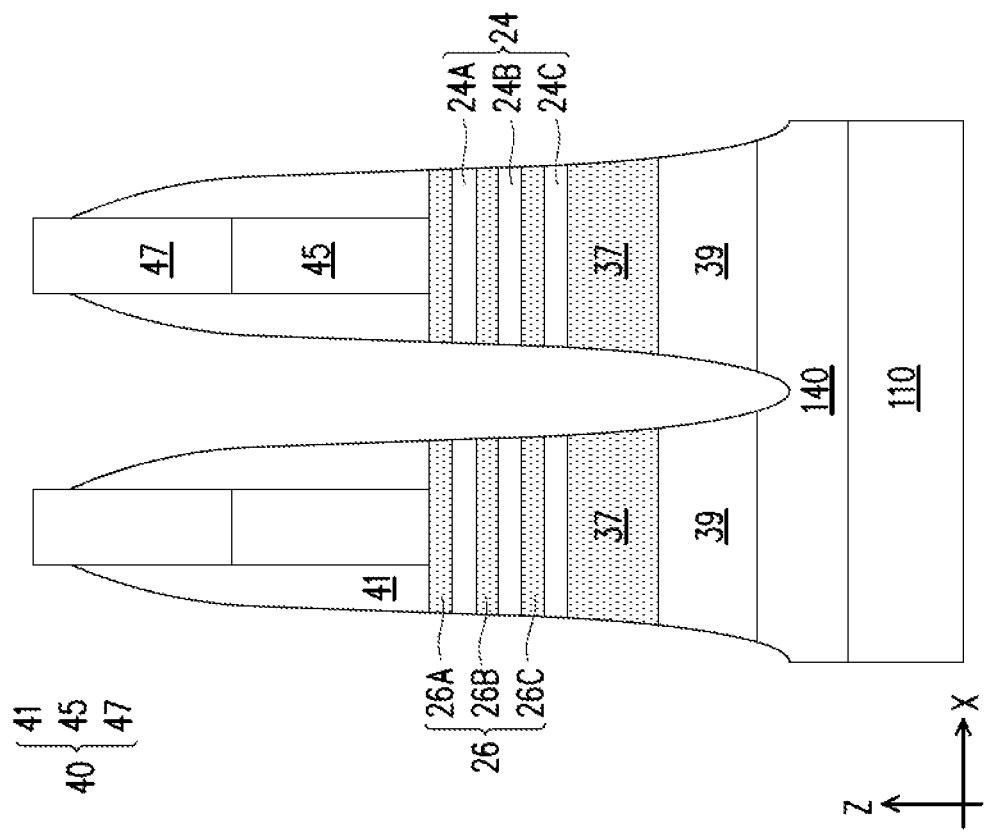
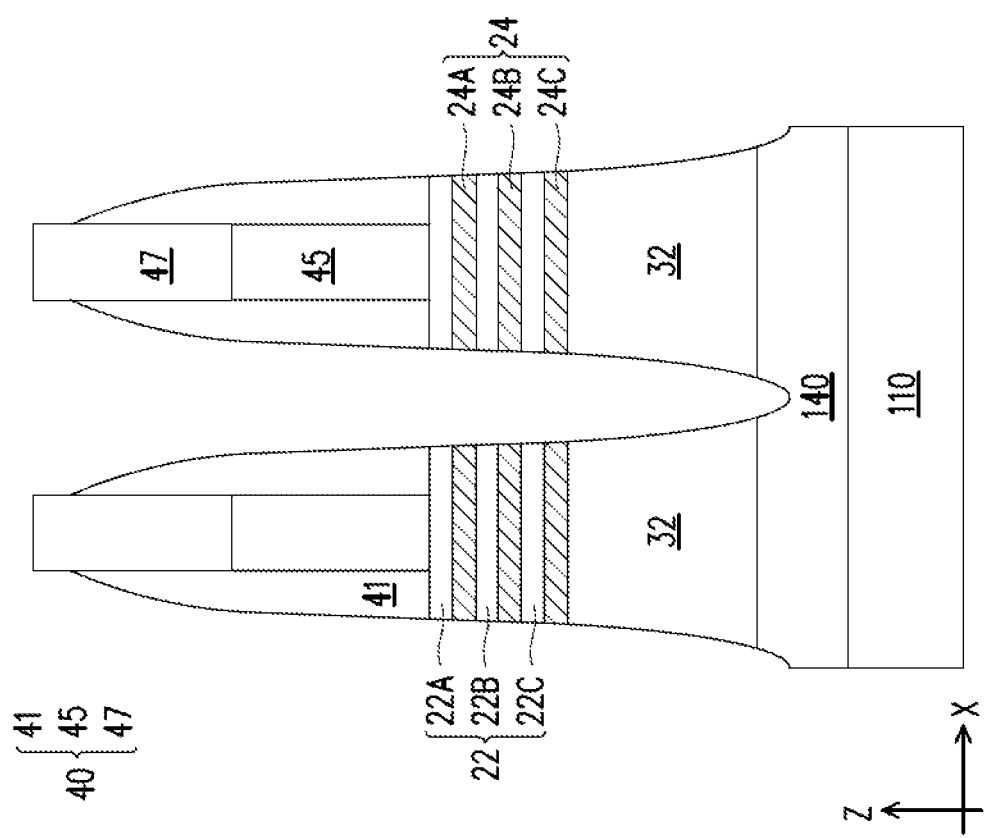

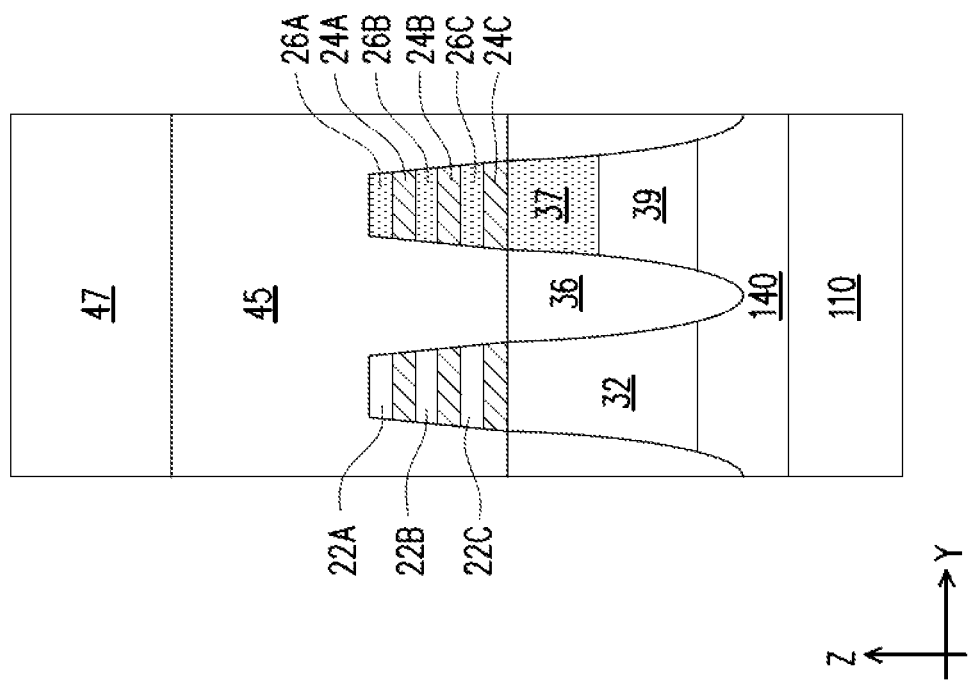
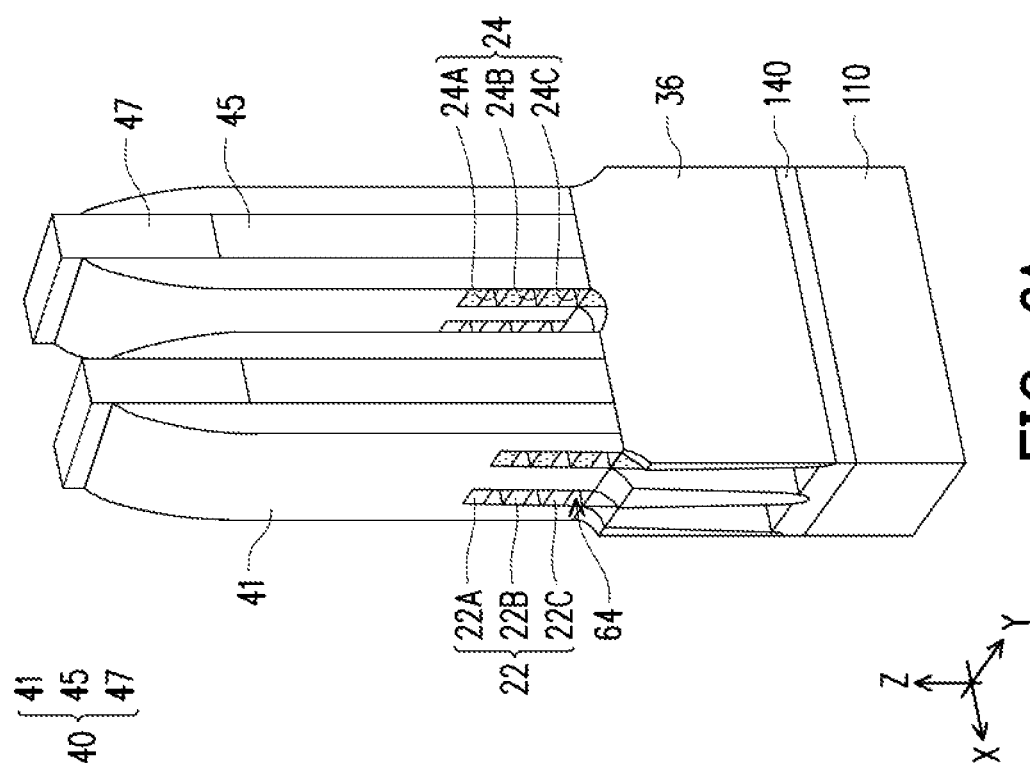
FIG. 6B
FIG. 6A

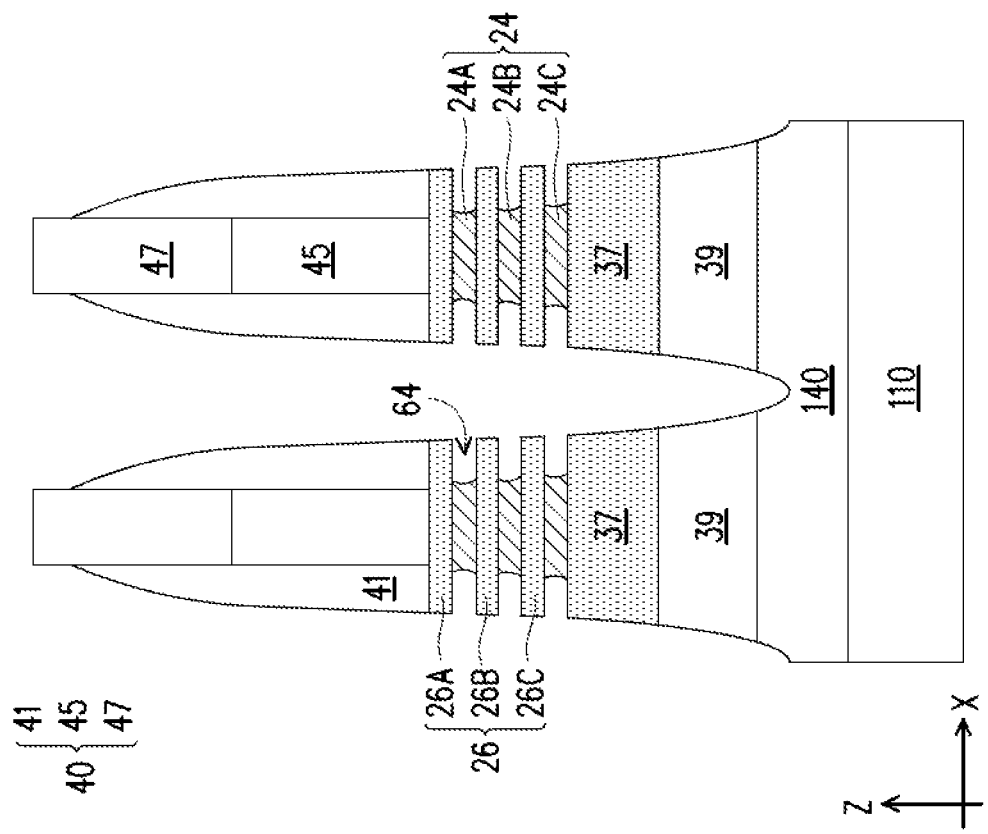
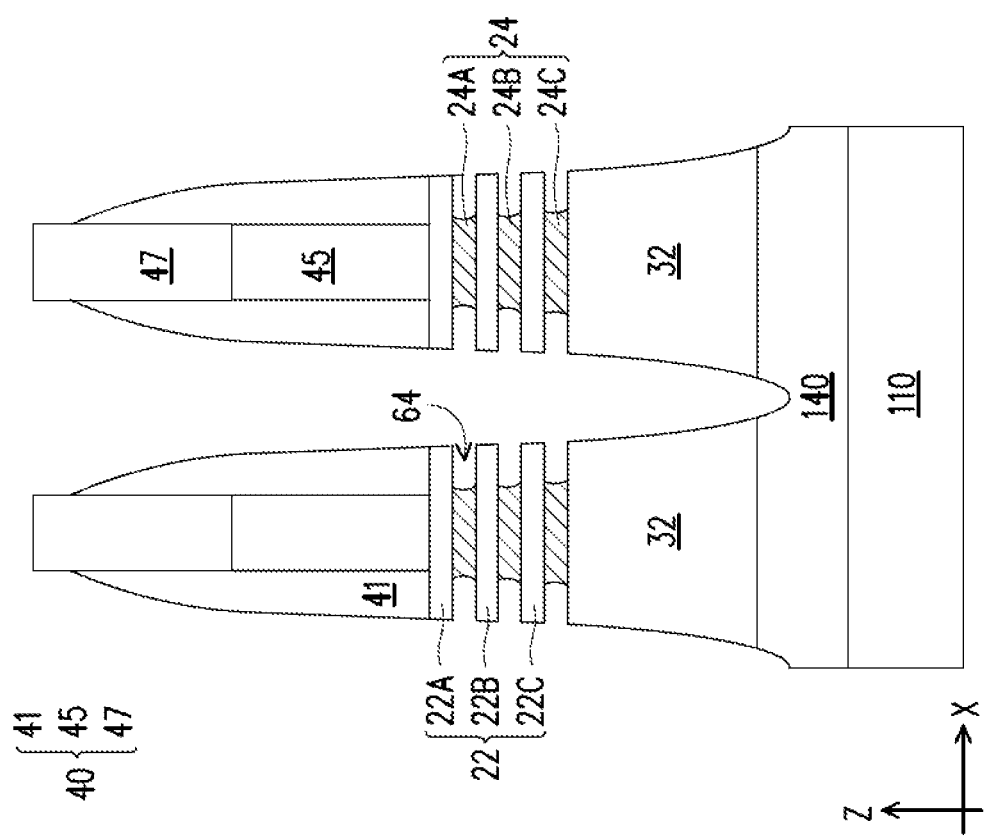
FIG. 6D
FIG. 6C

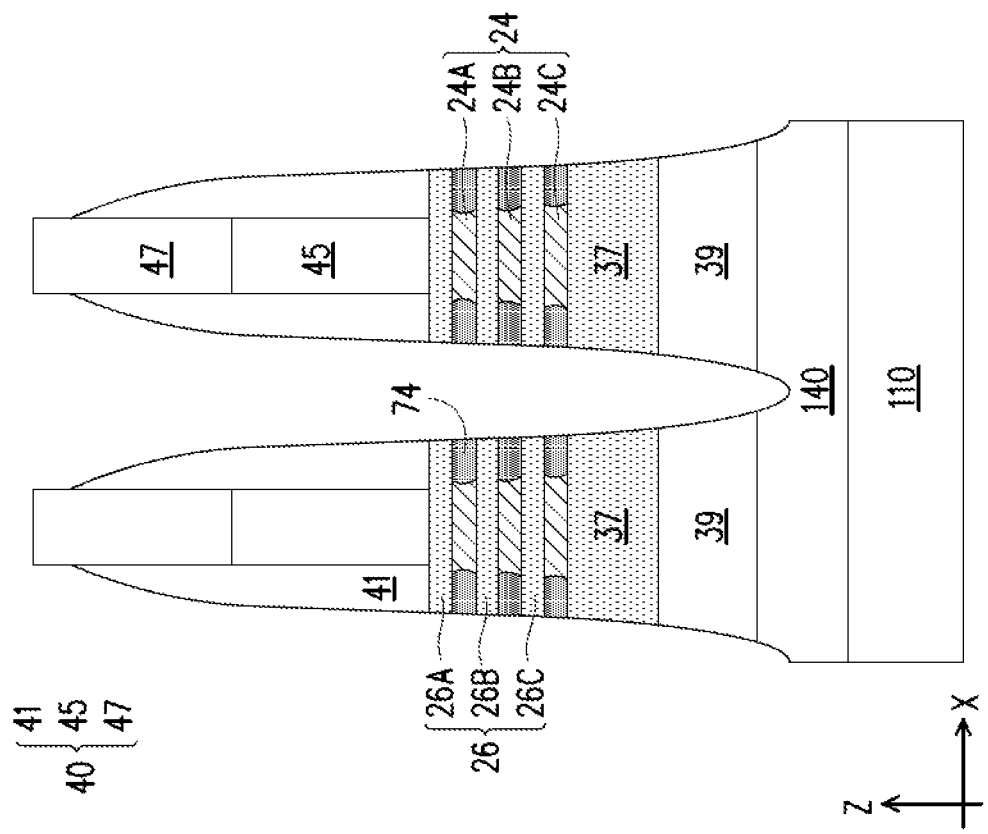
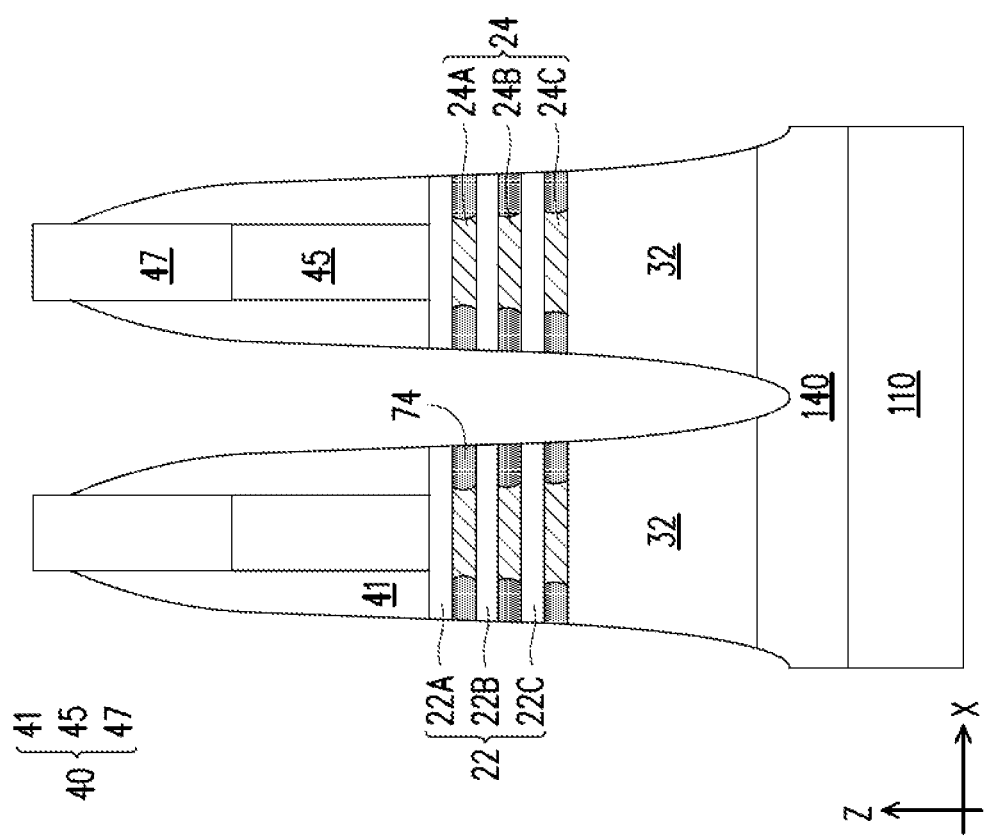

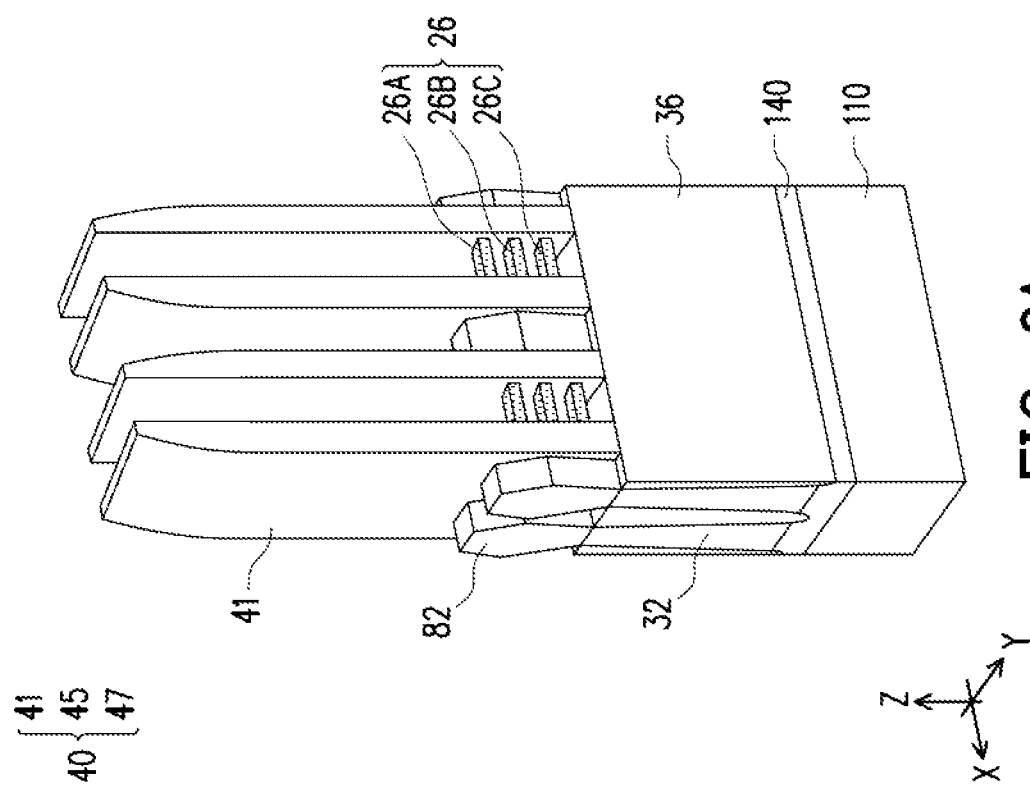
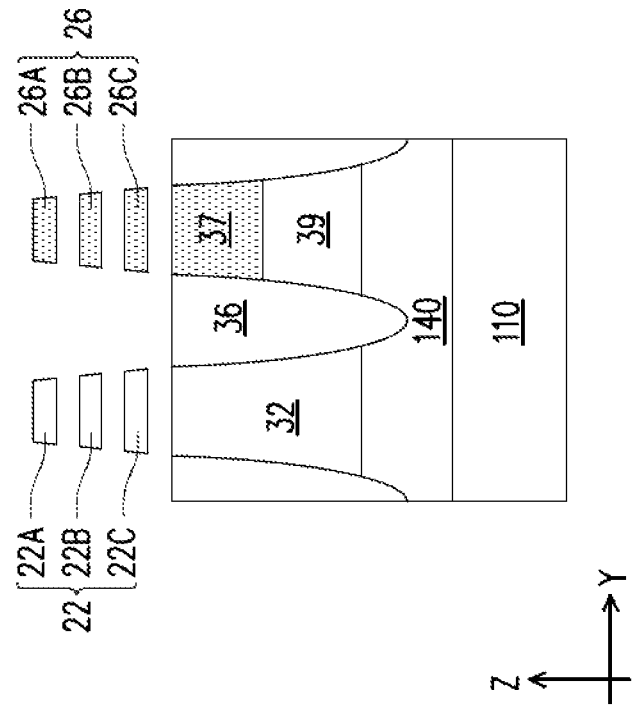
FIG. 9A
FIG. 9B

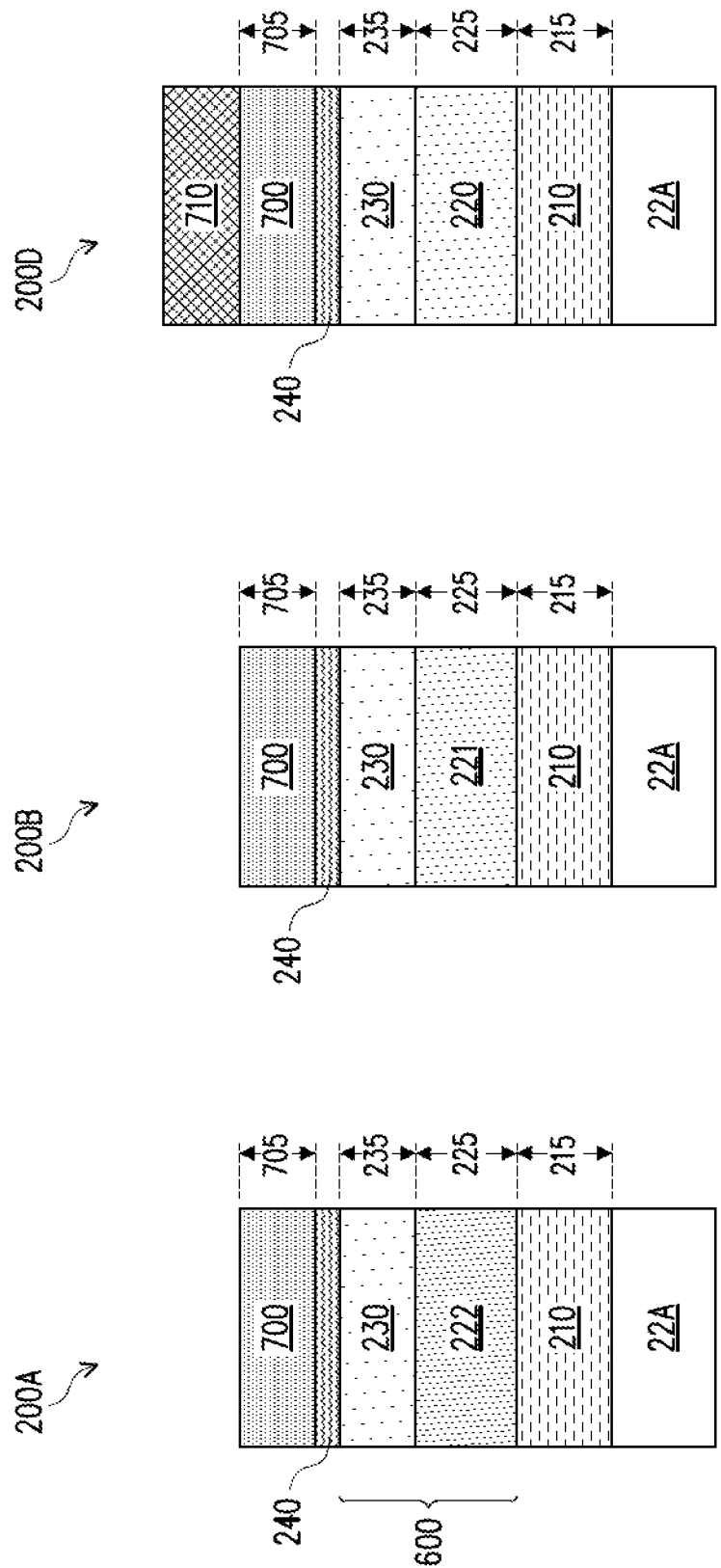

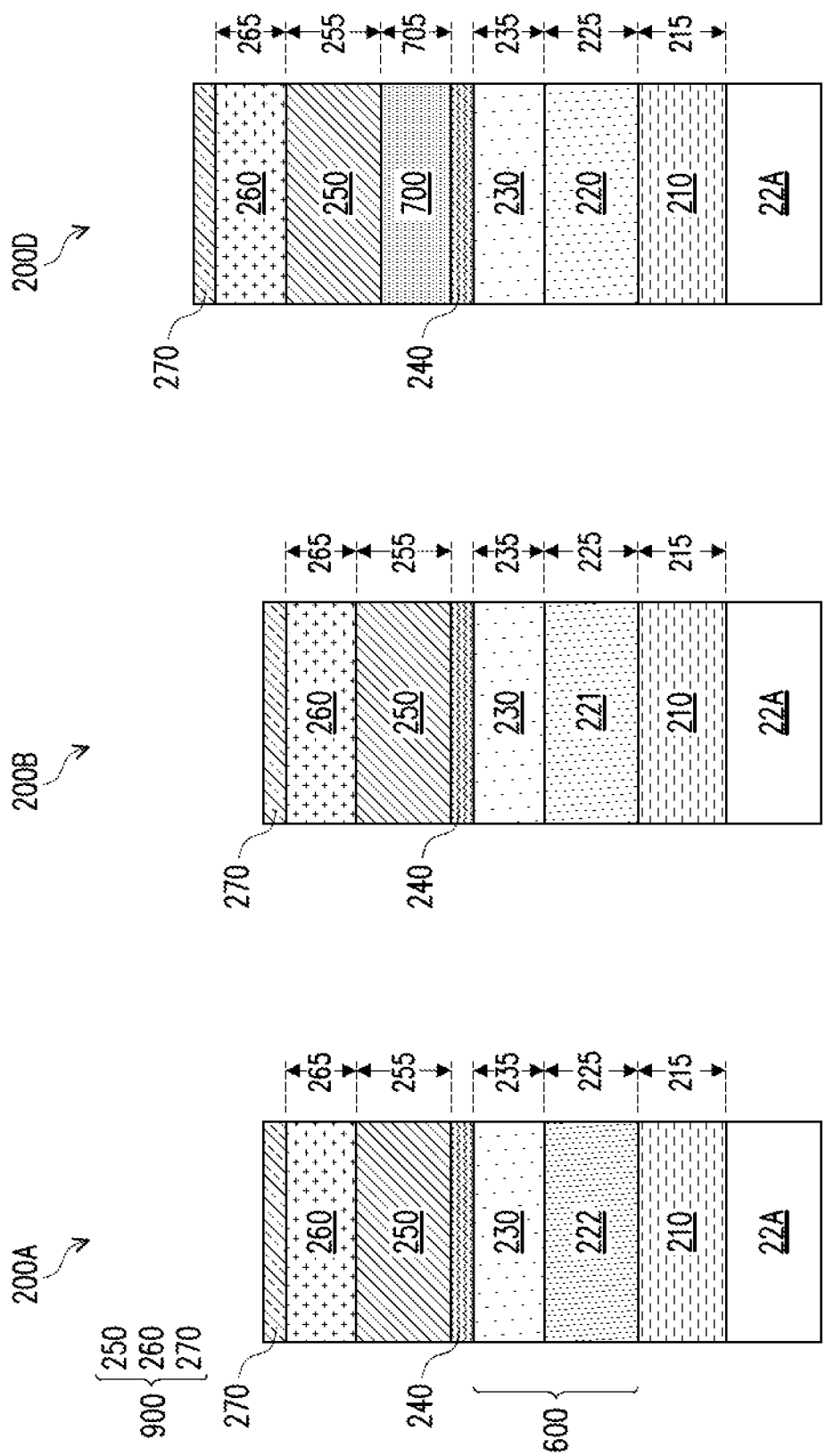

CAPACITOR, MEMORY DEVICE, AND METHOD

PRIORITY CLAIM AND CROSS-REFERENCE

This application is a Continuation of U.S. application Ser. No. 17/196,221, filed on Mar. 9, 2021 which claims the benefit of priority to U.S. Provisional Application Ser. No. 63/049,525, entitled "A GAA CAPACITANCE DEVICE STRUCTURE IN INTEGRATED SEMICONDUCTOR DEVICE AND METHOD OF FABRICATING THE SAME," filed on Jul. 8, 2020, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-10D are views of various embodiments of an IC device of at various stages of fabrication according to various aspects of the present disclosure.

FIGS. 12A-15C are views of various embodiments of an IC device of at various stages of fabrication according to various aspects of the present disclosure.

DETAILED DESCRIPTION

Figure 1A:
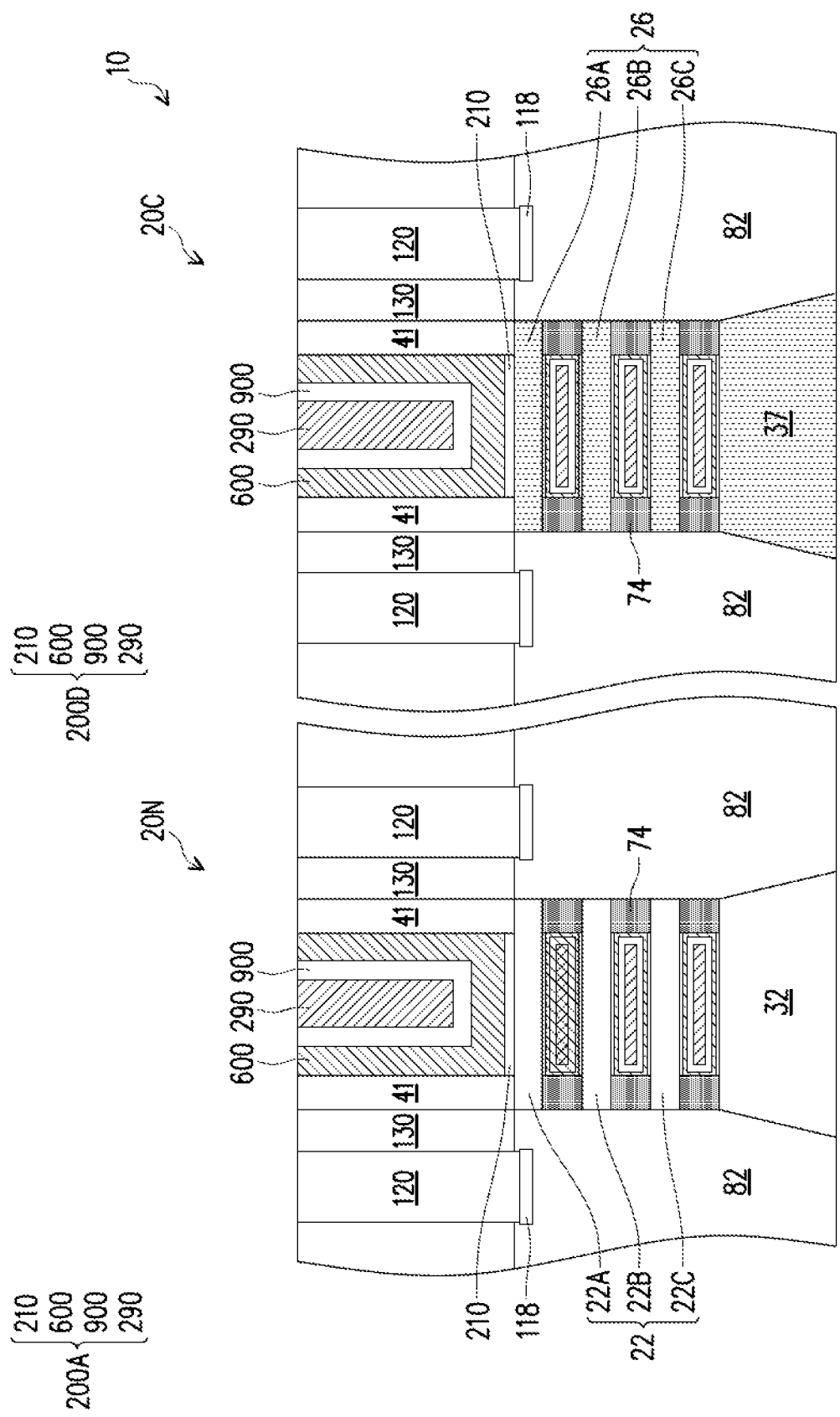
FIG. 1A-1E are diagrammatic cross-sectional side views of portions of IC devices fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or gate-all-around (GAA) devices. Dimension scaling (down) is increasingly difficult in advanced technology nodes. Three-dimensional device structures, such as FinFETs and/or GAA devices, are promising for increasing device density by overcoming certain problems with dimension shrinkage. It is desirable to integrate not only transistor devices, but also passive devices, such as capacitors, in advanced technology nodes. Techniques and structures described herein provide 3D GAA capacitance devices and fabrication methods thereof that increase device density.

The 3D GAA capacitance device may be formed through various processes. A semiconductor lattice including two semiconductor layer types, such as silicon and SiGe, is formed and patterned to establish multi-layer active fins. The active fins are separated by isolation regions formed between the active fins and recessed below the height of the active fins. In one configuration, the active fins are heavily doped by solid phase diffusion (SPD) or implantation. In another configuration, channels of the active fins are replaced with a conductor, such as a metal nitride. Dummy gate structures, inner spacers, and source/drain regions are formed. The dummy gate structures are replaced with active gate structures including an interfacial layer(s), a high-k gate dielectric layer(s), and work function and other metal layers. Mid-end-of-line (MEOL) and back-end-of-line (BEOL) structures are formed over the 3D GAA capacitance devices to establish metal routing for electrical connection between the 3D GAA capacitance devices and other circuit elements of an integrated circuit.

FIG. 1A illustrates a diagrammatic cross-sectional side view of a portion of an IC device 10 fabricated according to embodiments of the present disclosure, where the IC device 10 includes gate-all-around (GAA) devices 20N, 20C. The GAA devices 20N, 20C may include at least an NFET or a PFET in some embodiments. For example, the GAA device 20N is an NFET in some embodiments. The GAA device 20C is a GAA capacitor, which is an integrated capacitor, in accordance with some embodiments, and may be referred to alternately as "GAA capacitor 20C" throughout.

The cross-sectional view of the IC device 10 in FIG. 1A is taken along an X-Z plane, where the X-direction is the horizontal direction, and the Z-direction is the vertical direction. The GAA device 20N and the GAA capacitor 20C are similar in many respects, with a difference being that the GAA device 20N includes channels 22A-22C (alternately referred to as "nanostructures") over a fin structure 32, and the GAA capacitor 20C includes doped channels 26A-26C (alternately referred to as "doped nanostructures") over a doped fin structure 37.

In some embodiments, the doped channels 26A-26C and the doped fin structure 37 comprise dopants, such as boron, though other suitable dopants may also be included, such as aluminum, gallium, indium, or the like. In some embodiments, concentration of the dopants in the doped channels 26A-26C and the doped fin structure 37 is in a range of about 1E16 atoms/cm$^3$ to about 1E21 atoms/cm$^3$. For simplicity of description in the following, the channels 22A-22C and the doped channels 26A-26C may be referred to collectively as "the channels 22A-22C, 26A-26C." In some embodiments, the channels 22A-22C are lightly doped or undoped. In some embodiments, the channels 22A-22C are doped with the same dopant(s) as the doped channels 26A-26C, but at a lower doping concentration. In some embodiments, a ratio of doping concentration (e.g., average doping concentration) in the doped channels 26A-26C to doping concentration (e.g., average doping concentration) in the channels 22A-22C is greater than 100.

The channels 22A-22C, 26A-26C are laterally abutted by source/drain features 82, and covered and surrounded by gate structures 200A, 200D. The gate structure 200A controls flow of electrical current through the channels 22A-22C based on voltages applied at the gate structure 200A and at the source/drain features 82. The gate structure 200D acts as a first plate, or first electrode, of the GAA capacitor 20C. The doped channels 26A-26C and the doped fin structure 37 act as a second plate, or second electrode, of the GAA capacitor 20C.

In some embodiments, the doped channels 26A-26C are conductive, having a second resistance lower than a first resistance of the channels 22A-22C, which are semiconductive. In some embodiments, a ratio of the first resistance to the second resistance is greater than about 100. In some embodiments, the first resistance and the second resistance are both sheet resistance. In some embodiments, the second resistance is less than about 100 ohms/sq. The second resistance being greater than about 100 ohms/square may lead to unacceptable signal loss and delay. In some embodiments, the first resistance is resistance measured when the gate structure 200A is biased at a voltage below a threshold voltage of the GAA device 20N. In some embodiments, the voltage is ground or floating.

In some embodiments, the fin structure 32 and the doped fin structure 37 include silicon. In some embodiments, the GAA device 20N is an NFET, and the source/drain features 82 thereof include silicon phosphorous (SiP). In some embodiments, the GAA device 20N is a PFET, and the source/drain features 82 include SiGe. In some embodiments, the GAA device 20C may be considered a P-type device, and the source/drain features 82 thereof include SiGe.

The channels 22A-22C, 26A-26C each include a semiconductive material, for example silicon or a silicon compound, such as silicon germanium, or the like. The channels 22A-22C, 26A-26C are nanostructures (e.g., having sizes that are in a range of a few nanometers) and may also each have an elongated shape and extend in the X-direction. In some embodiments, the channels 22A-22C, 26A-26C each have a nano-wire (NW) shape, a nano-sheet (NS) shape, a nano-tube (NT) shape, or other suitable nanoscale shape. The cross-sectional profile of the channels 22A-22C, 26A-26C may be rectangular, round, square, circular, elliptical, hexagonal, or combinations thereof.

In some embodiments, the lengths (e.g., measured in the X-direction) of the channels 22A-22C, 26A-26C may be different from each other, for example due to tapering during a fin etching process. In some embodiments, length of the channel 22A may be less than a length of the channel 22B, which may be less than a length of the channel 22C. Similarly, length of the doped channel 26A may be less than a length of the doped channel 26B, which may be less than a length of the doped channel 26C. The channels 22A-22C, 26A-26C each may not have uniform thickness, for example due to a channel trimming process used to expand spacing (e.g., measured in the Z-direction) between the channels 22A-22C, 26A-26C to increase gate structure fabrication process window. For example, a middle portion of each of the channels 22A-22C, 26A-26C may be thinner than the two ends of each of the channels 22A-22C, 26A-26C. Such shape may be collectively referred to as a "dog-bone" shape.

In some embodiments, the spacing between the channels 22A-22C, 26A-26C (e.g., between the channel 22B and the channel 22A or the channel 22C) is in a range between about 8 nanometers (nm) and about 12 nm. In some embodiments, a thickness (e.g., measured in the Z-direction) of each of the channels 22A-22C, 26A-26C is in a range between about 5 nm and about 8 nm. In some embodiments, a width (e.g., measured in the Y-direction, not shown in FIG. 1A, orthogonal to the X-Z plane) of each of the channels 22A-22C, 26A-26C is at least about 8 nm.

The gate structures 200A, 200D, are disposed over and between the channels 22A-22C, 26A-26C, respectively. Integrated circuit devices such as the IC device 10 frequently include transistors having different threshold voltages based on their function in the IC device. For example, input/output (IO) transistors typically have the highest threshold voltages due to the high current handling required of the IO transistors. Core logic transistors typically have the lowest threshold voltages to achieve higher switching speeds at lower operating power. A third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages. Careful design of the gate structure 200A may provide tuning of the threshold voltage of the GAA device 20N.

In some embodiments, threshold voltage tuning is achieved by driving at least one specific dopant into one or more gate dielectric layers 600 of the gate structures 200A. In some embodiments, threshold voltage tuning is alternately or further achieved by adding one or more barrier layers 700 (also referred to as "work function barrier layers," see FIG. 13A-14C) between the gate dielectric layers 600 and the metal fill layer 290.

A first interfacial layer (IL) 210, which may be an oxide of the material of the channels 22A-22C, 26A-26C, is formed on exposed areas of the channels 22A-22C, 26A-26C and the top surface of the fin 32. The first IL 210 promotes adhesion of the gate dielectric layers 600 to the channels 22A-22C, 26A-26C. In some embodiments, the first IL 210 has thickness of about 5 Angstroms (A) to about 50 Angstroms (A). In some embodiments, the first IL 210 has thickness of about 10 A. The first IL 210 having thickness that is too thin may exhibit voids or insufficient adhesion properties. The first IL 210 being too thick consumes gate fill window, which is related to threshold voltage tuning and resistance. In some embodiments, thickness of the first IL 210 in the gate structure 200A may be substantially the same as thickness of the first IL 210 in the gate structure 200D. In some embodiments, the thicknesses of the first ILs 210 of the gate structures 200A, 200D differ by at least about 2 angstroms or by at least about 20%. In some embodiments, thickness of the first IL 210 over the channels 22A, 26A is greater than thickness over the channels 22B, 26B, which is in turn greater than over the channels 22C, 26C, which is greater than over the fin 32 or the doped fin structure 37.

In some embodiments, the gate dielectric layers 600 include a high-k gate dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layers 600 in the gate structure 200A have different material composition than the gate dielectric layers 600 in the gate structure 200D. In some embodiments, the gate dielectric layers 600 have total thickness of about 10 Å to about 100 Å, which may be similar to, or somewhat thicker than, the first IL 210. In some embodiments, thickness of the dielectric layers 600 over the channels 22A, 26A is greater than over the channels 22B, 26B, which is greater than over the channels 22C, 26C, which is greater than over the fin 32 or the doped fin structure 37.

In some embodiments, at least one of the gate dielectric layers 600 may further include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning, while others of the gate dielectric layers 600 are substantially devoid of the dopants. As one example, for N-type transistor devices, lanthanum ions in higher concentration reduce the threshold voltage relative to layers with lower concentration or devoid of lanthanum ions, while the reverse is true for P-type devices.

The gate structures 200A, 200D further include one or more work function metal layers, represented collectively as work function metal layers 900. In the GAA device 20N, which is an NFET in most embodiments, the work function metal layers 900 may include at least an N-type work function metal layer, an in-situ capping layer, and an oxygen blocking layer. In some embodiments, the work function metal layers 900 include more or fewer layers than those described. In the GAA capacitor 20C, which is P-type in most embodiments, the work function metal layers 900 are substantially the same as in the GAA device 20N.

Figure 15C:
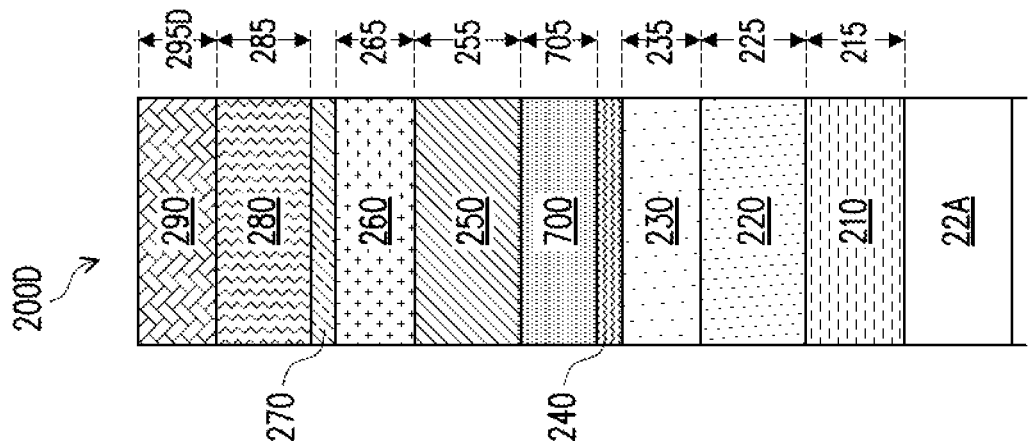
Figure 15B:
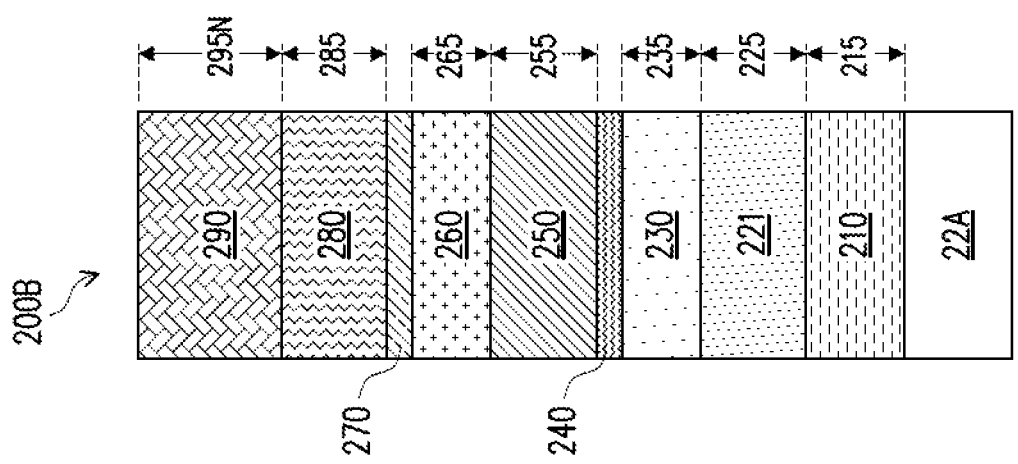
Figure 15A:
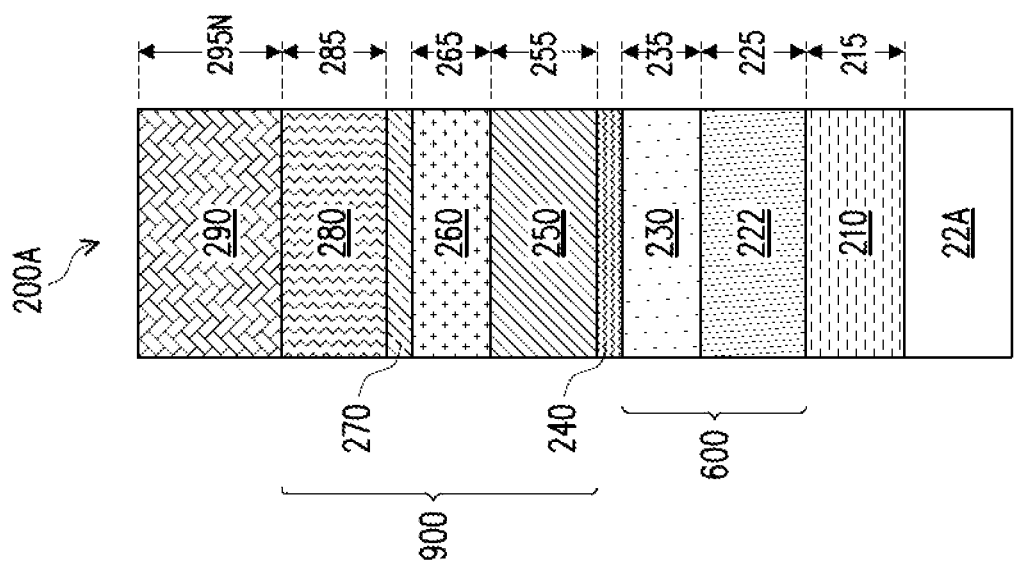

The gate structures 200A, 200D also include metal fill layer 290. The metal fill layer 290 may include a conductive material such as tungsten, cobalt, ruthenium, iridium, molybdenum, copper, aluminum, or combinations thereof. Between the channels 22A-22C, 26A-26C, the metal fill layer 290 is circumferentially surrounded (in the cross-sectional view) by the one or more work function metal layers 900, which are then circumferentially surrounded by the gate dielectric layers 600. In the portion of the gate structures 200A, 200D formed over the channel 22A, 26A most distal from the fin 32, 37, the metal fill layer 290 is formed over the one or more work function metal layers 900. The one or more work function metal layers 900 wrap around the metal fill layer 290. The gate dielectric layers 600 also wrap around the one or more work function metal layers 900. The gate structures 200A, 200D may also include a glue layer that is formed between the one or more work function layers 900 and the metal fill layer 290 to increase adhesion. The glue layer is not specifically illustrated in FIG. 1A for simplicity, but is shown in FIGS. 15A-15C.

The GAA devices 20N, 20C also include gate spacers 41 and inner spacers 74 that are disposed on sidewalls of the first gate dielectric layers 222, 220. The inner spacers 74 are also disposed between the channels 22A-22C, 26A-26C. The gate spacers 41 and the inner spacers 74 may include a dielectric material, for example a low-k material such as SiOCN, SiON, SiN, or SiOC.

The GAA devices 20N, 20C further include source/drain contacts 120 that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer 118 may contain a metal silicide material, such as cobalt silicide in some embodiments, or TiSi in some other embodiments.

The GAA devices 20N, 20C further include an interlayer dielectric (ILD) 130. The ILD 130 provides electrical isolation between the various components of the GAA devices 20N, 20C discussed above, for example between the gate structures 200A, 200D and the source/drain contacts 120.

Figure 1B:
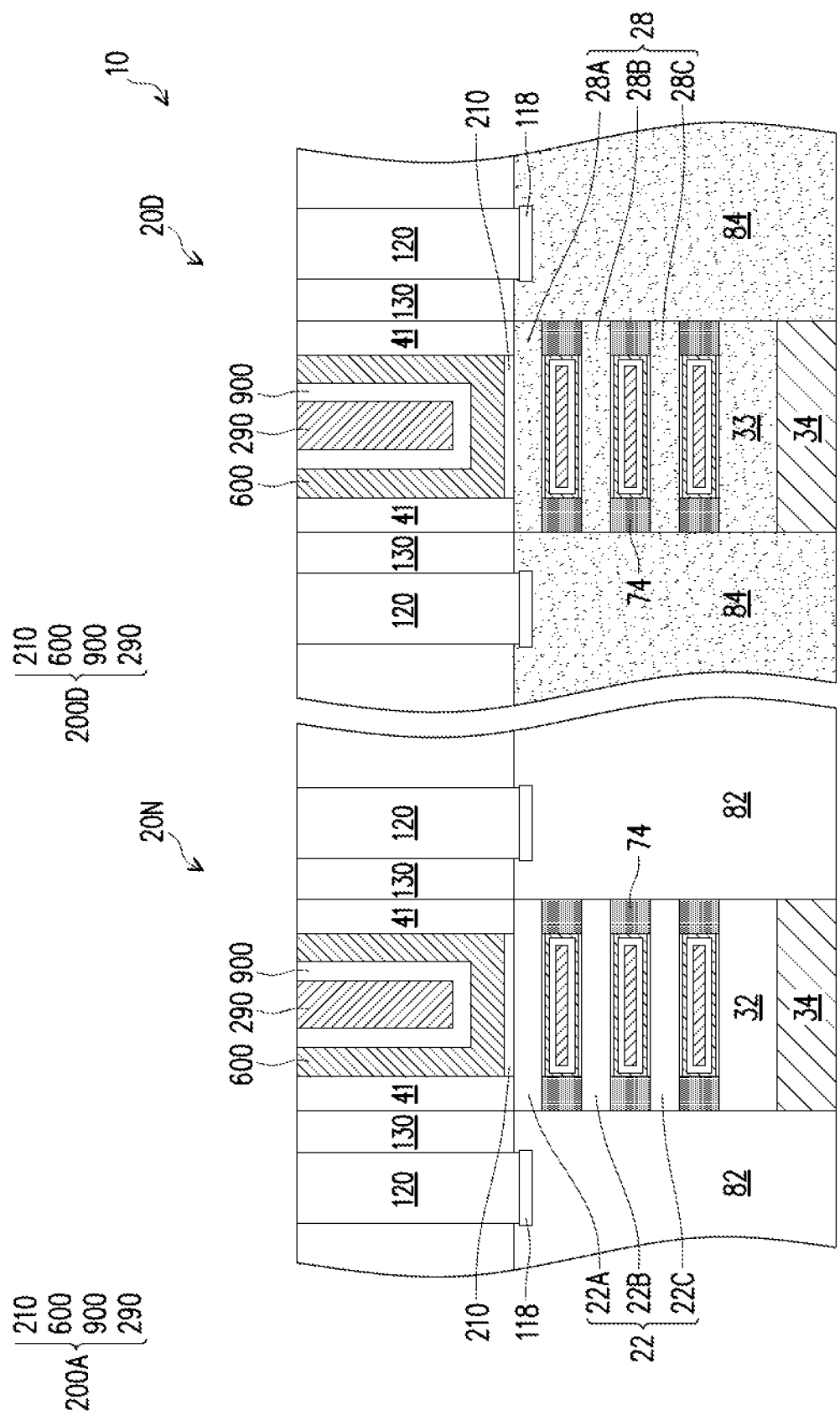

In FIG. 1B, the GAA device 20N and a GAA device 20D are illustrated in accordance with various embodiments. The GAA devices 20N, 20D shown in FIG. 1B are similar in many respects to the GAA devices 20N, 20C shown in FIG. 1A, and like reference numerals refer to like components. In the GAA device 20D of FIG. 1B, the heavily doped channels 26A-26C are replaced by channels 28A-28C. In some embodiments, the channels 28A-28C are or comprise conductor, such as a metal nitride (e.g., TiN, TaN), or other appropriate material. In some embodiments, the channels 28A-28C have a third resistance, and a ratio of the first resistance of the channels 22A-22C to the third resistance is at least about 100. In some embodiments, the source/drain features 82 are further replaced by conductive features 84. In some embodiments, the conductive features 84 are or comprises a metal nitride, such as TiN, or other appropriate material. In some embodiments, the material of the channels 28A-28C is the same as or different from the material of the conductive features 84. In some embodiments, the doped fin structure 37 is replaced by a conductive fin structure 33. In some embodiments, the conductive fin structure 33 is or comprises a metal nitride, such as TiN, TaN, or other appropriate material. In some embodiments, a buffer layer 34 is further included in the GAA devices 20A, 20D. In some embodiments, the buffer layer 34 is or comprises silicon nitride, SiC, SiCN, SiOCN, SiON, or the like.

Further to FIG. 1B, by forming the channels 28A-28C, the conductive features 84, and the conductive fin structure 33 in a replacement process, the doping process utilized for forming the doped channels 26A-26C may be omitted, simplifying the fabrication process. Description of the replacement process can be found with reference to FIGS. 17-19.

Figure 1C:
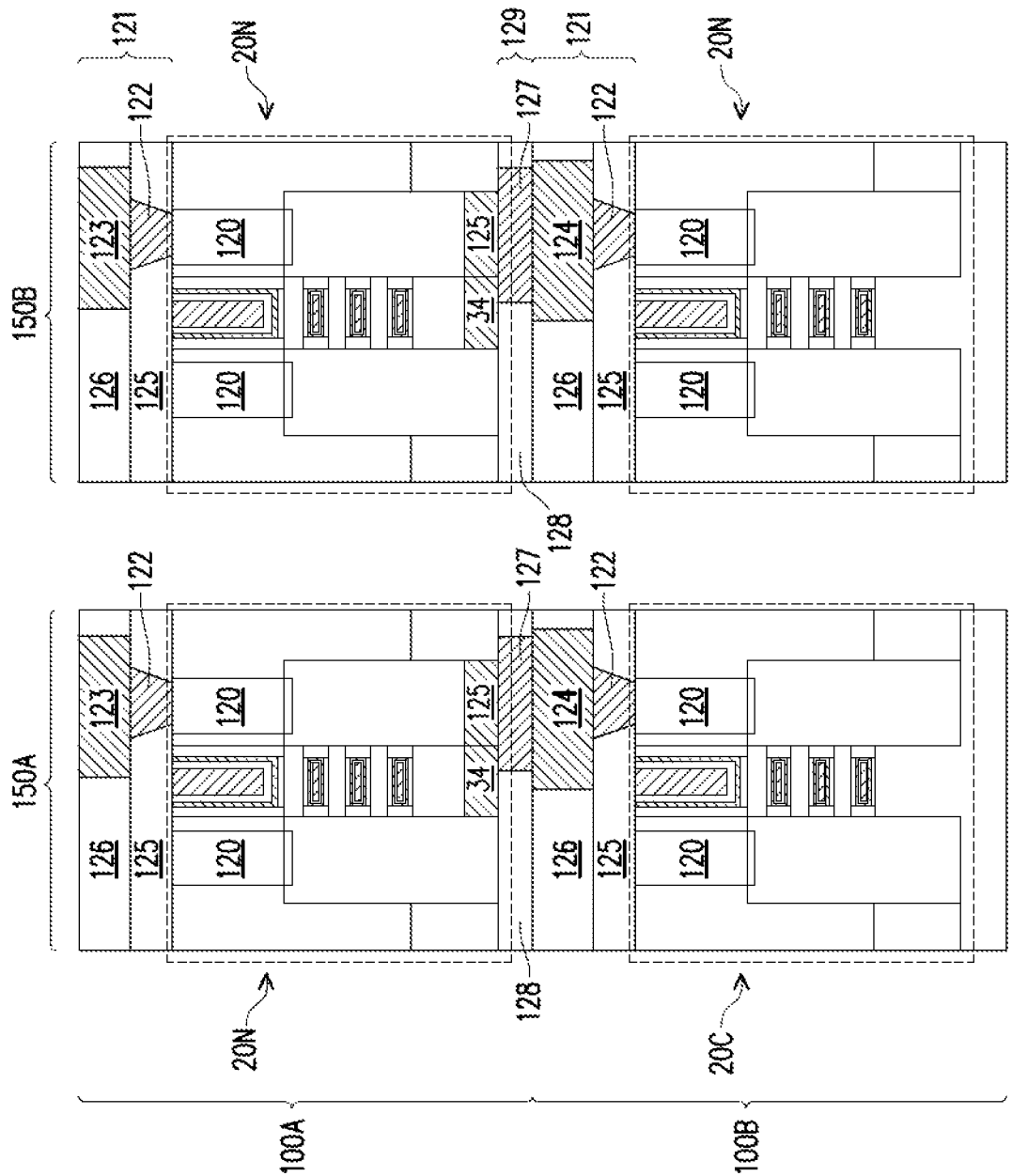
Figure 1D:
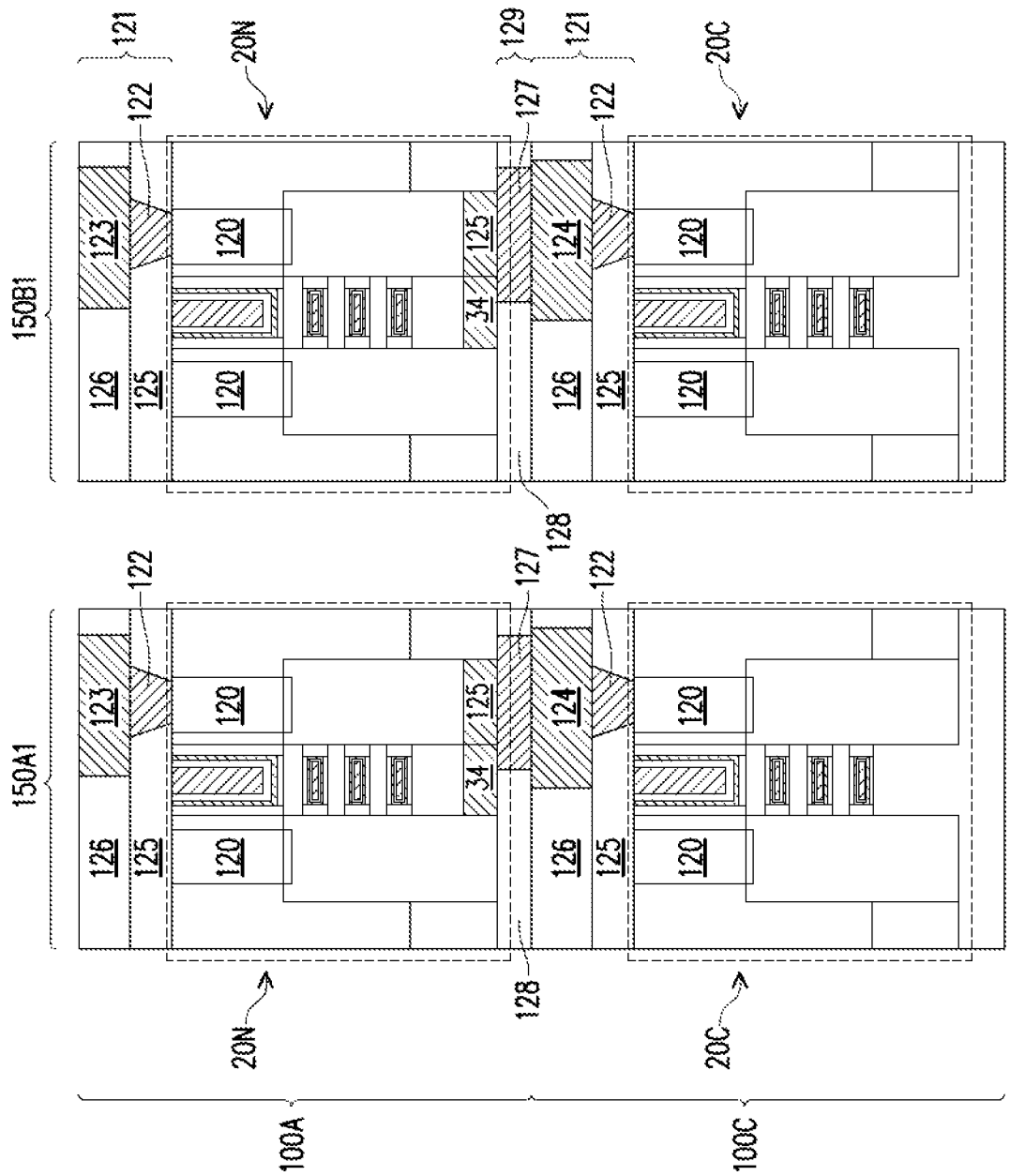
Figure 1E:
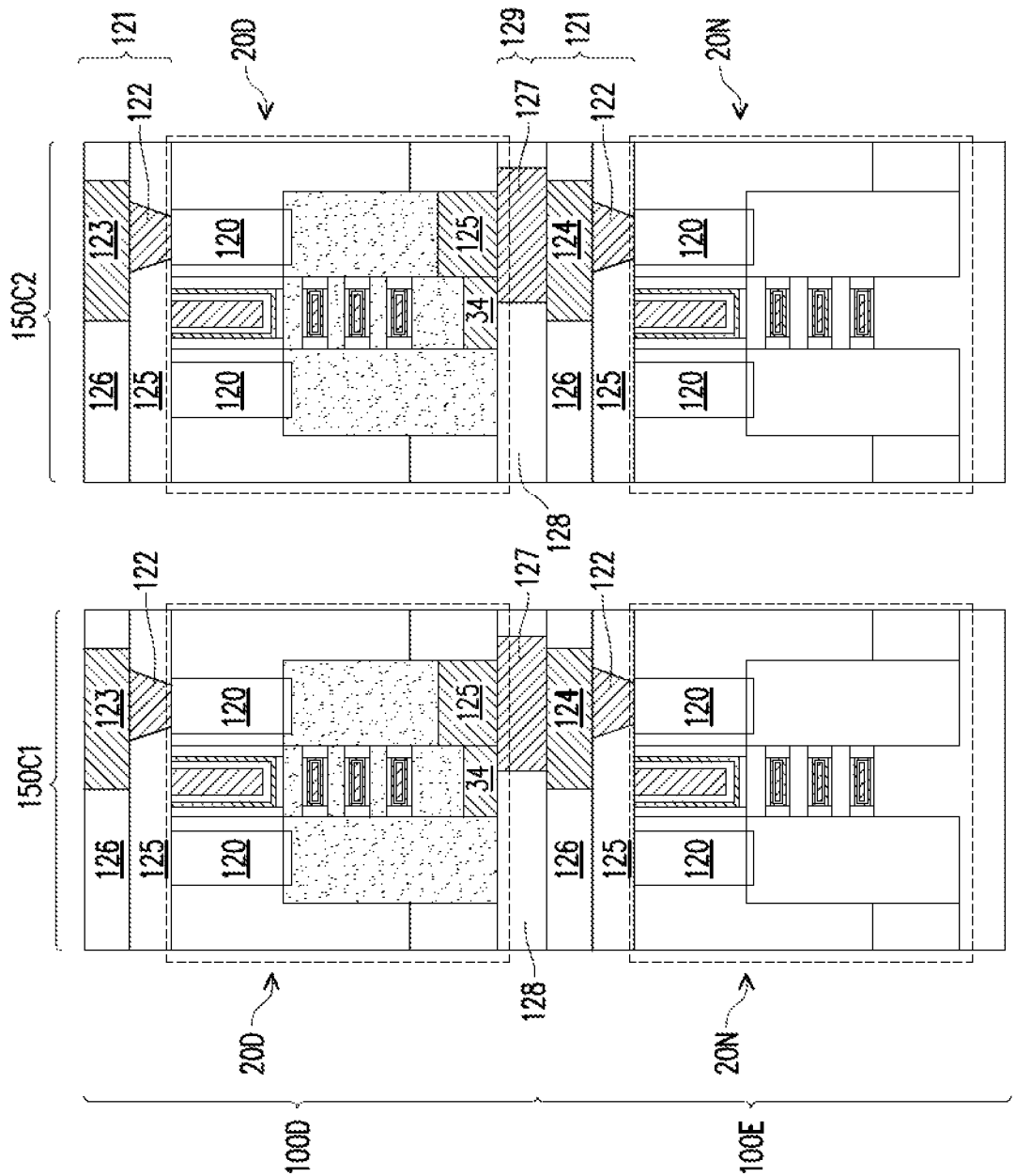

FIGS. 1C-1E illustrate stacking of a first wafer 100A on a second wafer 100B in various configurations.

In FIG. 1C, the first wafer 100A includes at least two of the GAA device 20N illustrated in FIG. 1B. The second wafer 100B includes at least one each of the GAA device 20N and the GAA device 20C illustrated in FIG. 1A. In some embodiments, the first wafer 100A is free of the GAA capacitors 20C, 20D. In some embodiments, the GAA device 20N and the GAA capacitor 20C of the second wafer 100B are immediately adjacent to each other, with no intervening active devices therebetween. Each of the first wafer 100A and the second wafer 100B includes a front-side interconnect structure 121. The first wafer 100A further includes a backside interconnect structure 129 physically and electrically coupled to the front-side interconnect structure 121 of the second wafer 100B, for example by face-to-back hybrid bonding. In some embodiments, the second wafer 100B does not include the backside interconnect structure 129, as shown in FIG. 1C. While the first wafer 100A and the second wafer 100B are described as "wafers" in the preceding description, it should be understood that, in some embodiments, the first wafer 100A and the second wafer 100B are individual dies 100A, 100B singulated from either a single semiconductor wafer or two different semiconductor wafers.

The front-side interconnect structure 121 includes conductive features 122-123 in insulating layers 125, 126 in the first wafer 100A, and conductive features 122, 124 in the second wafer 100B. In some embodiments, the conductive features 122-124 are metallization features, such as vias, wires, traces, or the like, and the insulating layers 125-126 are interlayer dielectric (ILD) layers. Only the top two insulating layers 125-126 of the interconnect structure 121 are shown in FIG. 1C. In some embodiments, each of the interconnect structures 121 includes more than two insulating layers 125-126 and more than two conductive features 122-123 or 122, 124 stacked vertically over the source/drain contacts 120 of each of the first and second wafers 100A, 100B, respectively. In some embodiments, the conductive features 122, 123, 124 form electrical connection to one of the source/drain contacts 120.

In some embodiments, the conductive features 123, 124 can be formed before or after singulation. The top dielectric layer, e.g., the insulating layer 126 of the interconnect structure 121 may be patterned to expose portions of the underlying metallization patterns. In some embodiments, under bump metallurgies (UBMs) may be formed in the openings. The conductive features 123, 124 are then formed on the UBMs. The conductive features 123, 124 may be solder balls, metal pillars, ball grid array (BGA) connectors, controlled collapse chip connection (C4) bumps, micro bumps, electroless nickel-electroless palladium-immersion gold technique (ENEPIG) formed bumps, or the like. The conductive features 123, 124 may be formed of a metal or metal alloy, such as solder, copper, aluminum, gold, nickel, silver, palladium, tin, the like, or a combination thereof. In some embodiments, the conductive features 123, 124 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive features 123, 124 are metal pillars (such as a copper pillar) formed by a sputtering, printing, electro plating, electroless plating, CVD, or the like. The metal pillars may be solder free and have substantially vertical sidewalls. The conductive features 123, 124 are electrically coupled to the metallization patterns of the interconnect structure 121.

The backside interconnect structure 129 includes a conductive feature 127 in insulating layer 128 in the first wafer 100A. The conductive feature 127 is electrically connected to a backside via 125 formed on one of the source/drain features 82. In some embodiments, the backside via 125 is formed on the same source/drain feature 82 as is electrically connected to the conductive features 122, 123 or 122, 124. Only the bottom insulating layer 128 of the interconnect structure 129 and the conductive feature 127 are shown in FIG. 1C. In some embodiments, each of the interconnect structures 129 includes more than one insulating layer 128 and more than one conductive feature 127 stacked vertically over the backside via 125.

The first wafer 100A and the second wafer 100B are directly bonded in a back-to-face manner, e.g., by hybrid bonding, such that the backsides of the GAA devices 20N of the first wafer 100A are electrically connected to the front sides of the GAA devices 20C, 20N of the second wafer 100B. Specifically, the insulating layer 128 of the first wafer 100A is bonded to the insulating layer 126 of the second wafer 100B through dielectric-to-dielectric bonding, without using any adhesive material (e.g., die attach film), and the conductive features 127 of the first wafer 100A are bonded to the conductive features 124 of the second wafer 100B through metal-to-metal bonding, without using any eutectic material (e.g., solder). While described in terms of hybrid bonding, the first wafer 100A and the second wafer 100B may be bonded by aligning solder bumps or other reflowable conductive materials of the conductive features 127, 124, and reflowing the conductive features 127, 124 such that the conductive features 127, 124 form solder joints establishing physical and electrical connection between the first and second wafers 100A, 100B.

After bonding, a first device 150A and a second device 150B are formed in the first and second wafers 100A, 100B. In some embodiments, the first device 150A is a dynamic random access memory (DRAM) device including the GAA device 20N of the first wafer 100A and the GAA capacitor 20C of the second wafer 100B in a one-transistor-one-capacitor (1T1C) configuration. In some embodiments, the second device 150B is a two-transistor (2T) circuit device, such as a buffer, inverter, amplifier, or other device, which may be determined by interconnection between gate, source and drain terminals of the GAA devices 20N of the second device 150B. Use of the GAA capacitor 20C increases device density as well as design flexibility in wafer-level or device-level packages.

In FIG. 1D, the first wafer 100A is stacked with a third wafer 100C, which is similar in many respects to the second wafer 100B. In some embodiments, the entirety, a die region, a functional region, or otherwise of the third wafer 100C includes an array of the GAA capacitors 20C free of the GAA devices 20N. In some embodiments, the entirety, a die region, a functional region, or otherwise of the first wafer 100A includes a corresponding array of the GAA devices 20N free of the GAA capacitors 20C. While the number of channels 22, 26 illustrated in FIG. 1D is the same for the GAA devices 20N and the GAA capacitors 20C, in some embodiments, each of the GAA capacitors 20C includes at least one more channel 26 than the channels 22 in the GAA device 20N. By including a greater number of channels 26 in the GAA capacitors 20C, capacitance of the GAA capacitors 20C may be increased, which is an advantage of forming the GAA capacitors 20C in the third wafer 100C free of GAA devices 20N. By aligning the arrays of GAA capacitors 20C and GAA devices 20N, and bonding the first wafer 100A to the third wafer 100C similar to described above with respect to FIG. 1C, a first device 150A1 and a second device 150B1 are formed. In some embodiments, the first and second devices 150A1, 150B1 are both DRAM devices in the 1T1C configuration. As such, a large-scale array (including many cells) of DRAM devices may be formed with high device density by bonding the first wafer 100A to the third wafer 100C, as shown.

In FIG. 1E, a fifth wafer 100E is stacked with a fourth wafer 100D. The fifth wafer 100E is similar in many respects to the first wafer 100A, other than that the substrate of the fifth wafer 100E is not removed, and no backside via or other backside interconnect structure is formed on the fifth wafer 100E. The fourth wafer 100D is similar in many respects to the second wafer 100B, but instead of including the GAA devices 20C, the fourth wafer 100D includes the GAA devices 20D. In some embodiments, the entirety, a die region, a functional region, or otherwise of the fourth wafer 100D includes an array of the GAA capacitors 20D free of the GAA devices 20N. In some embodiments, the entirety, a die region, a functional region, or otherwise of the fifth wafer 100E includes a corresponding array of the GAA devices 20N free of the GAA capacitors 20C, 20D. While the number of channels 22 and channels 28 illustrated in FIG. 1E is the same for the GAA devices 20N and the GAA capacitors 20D, in some embodiments, each of the GAA capacitors 20D includes at least one more channel 28 than the channels 22 in the GAA device 20N. By including a greater number of channels 28 in the GAA capacitors 20D, capacitance of the GAA capacitors 20D may be increased, which is an advantage of forming the GAA capacitors 20D in the fourth wafer 100D free of GAA devices 20N. By aligning the arrays of GAA capacitors 20D and GAA devices 20N, and bonding the fifth wafer 100E to the fourth wafer 100D similar to described above with respect to FIG. 1C, a first device 150C1 and a second device 150C2 are formed. In some embodiments, the first and second devices 150C1, 150C2 are both DRAM devices in the 1T1C configuration. As such, a large-scale array (including many cells) of DRAM devices may be formed with high device density by bonding the fifth wafer 100E to the fourth wafer 100D, as shown.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat. No. 10,361,278, titled "Method of Manufacturing a Semiconductor Device and a Semiconductor Device" and issued on Jul. 23, 2019, the disclosures of each which are hereby incorporated by reference in their respective entireties.

Figure 10B:
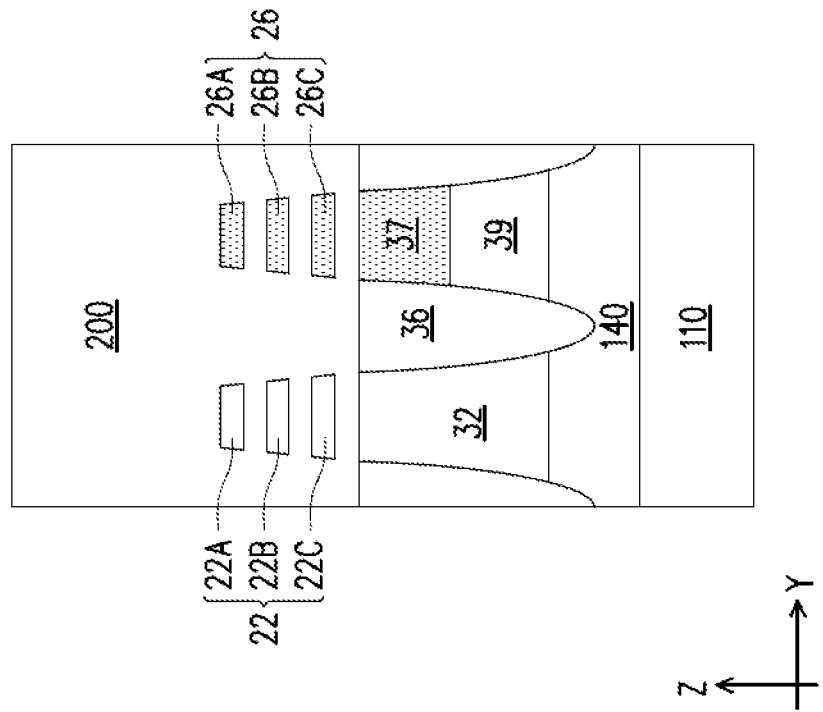
Figure 10A:
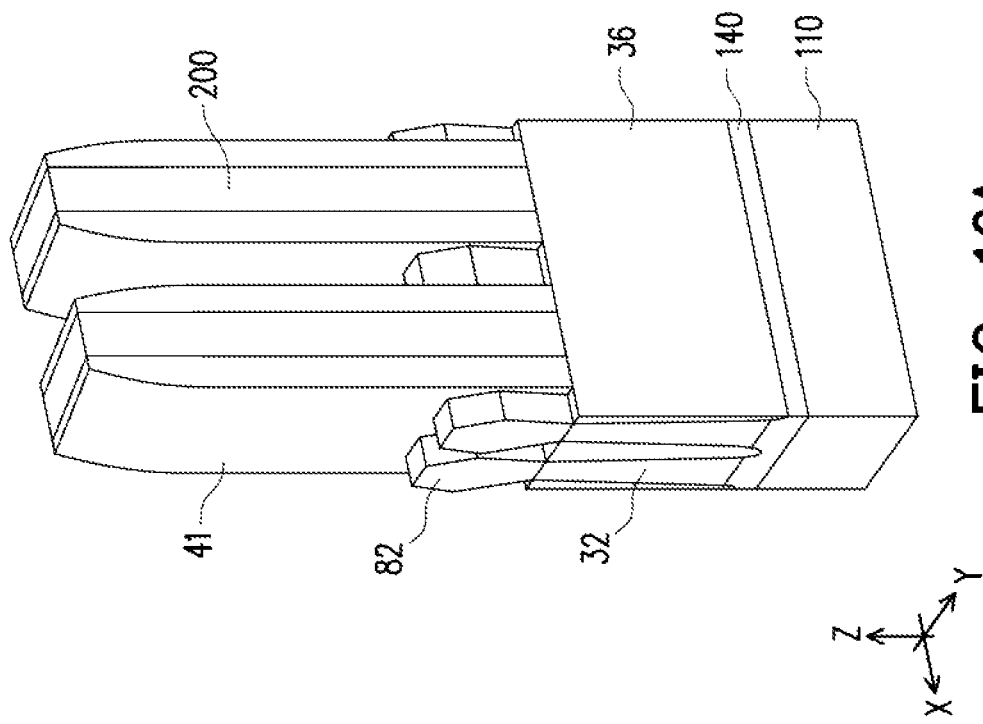
Figure 10D:
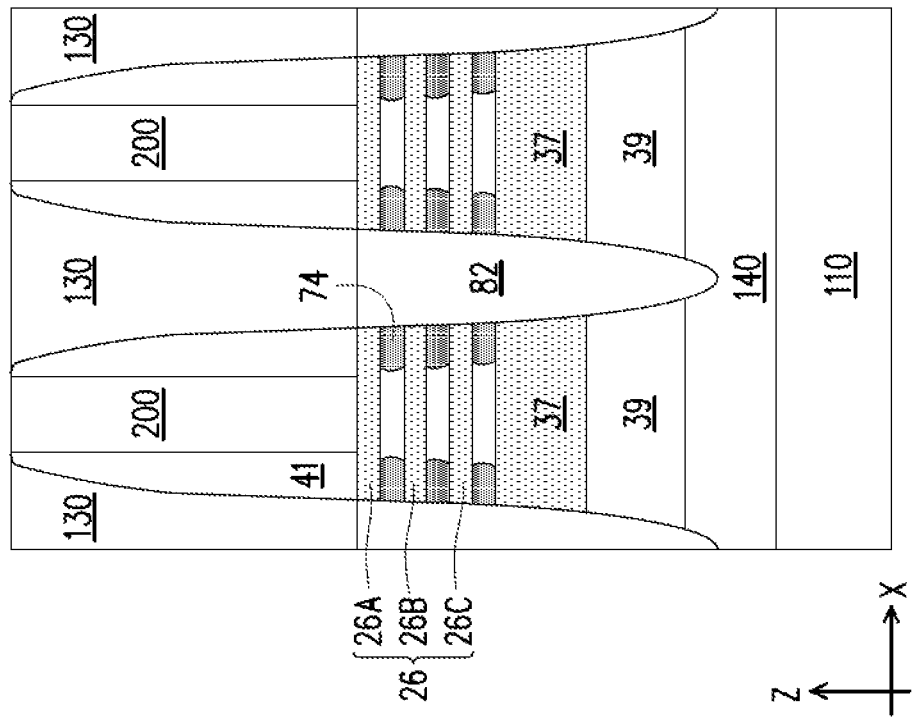
Figure 10C:
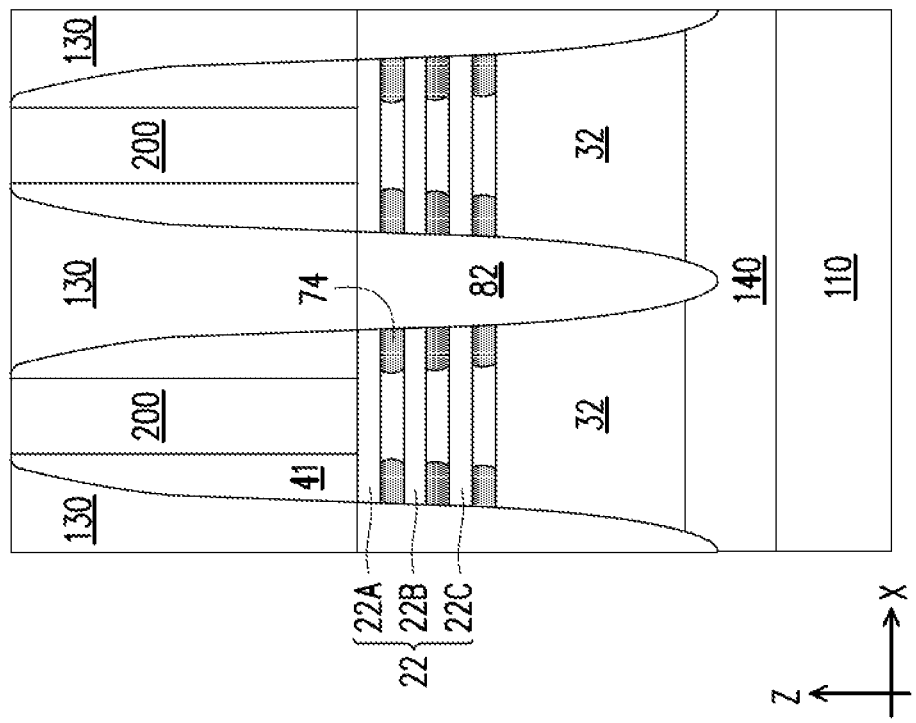
Figure 11:
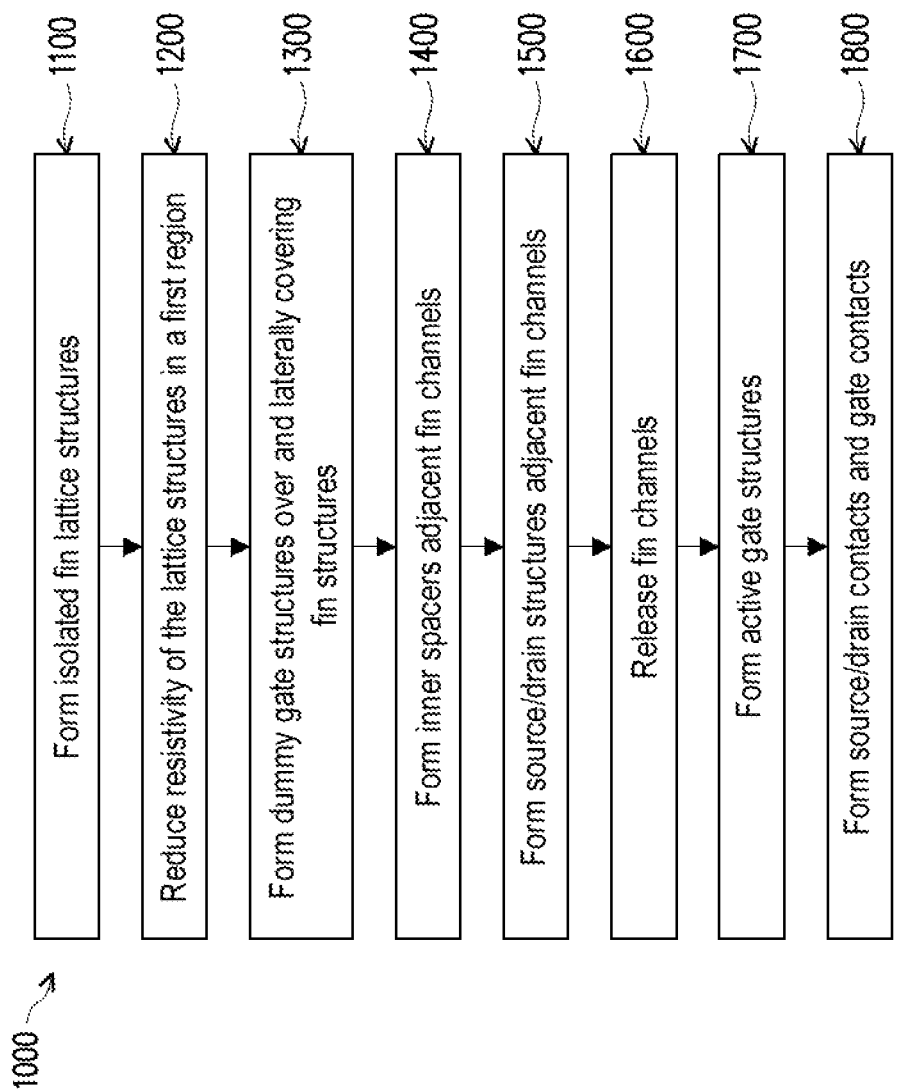
FIG. 11 is a flowchart illustrating a method of fabricating a semiconductor device according to various aspects of the present disclosure.

FIG. 11 illustrates a flowchart illustrating a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary cross-sectional views of a workpiece (shown in FIGS. 2A-10D) at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 10D are perspective views and cross-sectional views of intermediate stages in the manufacturing of nano-FETs, in accordance with some embodiments. FIGS. 2A, 3A, 4A, 5A, 6A, 7A, 8A, 9A, and 10A illustrate perspective views. FIGS. 2B, 3B, 3C, 3D, 4B, 5B, 6B, 7B, 8B, 9B, and 10$^{13}$ illustrate reference cross-section B-B' (gate cut) illustrated in FIGS. 2A, 3A, and 4A. FIGS. 4C, 5C, 6C, 7C, 8C, 9C, 10C and illustrate reference cross-section C-C' (undoped channel/fin cut) illustrated in FIG. 4A. FIGS. 4D, 5D, 6D, 7D, 8D, 9D, and 10D illustrate reference cross-section D-D' (doped channel/fin cut) illustrated in FIG. 4A.

Figure 2B:
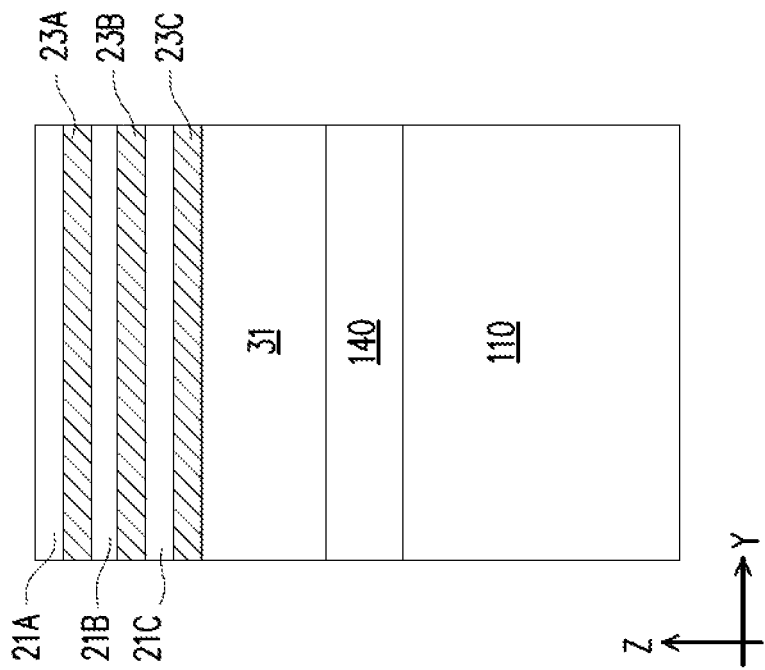
Figure 2A:
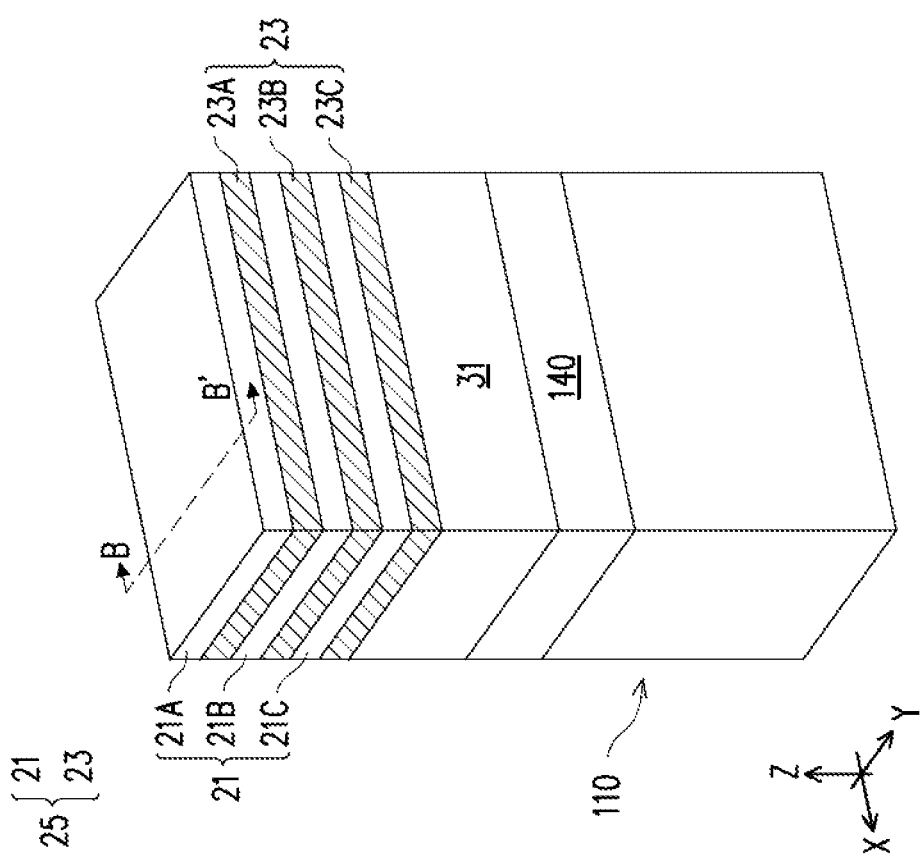

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, in some embodiments, a buffer layer 140 is formed over the substrate 110. The buffer layer 140 may be a nitride layer, such as a SiN layer, or another suitable material layer. In some embodiments, the buffer layer 140 is not formed. The buffer layer 140 may be utilized in later operations to aid in forming backside contacts and interconnects for the GAA device 20N, the GAA device 20C, and/or the GAA device 20D. Following formation of the buffer layer 140, a semiconductor layer 31 may be formed on the buffer layer 140. In some embodiments, the semiconductor layer 31 comprises the same material as the substrate 110, e.g., silicon.

Following formation of the semiconductor layer 31, a multi-layer stack 25 or "lattice" is formed over the substrate 110, the buffer layer 140 and the semiconductor layer 31 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. In some embodiments, the first semiconductor layers 21 are formed of the second semiconductor material, and the second semiconductor layers 23 are formed of the first semiconductor material. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like. In some embodiments, when the buffer layer 140 and the semiconductor layer 31 are not formed, the multi-layer stack 25 may be formed contacting the substrate 110.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 3B:
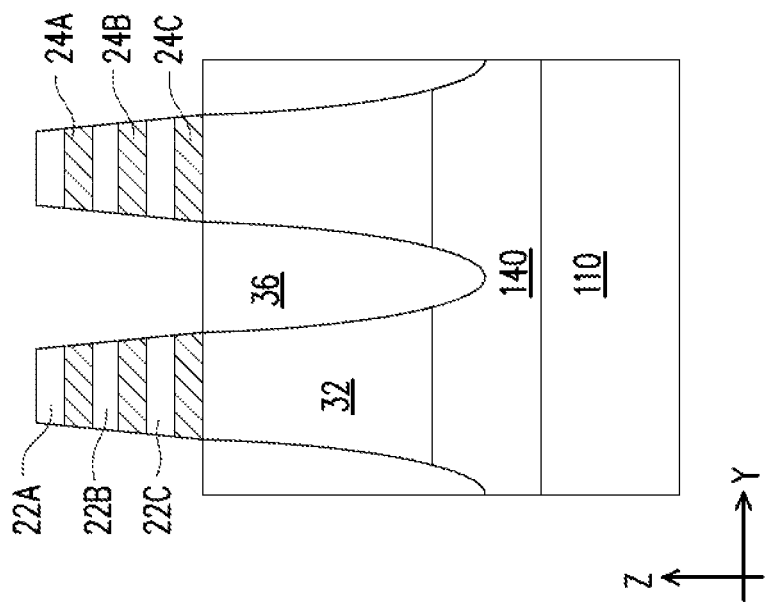
Figure 3A:
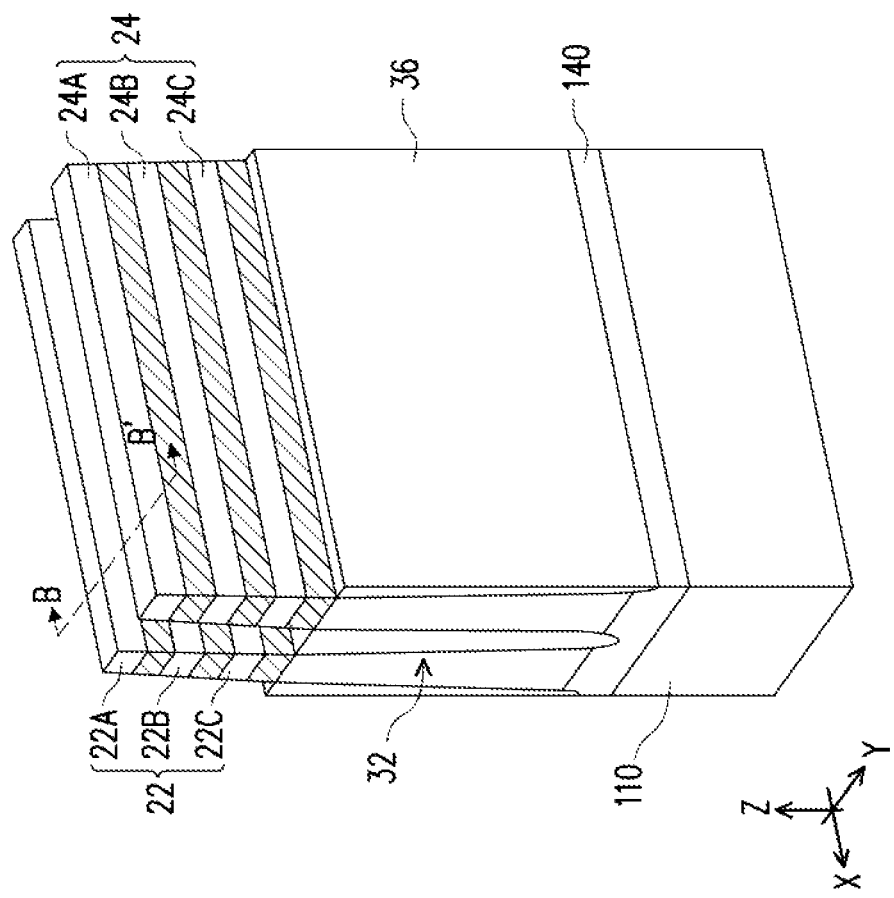

In FIG. 3A and FIG. 3B, fins 32 are formed in the semiconductor layer 31 and nanostructures 22, 24 are formed in the multi-layer stack 25 corresponding to act 1100 of FIG. 11. In some embodiments, the nanostructures 22, 24 and the fins 32 may be formed by etching trenches in the multi-layer stack 25 and the semiconductor layer 31. The etching may be any acceptable etch process, such as a reactive ion etch (RIE), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A-3D illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A-3D, isolation regions 36, which may be shallow trench isolation (STI) regions, are formed adjacent the fins 32. The isolation regions 36 may be formed by depositing an insulation material over the substrate 110, the buffer layer 140, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the buffer layer 140, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 66 and the nanostructures 55. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 3D:
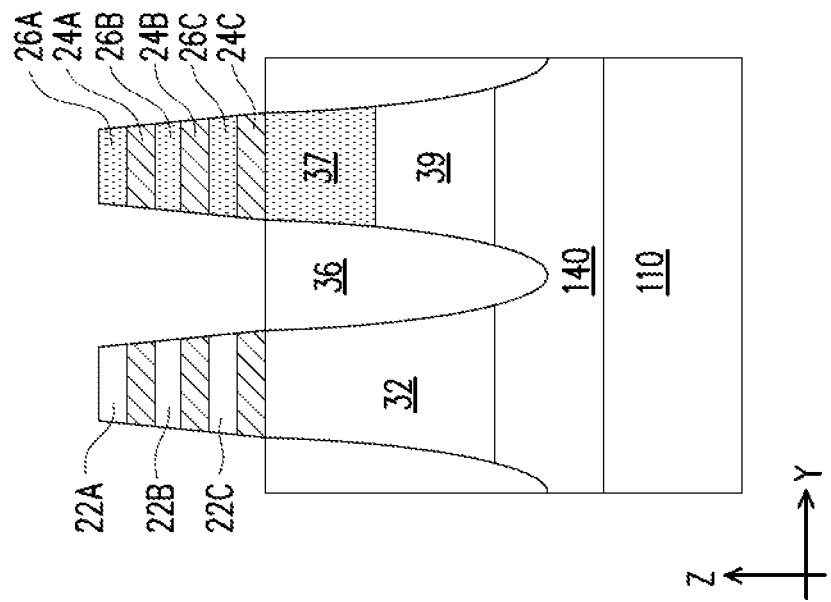
Figure 3C:
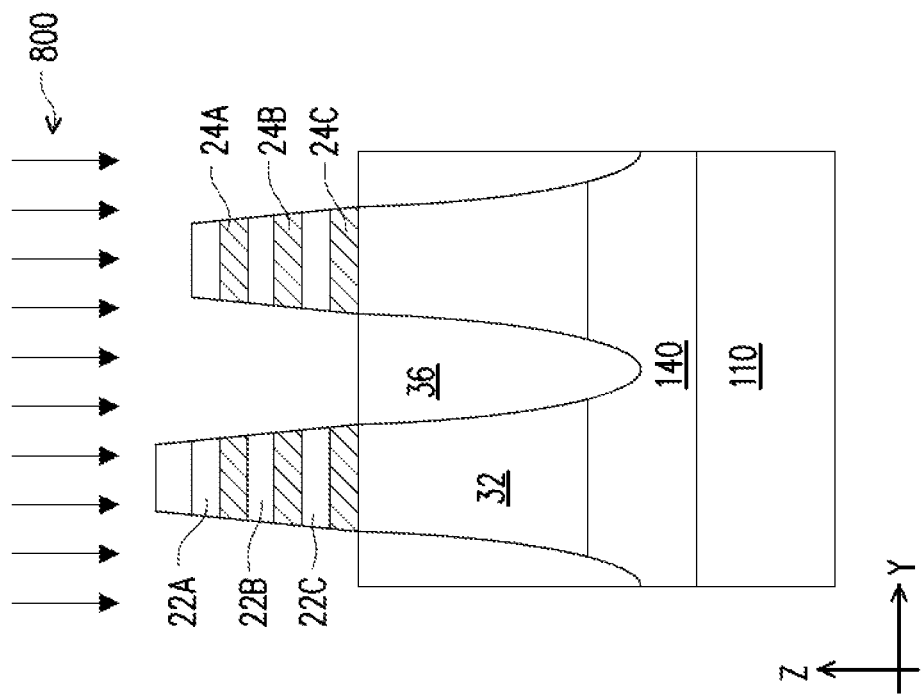
Figure 4D:
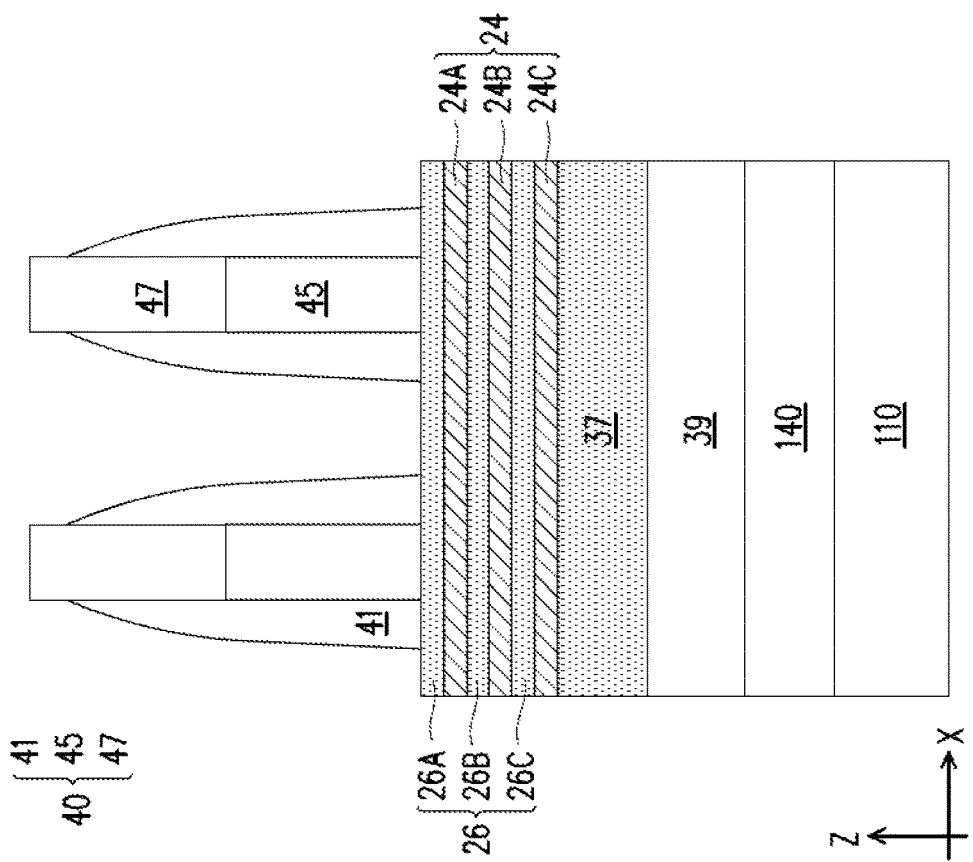
Figure 4C:
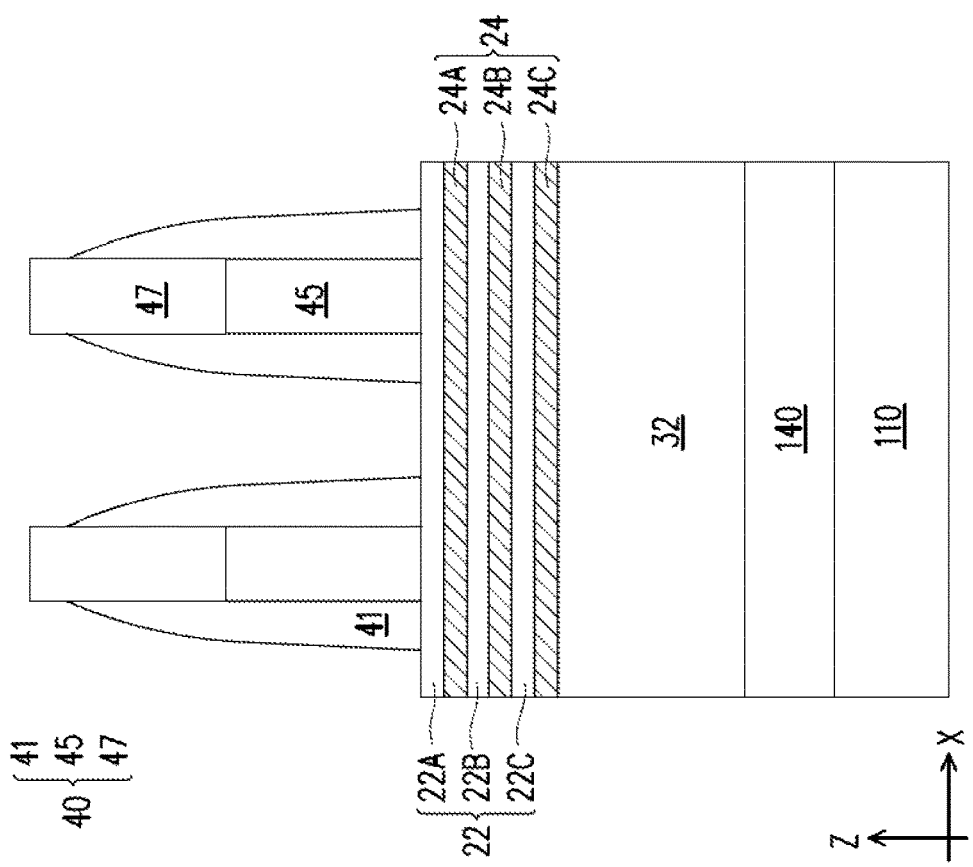
Figure 5B:
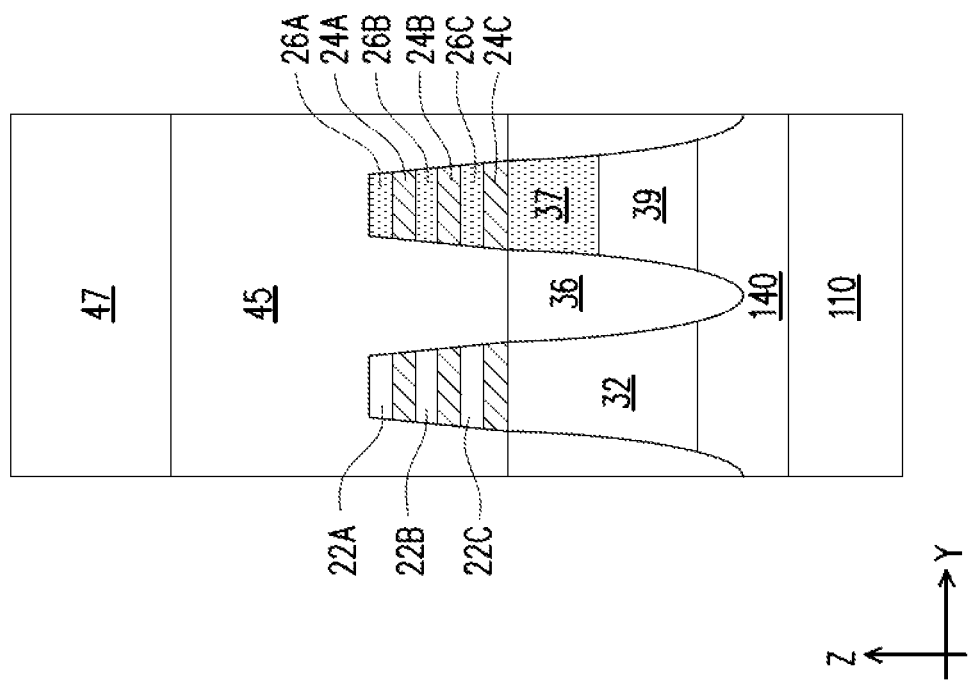
Figure 5A:
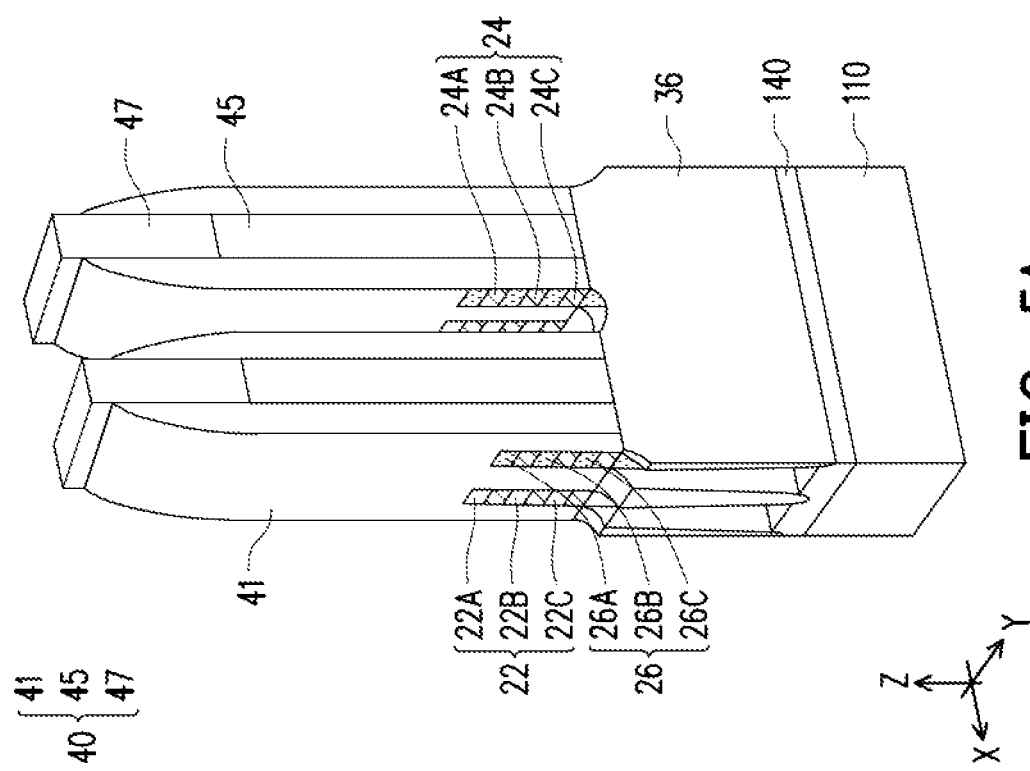
Figure 7B:
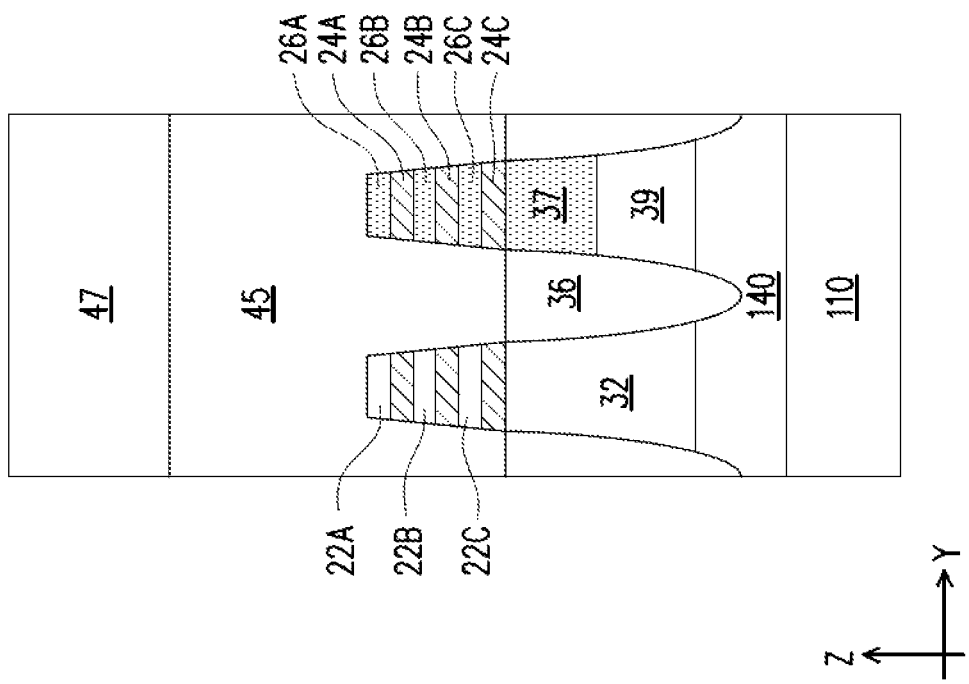
Figure 7A:
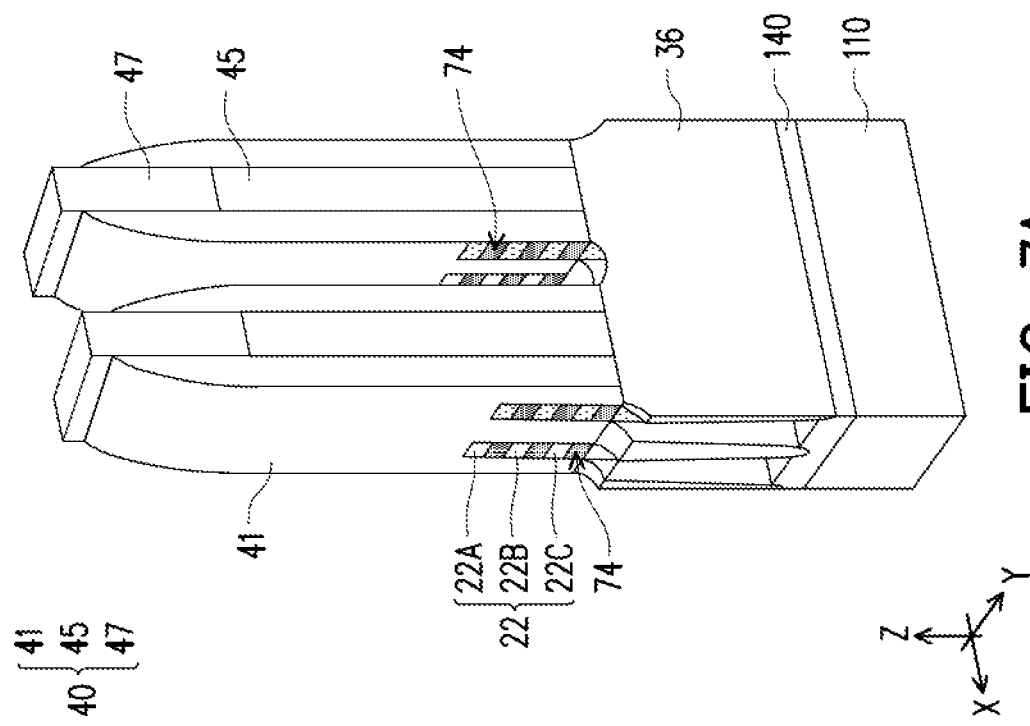
Figure 8B:
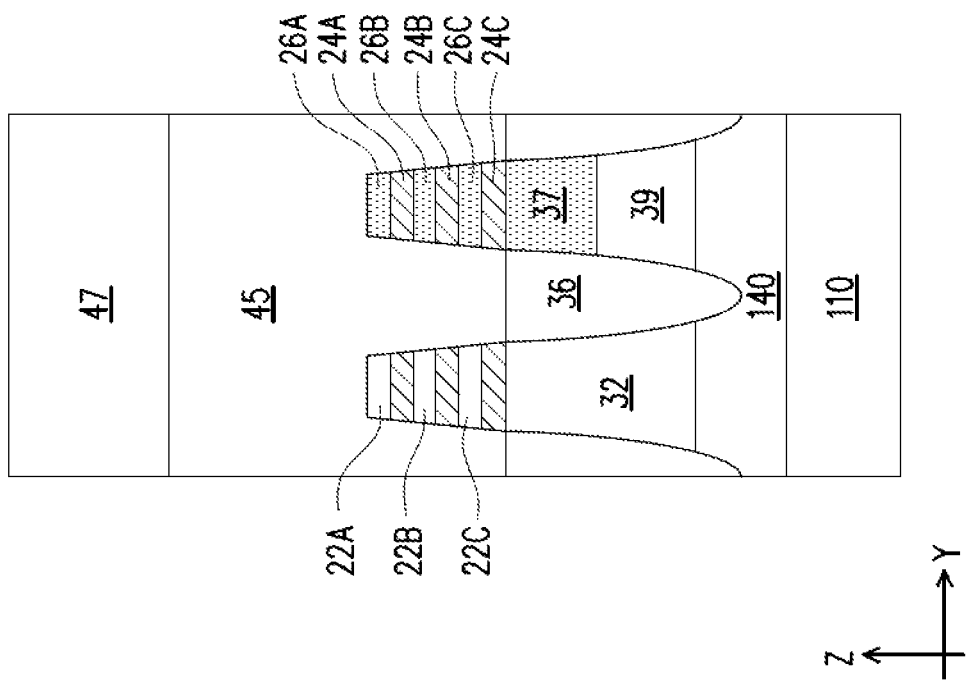
Figure 8A:
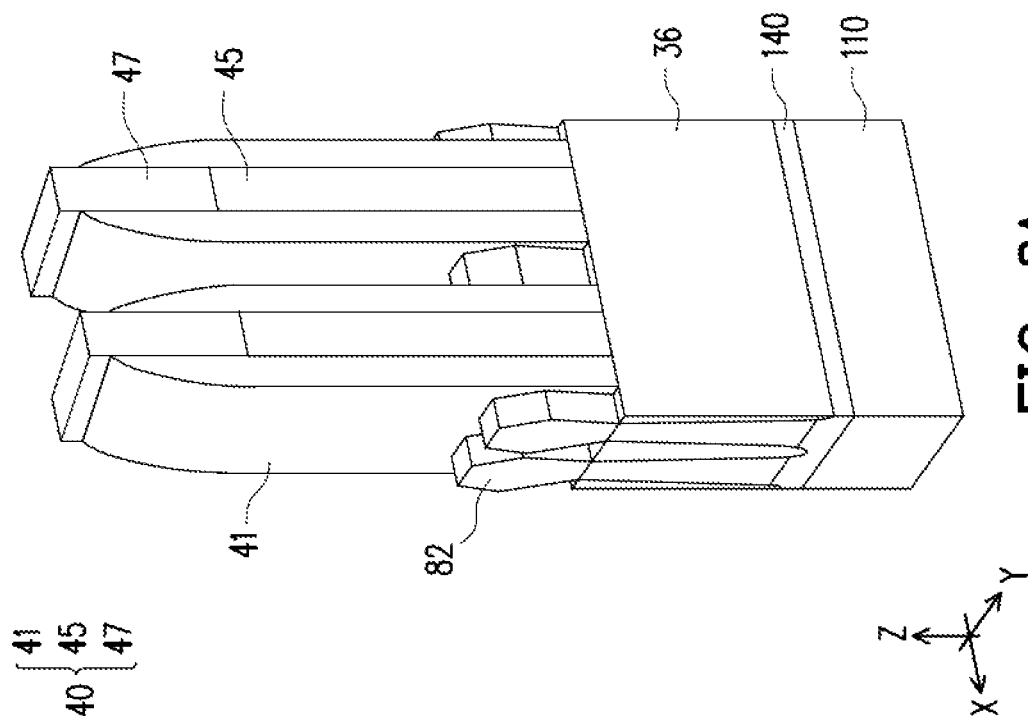
Figure 8D:
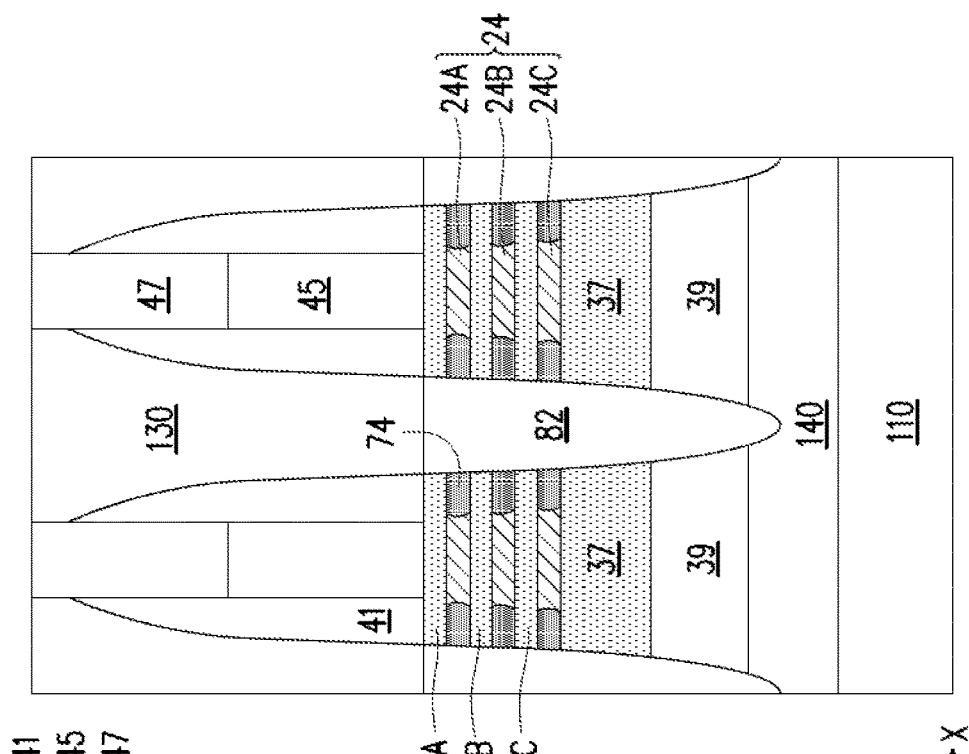
Figure 8C:
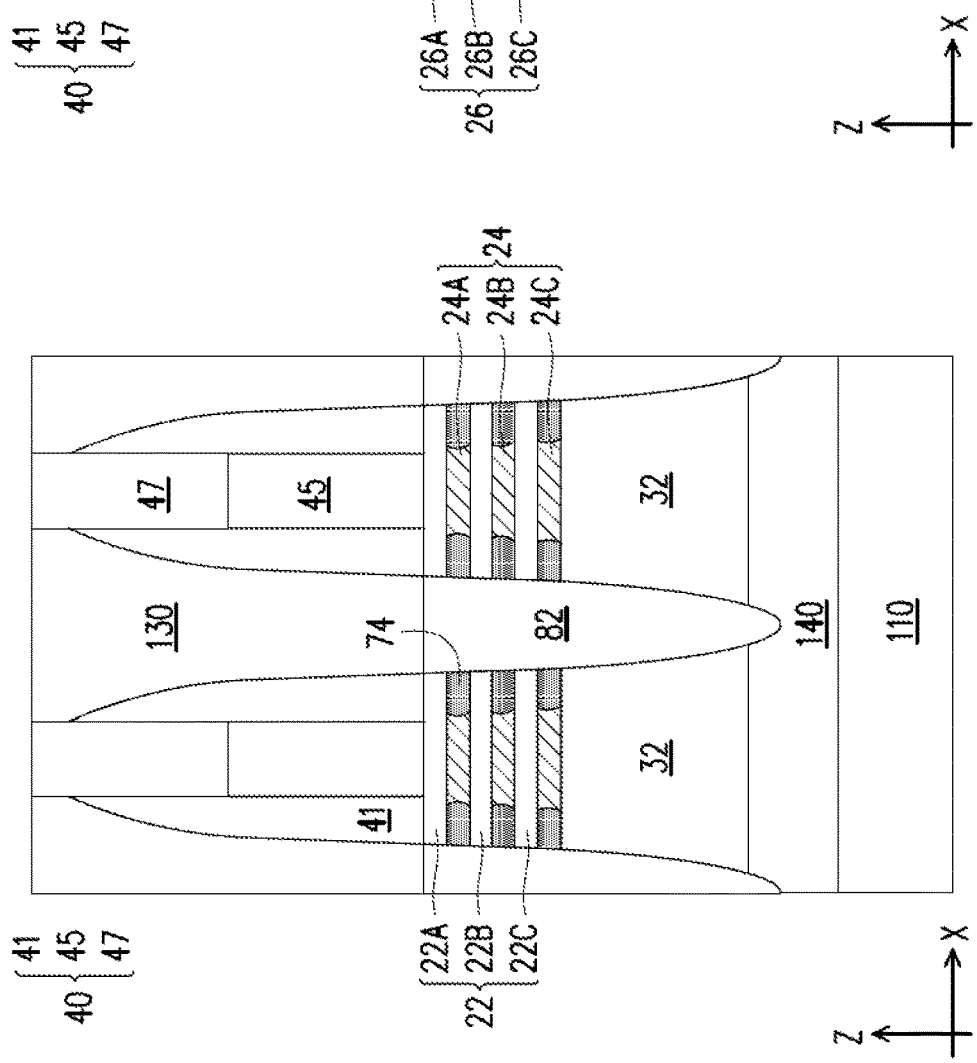

In FIGS. 3C-3D, the doped channels 26 and the doped fin structure 37 are formed by a process 800 by which dopants are introduced into the nanostructures 22, corresponding to act 1200 of FIG. 11. As shown in FIG. 3C, one or more of the stacks of nanostructures 22, 24 may be masked during the process 800. In some embodiments, the process 800 is a solid phase diffusion (SPD) process performed to dope the exposed nanostructures 22 to form the doped channels 26. In some embodiments, the process 800 for forming the doped channels 26 is an ion implantation process performed on the exposed nanostructures 22. The resulting structure is shown in FIG. 3D. The structure shown in FIG. 3D may correspond to the configuration of the second wafer 100B of FIG. 1C. If no stacks of the nanostructures 22, 24 are masked during the process 800, all of the nanostructures 22 become the doped channels 26, which may correspond to the configuration of the third wafer 100C shown in FIG. 1D.

In some embodiments, the dopants include boron, though other suitable dopants may also be included, such as aluminum, gallium, indium, or the like. In some embodiments, concentration of the dopants in the doped channels 26A-26C and the doped fin structure 37 is in a range of about 1E16 atoms/cm$^3$ to about 1E21 atoms/cm$^3$. As such, the doped channels 26 and the doped fin structure 37 may be referred to as "heavily doped." In some embodiments, doping of the doped channels 26 and the doped fin structure 37 does not lead to doping of the entire fin 32, such that a lower region 39 of the fin 32 is substantially free of dopants, or only lightly doped, such as having a doping concentration less than about 1E13 atoms/cm$^3$. In some embodiments, a sharp interface is not present between the doped fin structure 37 and the lower region 39, and doping concentration falls off gradually from the heavily doped doped fin structure 37 to the undoped or lightly doped lower region 39.

In FIGS. 4A-4D, dummy gate structures 40 are formed over the fin 32, the doped fin 37, the doped channels 26, and/or the nanostructures 22, 24, corresponding to act 1300 of FIG. 11. A dummy gate layer 45 is formed over the fin 32, the doped fin 37, the doped channels 26, and/or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fin 32, the doped fin 37, the doped channels 26, and/or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

In FIGS. 5A-5D, an etching process is performed to etch the portions of protruding fin 32, doped fin structure 37, lower region 39, doped channels 26, and/or nanostructures 22, 24 that are not covered by dummy gate structures 40, resulting in the structure shown. The recessing may be anisotropic, such that the portions of fin 32, doped fin structure 37, lower region 39, doped channels 26, and/or nanostructures 22, 24 directly underlying dummy gate structures 40 and the spacer layer 41 are protected, and are not etched. The top surfaces of the recessed fin 32 and doped fin structure 37 may be substantially coplanar with the top surfaces of the isolation regions 36 as shown, in accordance with some embodiments. The top surfaces of the recessed fin 32 and doped fin structure 37 may be lower than the top surfaces of the isolation regions 36, in accordance with some other embodiments.

FIGS. 6A-6D and 7A-7D illustrate formation of inner spacers 74 corresponding to act 1400 of FIG. 11. A selective etching process is performed to recess end portions of the nanostructures 24 exposed by openings in the spacer layer 41 without substantially attacking the nanostructures 22 and/or the doped channels 26. After the selective etching process, recesses 64 are formed in the nanostructures 24 at locations where the removed end portions used to be. The resulting structure is shown in FIGS. 6A-6C.

Next, an inner spacer layer is formed to fill the recesses 64 in the nanostructures 24 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 7A-7D.

FIGS. 8A-8D illustrate formation of source/drain regions 82 corresponding to act 1500 of FIG. 11. In the illustrated embodiment, the source/drain regions 82 are epitaxially grown from epitaxial material(s). In some embodiments, the source/drain regions 82 exert stress in the respective channels 22A-22C and/or the doped channels 26A-26C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32 or two neighboring doped fin structures 37.

The source/drain regions 82 may be implanted with dopants followed by an anneal. The source/drain regions may have an impurity concentration of between about $10^{19}$ cm$^{-3}$ and about $10^{21}$ cm$^{-3}$. N-type and/or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

Figure 9D:
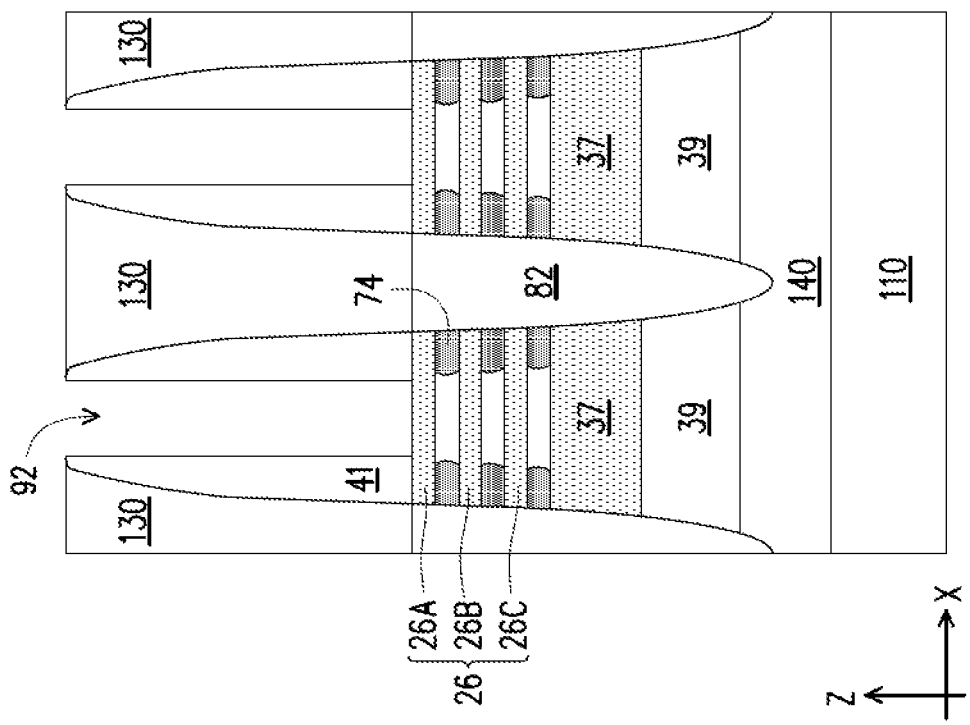
Figure 9C:
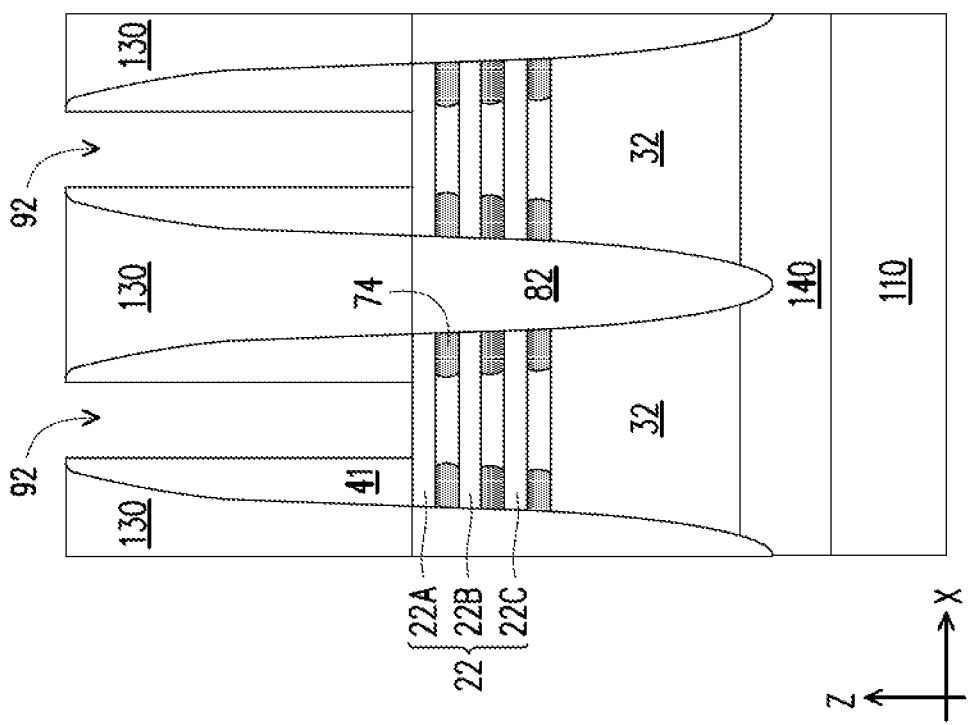

FIG. 9A, FIG. 9B, and FIG. 9C illustrate release of fin channels 22A-22C and doped channels 26A-26C by removal of the nanostructures 24A-24C, the mask layer 47, and the dummy gate layer 45, which corresponds to act 1600 of FIG.

11. A planarization process, such as a CMP, is performed to level the top surfaces of the dummy gate layer 45 and gate spacer layer 41. The planarization process may also remove the mask layer 47 (see FIG. 8A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22 and the doped channels 26. After the nanostructures 24 are removed, the nanostructures 22 form a plurality of nanosheets that extend horizontally (e.g., parallel to a major upper surface of the substrate 110), and the doped channels 26 similarly form a plurality of nanosheets that also extend horizontally. The nanosheets may be collectively referred to as the channels 22 and the doped channels 26 of the GAA devices 20N, 20C.

In some embodiments, the nanostructures 24 are removed by a selective etching process using an etchant that is selective to the material of the nanostructures 24, such that the nanostructures 24 are removed without substantially attacking the nanostructures 22 and/or the doped channels 26. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanosheets 22 and the doped channels 26 of the GAA devices 20N, 20C are reshaped (e.g. thinned) by a further etching process to improve gate fill window. The reshaping may be performed by an isotropic etching process selective to the nanosheets 22 and the doped channels 26. After reshaping, the nanosheets 22 and the doped channels 26 may exhibit the dog bone shape in which middle portions of the nanosheets 22 and the doped channels 26 are thinner than peripheral portions of the nanosheets 22 and the doped channels 26 along the X direction.

Next, in FIGS. 10A-10C, replacement gates 200, such as the gate structures 200A, 200D, are formed, corresponding to act 1700 of FIG. 11. Each replacement gate 200 generally includes a first IL 210, a first gate dielectric layer 220-222, a second gate dielectric layer 230, a second IL layer 240, work function metal layers 900, and a gate fill layer 290 (see FIGS. 15A-15C). In some embodiments, the replacement gates 200 further include a second work function layer 700 (see FIG. 15C). Cross-sections of formation of the gate structures 200A, 200D, as well as further gate structure 200B are provided with respect to FIG. 12A through FIG. 15C. A flowchart of a method of formation of the gate structures 200A, 200B, 200D is illustrated in FIG. 16.

Additional processing may be performed to finish fabrication of the GAA device 20N and/or the GAA device 20C. For example, gate contacts (not illustrated for simplicity) and the source/drain contacts 120 may be formed to electrically couple to the gate structures 200 and the source/drain regions 82, respectively, corresponding to act 1800 of FIG. 11. An interconnect structure may then be formed over the source/drain contacts 120 and the gate contacts corresponding to act 1800 of FIG. 11. The interconnect structure may include a plurality of dielectric layers surrounding metallic features, including conductive traces and conductive vias, which form electrical connection between devices on the substrate 110, such as the GAA devices 20N, 20C, as well as to IC devices external to the IC device 10.

The gate structures 200 may be formed on the same wafer and/or may be parts of the same IC device in some embodiments. As such, at least some of the fabrication processes discussed below may be performed to all the gate structures 200 simultaneously.

Figures 12A, 12B, 12C:
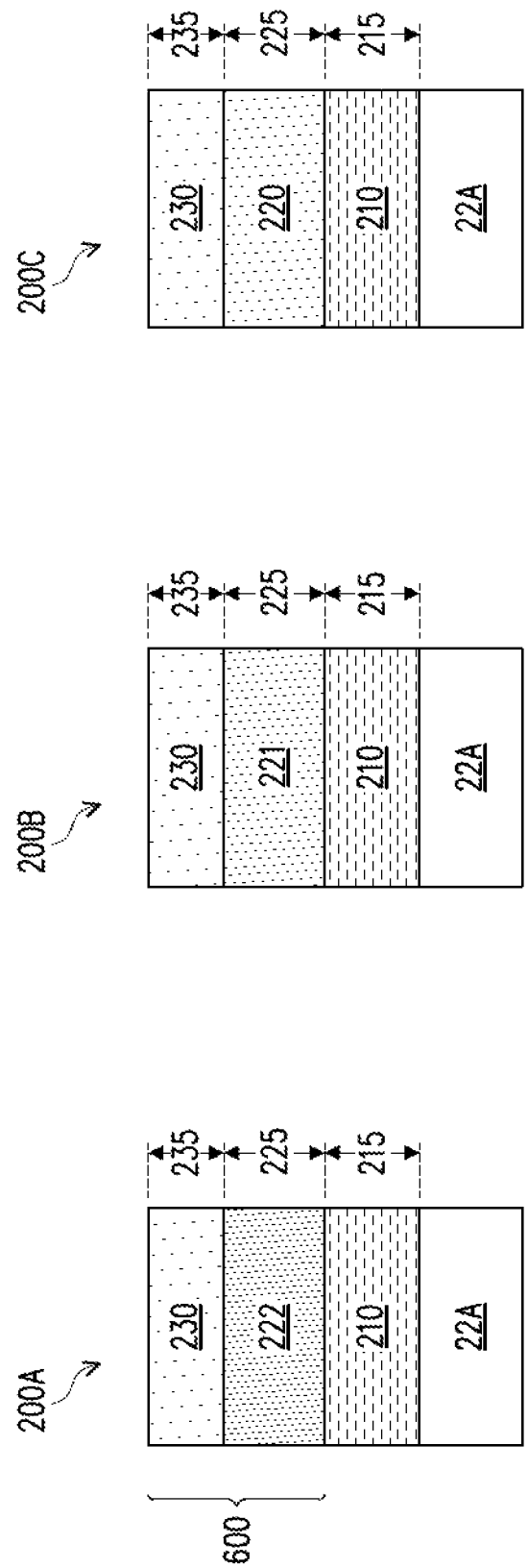
Figure 16:
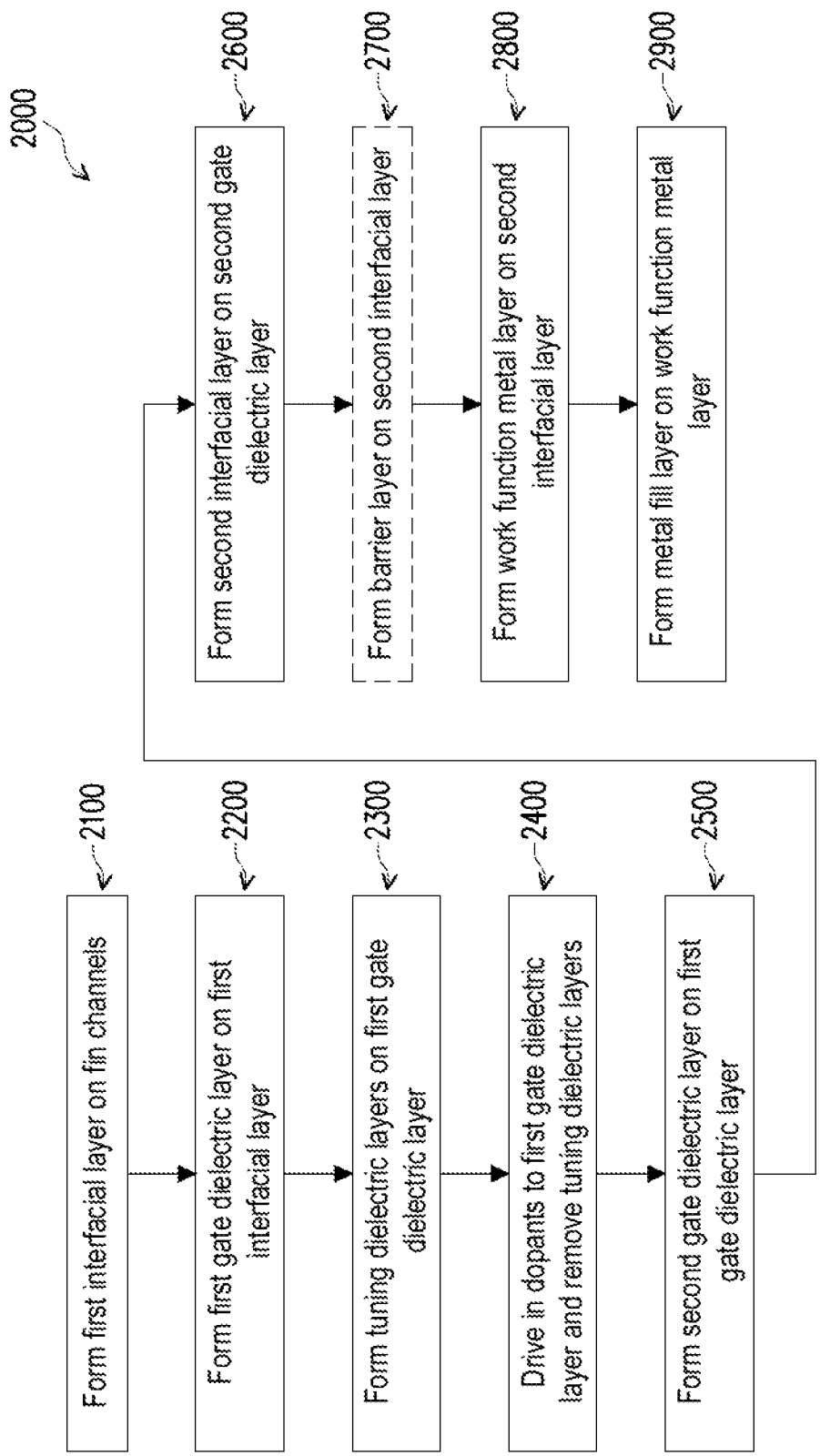
FIG. 16 is a flowchart illustrating a method of fabricating a semiconductor device according to various aspects of the present disclosure.

FIGS. 12A-12C illustrate the gate structures 200A, 200B, 200D at an intermediate stage of fabrication, in which each gate structure 200A, 200B, 200D includes the first IL 210 formed over the channels 22A-22C of FIG. 1A, corresponding to act 2100 of FIG. 16. Only a fragmentary portion of the channel 22A is illustrated as an example in FIGS. 2A-19 for simplicity. In some embodiments, the first IL 210 includes an oxide of the semiconductor material of the substrate 110, e.g. silicon oxide. In other embodiments, the first IL 210 may include another suitable type of dielectric material. The first IL 210 has a thickness 215 (measured in the Z-direction of FIG. 12A). In some embodiments, the thickness 215 is in a range between about 5 angstroms and about 50 angstroms. In some embodiments, the thickness 215 is about 10 angstroms.

Still referring to FIGS. 12A-12C, the first gate dielectric layer 220 is formed over the first IL 210, corresponding to act 2200 of FIG. 16. In some embodiments, an atomic layer deposition (ALD) process is used to form the first gate dielectric layer 220 to control thickness of the deposited first gate dielectric layer 220 with precision. In some embodiments, the ALD process is performed using between about 20 and 40 deposition cycles, at a temperature range between about 200 degrees Celsius and about 300 degrees Celsius. In some embodiments, the ALD process uses HfCl4 and/or H2O as precursors. Such an ALD process may form the first gate dielectric layer 220 to have a thickness 225, which may be in a range between about 5 angstroms and about 50 angstroms. In some embodiments, the thickness 225 is about 9 angstroms.

In some embodiments, and as described above with respect to FIG. 1A, the first gate dielectric layer 220 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the first gate dielectric layer 220 may include a non-high-k dielectric material such as silicon oxide.

In some embodiments, tuning dielectric layers (not specifically illustrated) are formed on the first gate dielectric layers 220 of the gate structures 200A, 200B, 200D, corresponding to act 2300 of FIG. 16. The tuning dielectric layers allow for tuning of threshold voltage in the gate structures 200A, 200B, 200D. In more detail, a first tuning dielectric layer may be deposited directly on the first gate dielectric layer 220 in the gate structures 200A, 200B, 200D. In some embodiments, the first tuning dielectric layer may include a dipole material suitable for N-type devices (also referred to as an N-type dipole material), which may include a metal oxide material such as lanthanum oxide ($La_2O_3$), magnesium oxide (MgO), yttrium oxide ($Y_2O_3$), titanium oxide ($TiO_2$), or combinations thereof, as non-limiting examples. For N-type transistor devices, the N-type dipole material may decrease the threshold voltage Vt. For P-type transistor devices, the N-type dipole material may increase the threshold voltage Vt. In alternative embodiments where a P-type dipole material is used to implement the first tuning dielectric layer, the threshold voltage Vt will be increased for NFET devices, and will be decreased for PFET devices. Example P-type dipole materials may include $Al_2O_3$, $Nb_2O_5$, or $B_2O_3$.

Following deposition of the first tuning dielectric layer, the first tuning dielectric layer may be removed from the gate structures 200B, 200D, such that the first tuning dielectric layer remains on the gate structure 200A. An additional tuning dielectric layer may then be formed on the gate structures 200A, 200B, 200D, then removed from the gate structure 200D, such that two tuning dielectric layers overly the gate structure 200A, one tuning dielectric layer overlies the gate structure 200B, and no tuning dielectric layer overlies the gate structure 200D. As such, the first gate dielectric layer 220 will experience the strongest doping effect for the gate structure 200A during a thermal drive-in process. The first gate dielectric layer 220 may experience a weaker doping effect in the gate structure 200B. In the gate structure 200D, no tuning dielectric layer is present, such that the first gate dielectric layer 220 in the gate structure 200D may experience the weakest (or substantially no) doping effect.

A thermal drive-in process is performed to the gate structures 200A, 200B, 200D, which may include an annealing process. In some embodiments, the annealing process may be performed at an annealing temperature between about 600 degrees Celsius and about 800 degrees Celsius, while using a nitrogen gas. The annealing temperature causes the metal ions in the tuning dielectric layers to penetrate into (or react with) the first gate dielectric layer 220. This change in composition of the first gate dielectric layer 220 is represented in the figures by the first gate dielectric layer 221 and the first gate dielectric layer 222. As described above, dopant concentration is highest in the first gate dielectric layer 222, and lowest or zero in the first gate dielectric layer 220. Dopant concentration in the first gate dielectric layer 221 is lower than in the first gate dielectric layer 222, and higher than in the first gate dielectric layer 220. It is understood that within each of the first gate dielectric layers 222, 221, 220, the concentration of the dopant material (e.g., the metal ions) may be at its peak at a surface of the first gate dielectric layers 222, 221, 220 nearest the tuning dielectric layers, and then gradually decline as the distance from the surface increases (e.g., nearer the channels 22A-22C).

Referring now to FIGS. 13A-13C, after removing the tuning dielectric layers, the second gate dielectric layer 230 is deposited on the first gate dielectric layers 222, 221, 220, corresponding to act 2500 of FIG. 16. In some embodiments, the removal process includes an etching process, such as a wet etching process, a dry etching process, or a combination thereof. In some embodiments, an etchant used in such an etching process may include hydrochloric acid (HCl), alkali (NH4), oxidant, or another suitable etchant. Removal of the tuning dielectric layers 300, 400 improves gate fill window, while already having accorded the benefit of varying levels of dopant concentration to the first gate dielectric layers 222, 221, 220, which corresponds to varying threshold voltages of the gate structures 200A, 200B, 200D. The second gate dielectric layer 230 may reduce gate leakage. In some embodiments, an atomic layer deposition (ALD) process similar to that used to form the first gate dielectric layer 220 is used to form the second gate dielectric layer 230 with precisely-controlled thickness. The second gate dielectric layer 230 has a thickness 235, which may be in a range between about 5 angstroms and about 50 angstroms. In some embodiments, the thickness 235 is about 6 angstroms. In some embodiments, fewer ALD deposition cycles are used to deposit the second gate dielectric layer 230 than are used to deposit the first gate dielectric layer 220, such that the second gate dielectric layer 230 is generally thinner than the first gate dielectric layer 220. Material of the second gate dielectric layer 230 may be substantially the same as that of the first gate dielectric layer 220, in some embodiments. In other embodiments, the material of the second gate dielectric layer 230 is different from the material of the first gate dielectric layer 220. In some embodiments, the second gate dielectric layer 230 is crystallized, and has a greater rate of crystallization than the first gate dielectric layers 220-222.

Further in FIGS. 13A-13C, the second IL 240 is formed on the second gate dielectric layer 230, and the work function barrier layer 700 is formed on the second IL 240. The second IL 240 promotes better metal gate adhesion on the second gate dielectric layer 230. In many embodiments, the second IL 240 further provides improved thermal stability for the gate structures 200A, 200B, 200D, and serves to limit diffusion of metallic impurity from the work function metal layers 900 and/or the work function barrier layer 700 into the first gate dielectric layer 222, 221, 220 and the second gate dielectric layer 230. In some embodiments, formation of the second IL 240 is accomplished by first depositing a high-k capping layer (not illustrated for simplicity) on the second gate dielectric layer 230. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control is performed in cycles to remove the high-k capping layer while substantially not removing the second IL 240. Each cycle may include a first pulse of $WCl_5$, followed by an Ar purge, followed by a second pulse of $O_2$, followed by another Ar purge. The AI control is discussed in greater detail with respect to FIGS. 20-25. The high-k capping layer is removed to increase gate fill window for further multiple threshold voltage tuning by metal gate patterning.

Further in FIGS. 13A-13C, after forming the second IL 240 and removing the high-k capping layer, the work function barrier layer 700 is optionally formed on the gate structures 200A, 200B, 200D, in accordance with some embodiments, which corresponds to act 2700 of FIG. 16. The work function barrier layer 700 is or comprises a metal nitride, such as TiN, WN, MoN, TaN, or the like. In a specific embodiment, the work function barrier layer 700 is TiN. The work function barrier layer 700 may have thickness 705 ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices. As shown in FIGS. 13A-13C, after formation of the work function barrier layer 700, a mask 710 is formed over the gate structure 200D, while exposing the gate structures 200A, 200B.

Formation of the mask 710 may include at least one photoresist deposition process followed by an exposure and removal process. The mask 710 is utilized in removal of the work function barrier layer 700 from gate structures exposed by the mask 710, such as the gate structures 200A-200B, as shown in FIGS. 13A-13C. In some embodiments, the deposition and patterning of the work function barrier layer 700 may be repeated to form varying numbers of the work function barrier layer 700 on the gate structures 200A, 200B, 200D, so as to achieve variable threshold voltage tuning among the gate structures 200A, 200B, 200D. In some embodiments, each of the gate structures 200A, 200B, 200D may include as few as zero of the work function barrier layers 700 to three or more of the work function barrier layers 700. Fewer of the work function barrier layers 700 allows for larger gate fill window, whereas a greater number of the work function barrier layers 700 allows for enhanced threshold voltage tuning.

FIGS. 14A-14C illustrate the gate structures 200A, 200B, 200D with the work function barrier layers 700 in place for the gate structure 200D and removed for the gate structures 200A-200B. Further illustrated are formation of the N-type work function metal layer 250, the in-situ capping layer 260, and the oxygen blocking layer 270 (corresponding to act 2800 of FIG. 16), which may be collectively referred to as the work function metal layer 900. In some embodiments, the N-type work function metal layer 250 is or comprises an N-type metal material, such as TiAlC, TiAl, TaAlC, TaAl, or the like. The N-type work function metal layer 250 may be formed by one or more deposition methods, such as CVD, PVD, ALD, plating, and/or other suitable methods, and has a thickness 255 of between about 10 A and 20 A.

The in-situ capping layer 260 is formed on the N-type work function metal layer 250. In some embodiments, the in-situ capping layer 260 is or comprises TiN, TiSiN, TaN, or another suitable material, and has a thickness 265 between about 10 A and 20 A. The oxygen blocking layer 270 is formed on the in-situ capping layer 260 to prevent oxygen diffusion into the N-type work function metal layer 250, which would cause an undesirable shift in the threshold voltage. The oxygen blocking layer 270 is formed of a dielectric material that can stop oxygen from penetrating to the N-type work function metal layer 250, and may protect the N-type work function metal layer 250 from further oxidation. The oxygen blocking layer 270 may include an oxide of silicon, germanium, SiGe, or another suitable material. In some embodiments, the oxygen blocking layer 270 is formed using ALD and has a thickness 275 between about 10 A and about 20 A.

FIGS. 15A-15C illustrate the gate structures 200A, 200B, 200D after formation of a glue layer 280 and the metal fill layer 290, corresponding to act 2900 of FIG. 16. In some embodiments, the glue layer 280 is formed on the oxygen blocking layer 270 of the work function metal layer 900. The glue layer 280 may promote and/or enhance the adhesion between the metal fill layer 290 and the work function metal layer 900. In some embodiments, the glue layer 280 may be formed of a metal nitride, such as TiN, TaN, MoN, WN, or another suitable material, using ALD. In some embodiments, thickness 285 of the glue layer 280 is between about 10 A and about 25 A.

The metal fill layer 290 is formed on the glue layer 280, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. As shown in FIGS. 15A-15C, the metal fill layers 290 may have thickness 295N in the gate structures 200A, 200B that is thicker than thickness 295D of the metal fill layer 290 in the gate structure 200D, as a result of inclusion of the work function barrier layer(s) 700 in the gate structure 200D.

Figure 17:
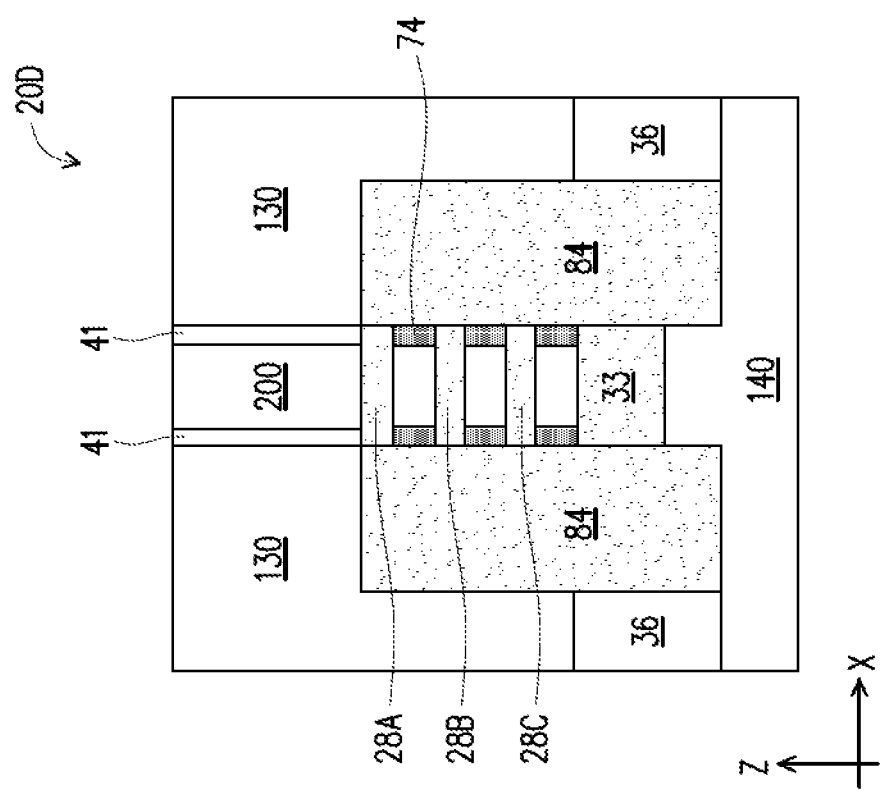
FIGS. 17-19 are views of various embodiments of an IC device of at various stages of fabrication according to various aspects of the present disclosure.
Figure 18:
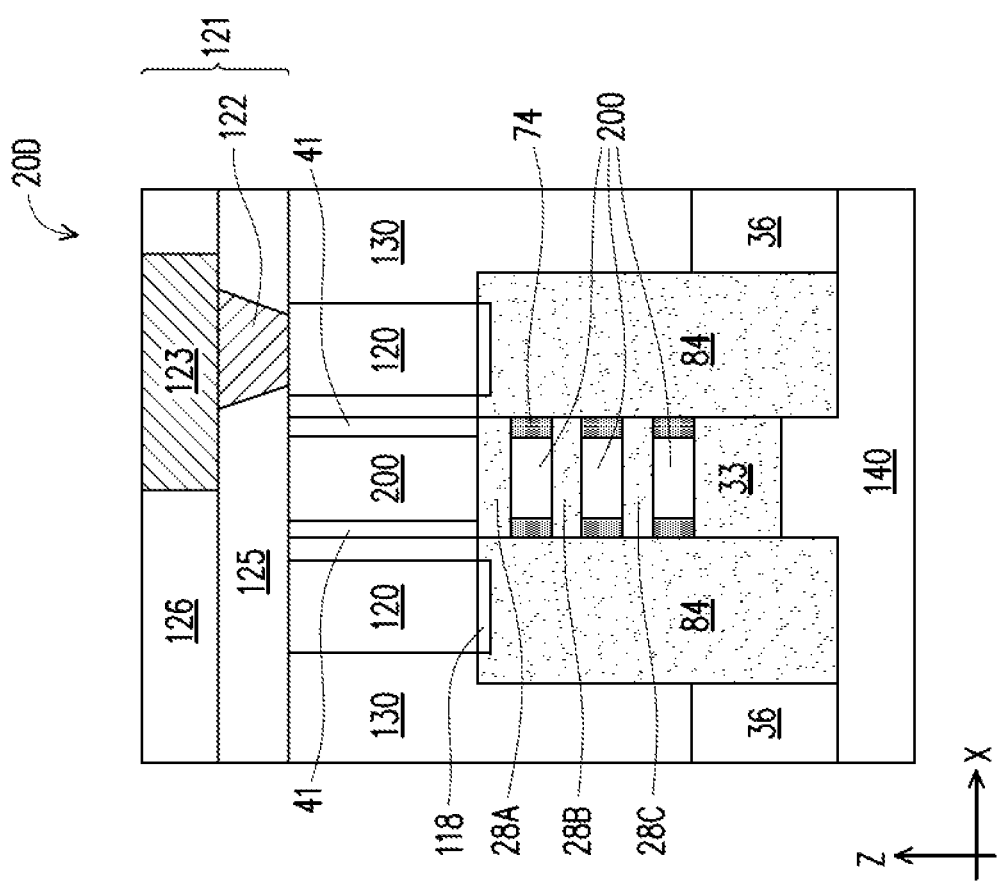
Figure 19:
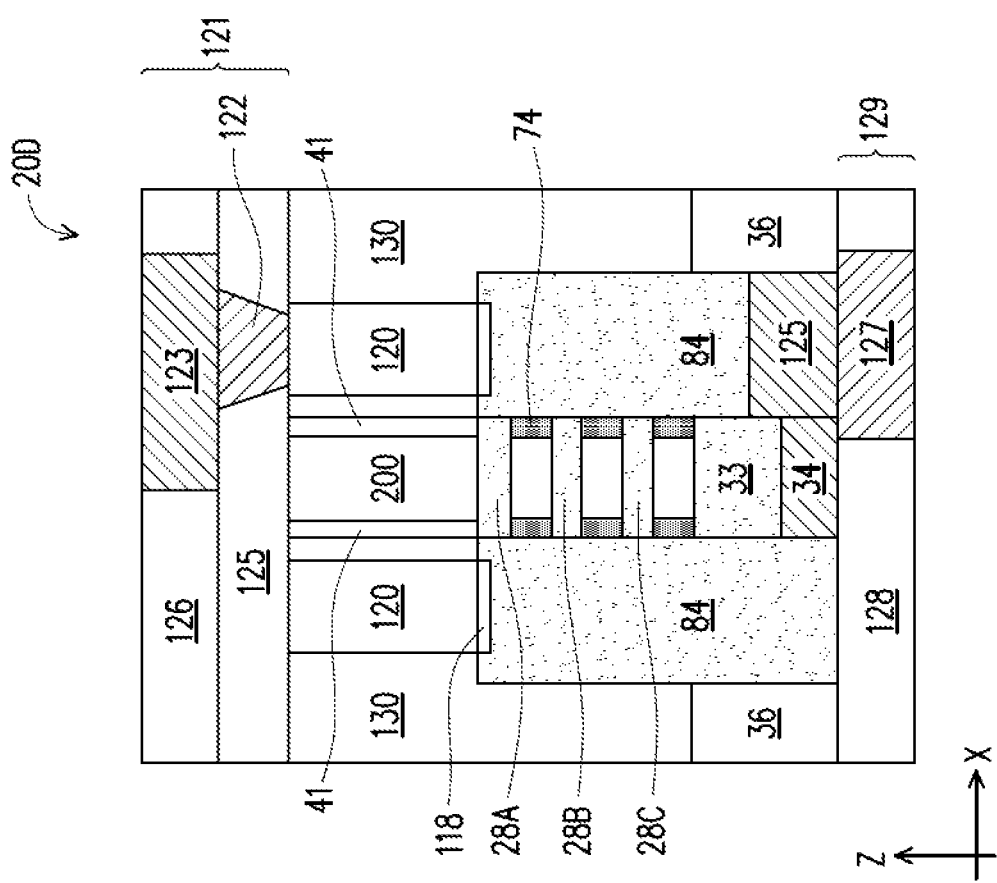

FIGS. 17-19 illustrate cross-sectional views of intermediate stages in the manufacturing of the GAA device 20D, in accordance with some embodiments.

Following the process described with reference to FIGS. 10A-10D and FIGS. 15A-15C, in FIG. 17, the conductive features 84, the channels 28A-28C and the conductive fin structure 33 are formed by one or more replacement processes. In some embodiments, one or more openings are etched in the ILD 130 to expose the source/drain features 82. An etching process may form an opening by removing the source/drain features 82 using a first etchant, such as a dry etchant or a wet etchant. In some embodiments, the source/drain features 82 are or comprise SiGe, and the nanostructures 22 and the fin structure 32 are or comprise silicon. Following removal of the source/drain features 82, a second etching process may be performed using a second etchant to extend the opening by removing the nanostructures 22 and the fin structure 32. In some embodiments, the second etchant is a different etchant than the first etchant used to remove the source/drain features 82.

Following removal of the source/drain features 82, the nanostructures 22, and the fin structure 32, the conductive features 84, the channels 28, and the conductive fin structure 33 are formed by one or more deposition processes. In some embodiments, the deposition process includes PVD, CVD, PECVD, ALD, or another suitable process. In some embodiments, the deposition process deposits a metal nitride, such as TiN, TaN, or the like, to fill substantially the opening between the ILD 130, the isolation regions 36, the buffer layer 140, the gate structure 200, the spacers 41, and the inner spacers 74. In some embodiments, no discernable interface is present between the conductive features 84, the channels 28, and the conductive fin structure 33 due to being formed in a single, continuous process.

Following deposition of the conductive features 84, the channels 28 and the conductive fin structure 33, excess deposited material above the ILD 130, the spacers 41 and the gate structure 200 is removed by a removal process, such as CMP, etching, or another suitable process. In some embodiments, the deposited material in the opening of the ILD 130 over the conductive features 84 is recessed to a level even with or slightly below upper surfaces of the conductive features 84 to reopen the opening in the ILD 130. The opening in the ILD 130 may then be refilled with a dielectric material, which is generally the same material as the ILD 130. In some embodiments, due to the refilling, a discernable vertical interface is present in the ILD 130 over the upper surface of the conductive feature 84 and/or substantially aligned with an outer sidewall of the conductive feature 84 adjacent the ILD 130 and the isolation region 36. In some embodiments, when a contact 120 is to be formed over and electrically connected to the conductive feature 84, the opening in the ILD 130 is not refilled with the dielectric material, as shown in FIG. 18.

In FIG. 18, contacts 120 are formed over the conductive features 84. The contacts 120 may include a conductive material such as tungsten, cobalt, ruthenium, iridium, molybdenum, copper, aluminum, or combinations thereof. A silicide layer 118 may be formed between the source/drain features 82 and the contacts 120, so as to reduce contact resistance. The silicide layer 118 may contain a metal silicide material, such as cobalt silicide in some embodiments, or TiSi in some other embodiments.

Further in FIG. 18, following formation of the contacts 120, the interconnect structure 121 is formed over and electrically connected to at least one of the contacts 120. A single conductive via 122 and a single conductive trace 123 are shown in FIG. 18 for ease of illustration. Generally, the interconnect structure 121 includes a stack of multiple dielectric layers, such as the insulating layers 125, 126, and many conductive features similar to the conductive via 122 and the conductive trace 123 embedded therein. The conductive features in the dielectric layers of the interconnect structure 121 may be formed of conductive materials, such as tungsten, cobalt, ruthenium, iridium, molybdenum, copper, aluminum, or combinations thereof. The conductive features may be formed by any suitable process, including PVD or electroplating, in a single damascene or dual damascene scheme.

By forming the conductive via 122 and the conductive trace 123 electrically connected to the conductive features 84 through the contact 120, electrical signals may be applied to the conductive features 84, the channels 28, and the conductive fin structure 33, which collectively are a second plate of the GAA capacitor 20D. Further electrical signals may be applied to the gate structure 200, which is a first plate of the GAA capacitor 20D.

In FIG. 19, following formation of the interconnect structure 121, a backside via 125 and a backside interconnect structure 129 are formed on the backside of the GAA capacitor 20D. In some embodiments, the substrate 110 and the buffer layer 140 are removed by a removal process, such as grinding, CMP, etching or another suitable process, to expose the backsides of the conductive features 84. In some embodiments, following the removal process, the buffer layer 34 as shown in FIG. 19 is a remaining portion of the buffer layer 140 not removed.

In some embodiments, the backside via 125 is formed by first flipping the GAA capacitor 20D, and recessing the conductive feature 84. The recessing may be by any suitable process, generally including a dry etch or wet etch process that attacks the conductive feature 84, but is not selective to the neighboring isolation region 36 and buffer layer 34, leaving an opening over the conductive feature 84. Following recessing of the conductive feature 84, a conductive material is filled in the opening by any suitable process, such as a deposition process or an electroplating process. The conductive material may be tungsten, cobalt, ruthenium, iridium, molybdenum, copper, aluminum, or combinations thereof. In some embodiments, a barrier or seed layer is formed prior to filling the conductive material to promote better adhesion to the underlying metal nitride material of the conductive feature 84. Excess conductive material present on the backside of the GAA device 20D may then be removed by, for example, a CMP or etching process, after which bottom surfaces of the isolation regions 36, the backside via 125, the buffer layer 34, and the conductive feature 84 may be substantially coplanar.

Further to FIG. 19, following formation of the backside via 125, the backside interconnect structure 129 is formed over the bottom surfaces of the isolation regions 36, the backside via 125, the buffer layer 34, and the conductive feature 84. While the backside interconnect structure 129 is shown in FIG. 19 with only a single bottom insulating layer 128 and conductive feature 127 embedded therein for simplicity of illustration, the backside interconnect structure 129 generally includes a stack of multiple insulating layers and conductive features embedded therein.

In some embodiments, the bottom insulating layer 128 is first formed over the isolation regions 36, the backside via 125, the buffer layer 34, and the conductive feature 84. The bottom insulating layer 128 is then patterned to form an opening exposing the backside via 125. The opening over the backside via 125 may then be filled by a conductive material, such as tungsten, cobalt, ruthenium, iridium, molybdenum, copper, aluminum, or combinations thereof, by a suitable process, such as deposition or electroplating, so as to form the conductive feature 127. In some embodiments, a barrier or seed layer is formed prior to filling the conductive material, such as a copper seed layer when the conductive material is copper. In some embodiments, the conductive feature 127 overlies the barrier layer 34 and/or the isolation region 36 on opposing sides of the backside via 125.

Figure 20:
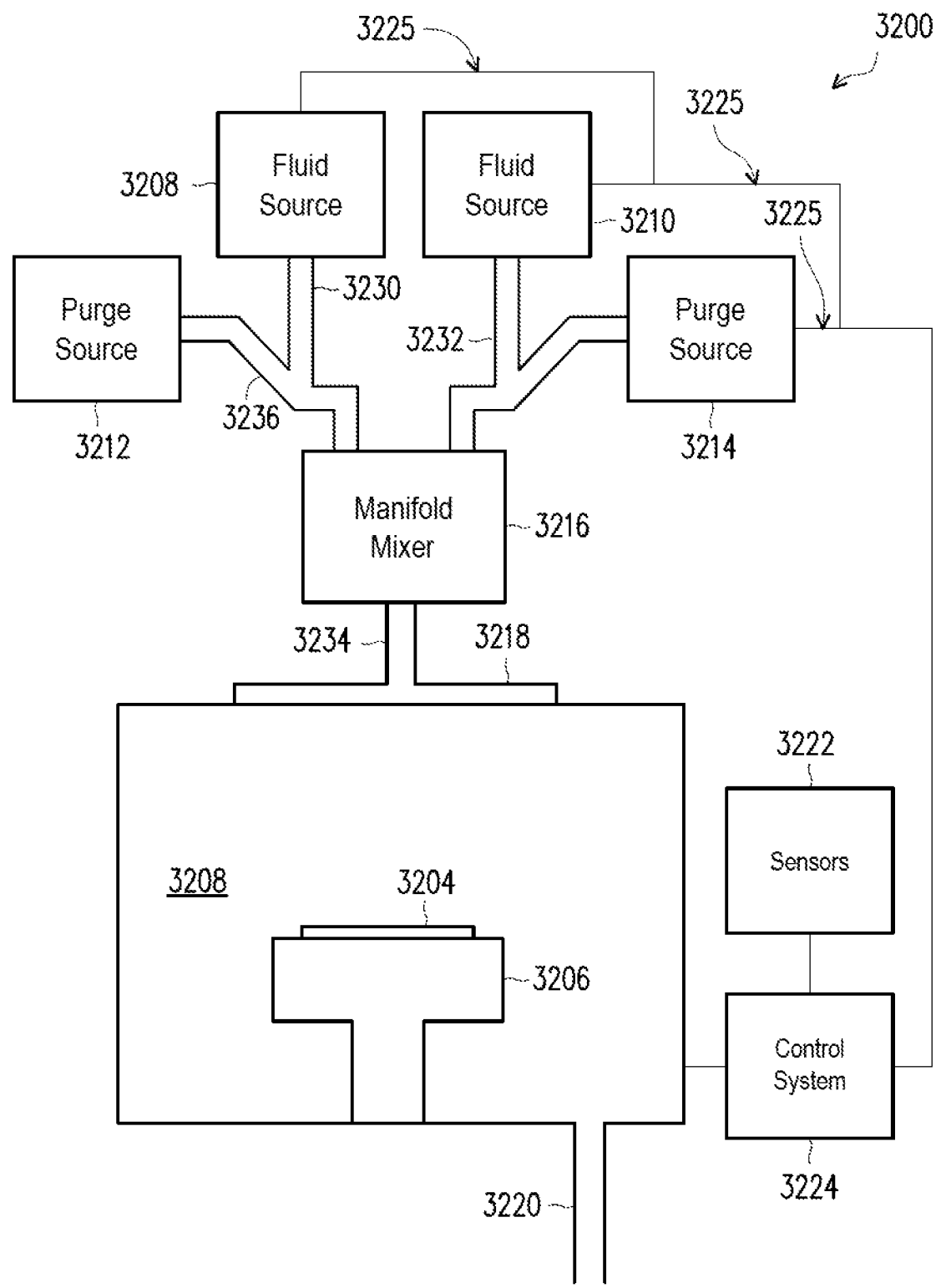
FIGS. 20-25 are a diagrams of a system and process for fabricating a semiconductor device layer according to various aspects of the present disclosure.

FIG. 20 is an illustration of a semiconductor process system 3200, according to one embodiment. The semiconductor process system 3200 can be utilized to perform the controlled ALE processes used to form the GAA devices 20N, 20C, 20D as described in relation to FIGS. 1A-19. The semiconductor process system 3200 includes a process chamber 3202 including an interior volume 3203. A support 3206 is positioned within the interior volume 3203 and is configured to support a substrate 3204 during a thin-film etching process. The semiconductor process system 3200 is configured to etch a thin film on the substrate 3204, such as the high-k capping layer used to form the second IL 240 or the work function barrier layer 700. The semiconductor process system 3200 includes a control system 3224 that dynamically adjusts thin-film etching parameters. Details of the control system 3224 are provided after description of the operation of the semiconductor process system 3200.

In one embodiment, the semiconductor process system 3200 includes a first fluid source 3208 and a second fluid source 3210. The first fluid source 3208 supplies a first fluid into the interior volume 3203. The second fluid source 3210 supplies a second fluid into the interior volume 3203. The first and second fluids both contribute in etching a thin film on the substrate 3204. While FIG. 20 illustrates fluid sources 3208 and 3210, in practice, the fluid sources 3208 and 3210 may include or supply materials other than fluids. For example, the fluid sources 3208 and 3210 may include material sources that provide all materials for the etching process.

Figure 21:
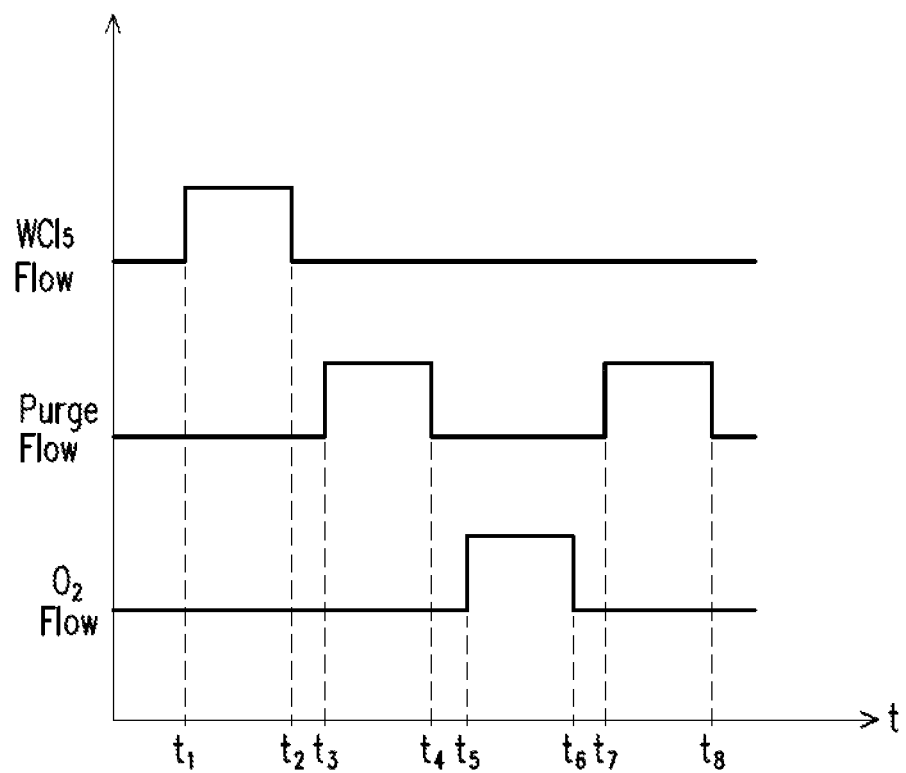

In one embodiment, the semiconductor process system 3200 is an atomic layer etching (ALE) system that performs ALE processes. The ALE system performs etching processes in cycles. Each cycle includes flowing a first etching fluid from the fluid source 3208, followed by purging the first etching fluid from the etching chamber by flowing the purge gas from one or both of the purge sources 3212 and 3224, followed by flowing a second etching fluid from the fluid source 3210, followed by purging the second etching fluid from the etching chamber by flowing the purge gas from one or both of the purge sources 3212 and 3224. This corresponds to a single ALE cycle. Each cycle etches an atomic or molecular layer from the thin-film that is being etched. A specific example of the ALE cycle is illustrated in FIG. 21.

The parameters of a thin film generated by the semiconductor process system 3200 can be affected by a large number of process conditions. The process conditions can include, but are not limited to, an amount of fluid or material remaining in the fluid sources 3208, 3210, a flow rate of fluid or material from the fluid sources 3208, 3210, the pressure of fluids provided by the fluid sources 3208 and 3210, the length of tubes or conduits that carry fluid or material into the process chamber 3202, the age of an ampoule defining or included in the process chamber 3202, the temperature within the process chamber 3202, the humidity within the process chamber 3202, the pressure within the process chamber 3202, light absorption and reflection within the process chamber 3202, surface features of the semiconductor wafer 3204, the composition of materials provided by the fluid sources 3208 and 3210, the phase of materials provided by the fluid sources 3208 and 3210, the duration of the etching process, the duration of individual phases of the etching process, and various other factors, including the factors described with respect to FIG. 20, or factors not specifically listed above.

The combination of the various process conditions during the etching process determines the remaining thickness of a thin film etched by the ALE process. It is possible that process conditions may result in thin films that do not have remaining thicknesses that fall within target parameters. If this happens, then integrated circuits formed from the semiconductor wafer 3204 may not function properly. The quality of batches of semiconductor wafers may suffer. In some cases, some semiconductor wafers may need to be scrapped.

The semiconductor process system 3200 utilizes the control system 3224 to dynamically adjust process conditions to ensure that etching processes result in thin films having parameters or characteristics that fall within target parameters or characteristics. The control system 3224 is connected to processing equipment associated with the semiconductor process system 3200. The processing equipment can include components shown in FIG. 20. The control system 3224 can control the flow rate of material from the fluid sources 3208 and 3210, the temperature of materials supplied by the fluid sources 3208 and 3210, the pressure of fluids provided by the fluid sources 3208 and 3210, the flow rate of material from purge sources 3212 and 3214, the duration of flow of materials from the fluid sources 3208 and 3210 and the purge sources 3212 and 3214, the temperature within the process chamber 3202, the pressure within the process chamber 3202, the humidity within the process chamber 3202, and other aspects of the thin-film etching process. The control system 3224 controls these process parameters so that the thin-film etching process results in a thin-film having target parameters such as a target remaining thickness, a target composition, a target crystal orientation, etc. Further details regarding the control system are provided in relation to FIGS. 22-23.

In one embodiment, the control system 3224 is communicatively coupled to the first and second fluid sources 3208, 3210 via one or more communication channels 3225. The control system 3224 can send signals to the first fluid source 3208 and the second fluid source 3210 via the communication channels 3225. The control system 3224 can control functionality of the first and second fluid sources 3208, 3210 responsive, in part, to the sensor signals from a byproduct sensor 3222.

In one embodiment, the semiconductor process system 3200 can include one or more valves, pumps, or other flow control mechanisms for controlling the flow rate of the first fluid from the first fluid source 3208. These flow control mechanisms may be part of the fluid source 3208 or may be separate from the fluid source 3208. The control system 3224 can be communicatively coupled to these flow control mechanisms or to systems that control these flow control mechanisms. The control system 3224 can control the flowrate of the first fluid by controlling these mechanisms. The control system 3200 may include valves, pumps, or other flow control mechanisms that control the flow of the second fluid from the second fluid source 3210 in the same manner as described above in reference to the first fluid and the first fluid source 3208.

In one embodiment, the semiconductor process system 3200 includes a manifold mixer 3216 and a fluid distributor 3218. The manifold mixer 3216 receives the first and second fluids, either together or separately, from the first fluid source 3208 and the second fluid source 3210. The manifold mixer 3216 provides either the first fluid, the second fluid, or a mixture of the first and second fluids to the fluid distributor 3218. The fluid distributor 3218 receives one or more fluids from the manifold mixer 3216 and distributes the one or more fluids into the interior volume 3203 of the process chamber 3202.

In one embodiment, the first fluid source 3208 is coupled to the manifold mixer 3216 by a first fluid channel 3230. The first fluid channel 3230 carries the first fluid from the fluid source 3208 to the manifold mixer 3216. The first fluid channel 3230 can be a tube, pipe, or other suitable channel for passing the first fluid from the first fluid source 3208 to the manifold mixer 3216. The second fluid source 3210 is coupled to the manifold mixer 3216 by second fluid channel 3232. The second fluid channel 3232 carries the second fluid from the second fluid source 3210 to the manifold mixer 3216.

In one embodiment, the manifold mixer 3216 is coupled to the fluid distributor 3218 by a third fluid line 3234. The third fluid line 3234 carries fluid from the manifold mixer 3216 to the fluid distributor 3218. The third fluid line 3234 may carry the first fluid, the second fluid, a mixture of the first and second fluids, or other fluids, as will be described in more detail below.

The first and second fluid sources 3208, 3210 can include fluid tanks. The fluid tanks can store the first and second fluids. The fluid tanks can selectively output the first and second fluids.

In one embodiment, the semiconductor process system 3200 includes a first purge source 3212 and the second purge source 3214. The first purge source is coupled to the first fluid line 3230 by first purge line 3236. The second purge source is coupled to the second fluid line 3232 by second purge line 3238. In practice, the first and second purge sources may be a single purge source.

In one embodiment, the first and second purge sources 3212, 3214 supply a purging gas into the interior volume 3203 of the process chamber 3202. The purge fluid is a fluid selected to purge or carry the first fluid, the second fluid, byproducts of the first or second fluid, or other fluids from the interior volume 3203 of the process chamber 3202. The purge fluid is selected to not react with the substrate 3204, the gate metal layer on the substrate 3204, the first and second fluids, and byproducts of this first or second fluid. Accordingly, the purge fluid may be an inert gas including, but not limited to, Ar or N2.

While FIG. 20 illustrates a first fluid source 3208 and a second fluid source 3210, in practice the semiconductor process system 3200 can include other numbers of fluid sources. For example, the semiconductor process system 3200 may include only a single fluid source or more than two fluid sources. Accordingly, the semiconductor process system 3200 can include a different number than two fluid sources without departing from the scope of the present disclosure.

FIG. 21 is a graph illustrating a cycle of an ALE process performed by the semiconductor process system 3200, according to one embodiment. At time T1 the first etching fluid begins to flow. In the example of FIG. 21, the first etching fluid is WCl5. The first etching fluid flows from the fluid source 3208 into the interior volume 3203. In the interior volume 3203, the first etching fluid reacts with the top exposed layer of the high-k capping layer (e.g., TiSiN) or the work function barrier layer 700 (e.g., TiN). At time T2, the first etching fluid WCl5 stops flowing. In one example, the time elapsed between T1 and T2 between 1 s and 10 s.

At time T3, the purge gas begins to flow. The purge gas flows from one or both of the purge sources 3212 and 3224. In one example, the purge gas is one of argon, N2, or another inert gas that can purge the first etching fluid WCl5 without reacting with the high-k capping layer (e.g., TiSiN) or the work function barrier layer 700 (e.g., TiN). At time T4, the purge gas stops flowing. In one example, the time elapsed between T3 and T4 is between 2 s and 15 s.

At time T5, the second etching fluid flows into the interior volume 3203. The second etching fluid flows from the fluid source 3210 into the interior volume 3203. In one example, the second etching fluid is O2. The O2 reacts with the top atomic or molecular layer of the titanium nitride layer 124 and completes the etching of the top atomic or molecular layer of the titanium nitride layer 124. At time T6, the second etching fluid stops flowing. In one example, the elapsed time between T5 and T6 is between 1 s and 10 s.

At time T7, the purge gas flows again and purges the interior volume 3203 of the second etching fluid. At time T8 the purge gas stops flowing. The time between T1 and T8 corresponds to a single ALE cycle.

In practice, an ALE process may include between 5 and 50 cycles, depending on the initial thickness of the high-k capping layer (e.g., TiSiN) or the work function barrier layer 700 (e.g., TiN) and the desired final thickness of the high-k capping layer (e.g., TiSiN) or the work function barrier layer 700 (e.g., TiN). Each cycle removes an atomic or molecular layer of the high-k capping layer (e.g., TiSiN) or the work function barrier layer 700 (e.g., TiN). Other materials, processes, and elapsed times can be utilized without departing from the scope of the present disclosure.

Figure 22:
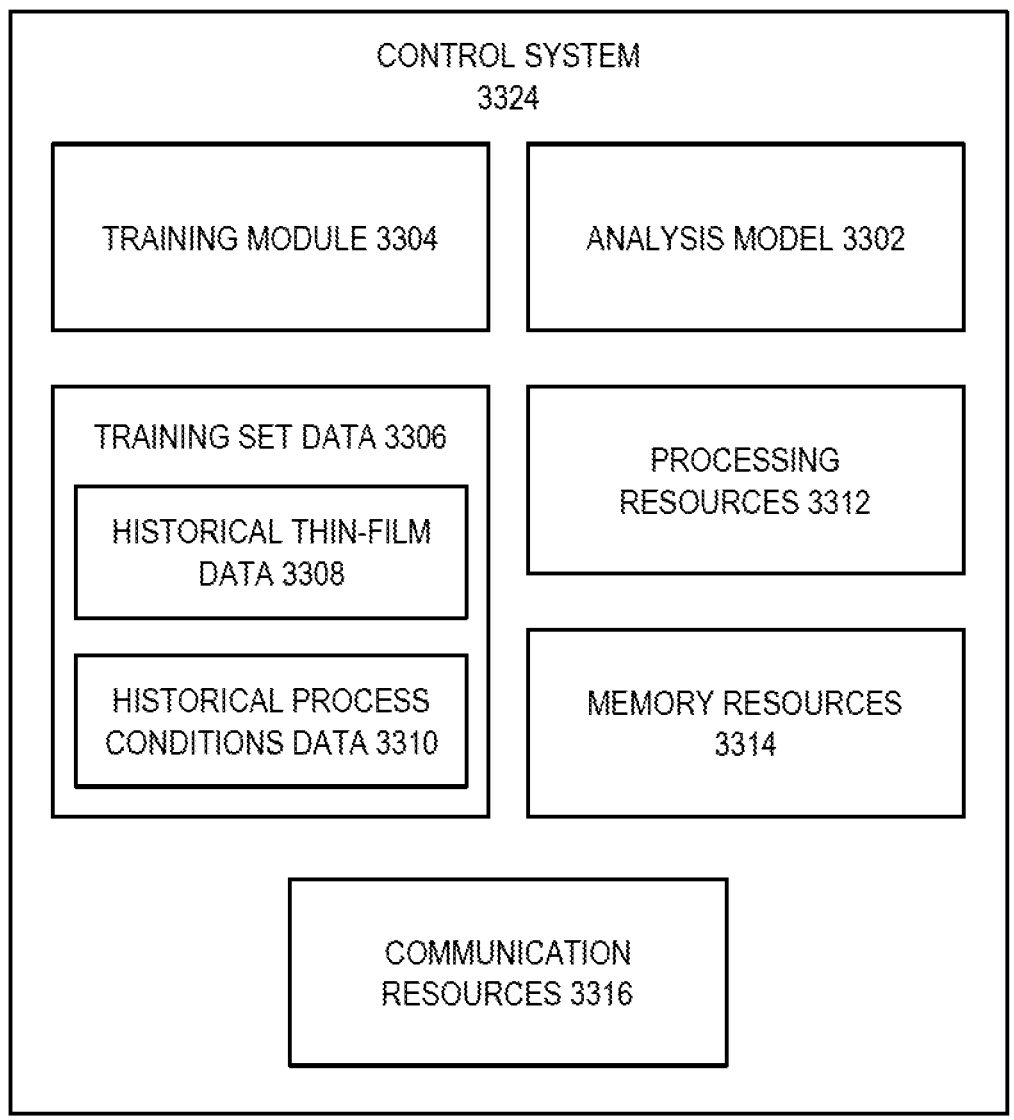

FIG. 22 is a block diagram of the control system 3224 of FIG. 20, according to one embodiment. The control system 3224 of FIG. 22 is configured to control operation of the semiconductor process system 3200 in performing ALE processes to form the GAA devices 20N, 20C, 20D of FIGS. 1A-1B, according to one embodiment. The control system 3224 utilizes machine learning to adjust parameters of the semiconductor process system 3200. The control system 3224 can adjust parameters of the semiconductor process system 3200 between ALE runs or even between ALE cycles in order to ensure that a thin-film layer formed by the ALE process falls within selected specifications.

In one embodiment, the control system 3224 includes an analysis model 3302 and a training module 3304. The training module 3304 trains the analysis model 3302 with a machine learning process. The machine learning process trains the analysis model 3302 to select parameters for an ALE process that will result in a thin film having selected characteristics. Although the training module 3304 is shown as being separate from the analysis model 3302, in practice, the training module 3304 may be part of the analysis model 3302.

The control system 3224 includes, or stores, training set data 3306. The training set data 3306 includes historical thin-film data 3308 and historical process conditions data 3310. The historical thin-film data 3308 includes data related to thin films resulting from ALE processes. The historical process conditions data 3310 includes data related to process conditions during the ALE processes that generated the thin films. As will be set forth in more detail below, the training module 3304 utilizes the historical thin-film data 3308 and the historical process conditions data 3310 to train the analysis model 3302 with a machine learning process.

In one embodiment, the historical thin-film data 3308 includes data related to the remaining thickness of previously etched thin films. For example, during operation of a semiconductor fabrication facility, thousands or millions of semiconductor wafers may be processed over the course of several months or years. Each of the semiconductor wafers may include thin films etched by ALE processes. After each ALE process, the thicknesses of the thin-films are measured as part of a quality control process. The historical thin-film data 3308 includes the remaining thicknesses of each of the thin films etched by ALE processes. Accordingly, the historical thin-film data 3308 can include thickness data for a large number of thin-films etched by ALE processes.

In one embodiment, the historical thin-film data 3308 may also include data related to the thickness of thin films at intermediate stages of the thin-film etching processes. For example, an ALE process may include a large number of etching cycles during which individual layers of the thin film are etched. The historical thin-film data 3308 can include thickness data for thin films after individual etching cycles or groups of etching cycles. Thus, the historical thin-film data 3308 not only includes data related to the total thickness of a thin film after completion of an ALE process, but may also include data related to the thickness of the thin film at various stages of the ALE process.

In one embodiment, the historical thin-film data 3308 includes data related to the composition of the remaining thin films etched by ALE processes. After a thin film is etched, measurements can be made to determine the elemental or molecular composition of the thin films. Successful etching of the thin films results in a thin film that includes particular remaining thicknesses. Unsuccessful etching processes may result in a thin film that does not include the specified proportions of elements or compounds. The historical thin-film data 3308 can include data from measurements indicating the elements or compounds that make up the various thin films.

In one embodiment, the historical process conditions 3310 include various process conditions or parameters during ALE processes that etch the thin films associated with the historical thin-film data 3308. Accordingly, for each thin film having data in the historical thin-film data 3308, the historical process conditions data 3310 can include the process conditions or parameters that were present during etching of the thin film. For example, the historical process conditions data 3310 can include data related to the pressure, temperature, and fluid flow rates within the process chamber during ALE processes.

The historical process conditions data 3310 can include data related to remaining amounts of precursor material in the fluid sources during ALE processes. The historical process conditions data 3310 can include data related to the age of the process chamber 3202, the number of etching processes that have been performed in the process chamber 3202, a number of etching processes that have been performed in the process chamber 3202 since the most recent cleaning cycle of the process chamber 3202, or other data related to the process chamber 3202. The historical process conditions data 3310 can include data related to compounds or fluids introduced into the process chamber 3202 during the etching process. The data related to the compounds can include types of compounds, phases of compounds (solid, gas, or liquid), mixtures of compounds, or other aspects related to compounds or fluids introduced into the process chamber 3202. The historical process conditions data 3310 can include data related to the humidity within the process chamber 3202 during ALE processes. The historical process conditions data 3310 can include data related to light absorption, light adsorption, and light reflection related to the process chamber 3202. The historical process conditions data 3326 can include data related to the length of pipes, tubes, or conduits that carry compounds or fluids into the process chamber 3202 during ALE processes. The historical process conditions data 3310 can include data related to the condition of carrier gases that carry compounds or fluids into the process chamber 3202 during ALE processes.

In one embodiment, historical process conditions data 3310 can include process conditions for each of a plurality of individual cycles of a single ALE process. Accordingly, the historical process conditions data 3310 can include process conditions data for a very large number of ALE cycles.

In one embodiment, the training set data 3306 links the historical thin-film data 3308 with the historical process conditions data 3310. In other words, the thin-film thickness, material composition, or crystal structure associated with a thin film in the historical thin-film data 3308 is linked (e.g., by labeling) to the process conditions data associated with that etching process. As will be set forth in more detail below, the labeled training set data can be utilized in a machine learning process to train the analysis model 3302 to predict semiconductor process conditions that will result in properly formed thin films.

In one embodiment, the control system 3324 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 located at a site or facility of the semiconductor process system 3200. The processing resources can include virtual processing resources 3312 remote from the site semiconductor process system 3200 or a facility at which the semiconductor process system 3200 is located. The processing resources 3312 can include cloud-based processing resources including processors and servers accessed via one or more cloud computing platforms.

In one embodiment, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3224 and its components. The data can include the training set data 3306, current process conditions data, and any other data associated with the operation of the control system 3224 or any of its components. The memory resources 3314 can include physical memory resources located at the site or facility of the semiconductor process system 3200. The memory resources can include virtual memory resources located remotely from site or facility of the semiconductor process system 3200. The memory resources 3314 can include cloud-based memory resources accessed via one or more cloud computing platforms.

In one embodiment, the communication resources can include resources that enable the control system 3224 to communicate with equipment associated with the semiconductor process system 3200. For example, the communication resources 3316 can include wired and wireless communication resources that enable the control system 3224 to receive the sensor data associated with the semiconductor process system 3200 and to control equipment of the semiconductor process system 3200. The communication resources 3316 can enable the control system 3224 to control the flow of fluids or other material from the fluid sources 3308 and 3310 and from the purge sources 3312 and 3314. The communication resources 3316 can enable the control system 3224 to control heaters, voltage sources, valves, exhaust channels, wafer transfer equipment, and any other equipment associated with the semiconductor process system 3200. The communication resources 3316 can enable the control system 3224 to communicate with remote systems. The communication resources 3316 can include, or can facilitate communication via, one or more networks such as wire networks, wireless networks, the Internet, or an intranet. The communication resources 3316 can enable components of the control system 3224 to communicate with each other.

In one embodiment, the analysis model 3302 is implemented via the processing resources 3312, the memory resources 3314, and the communication resources 3316. The control system 3224 can be a dispersed control system with components and resources and locations remote from each other and from the semiconductor process system 3200.

Figure 23:
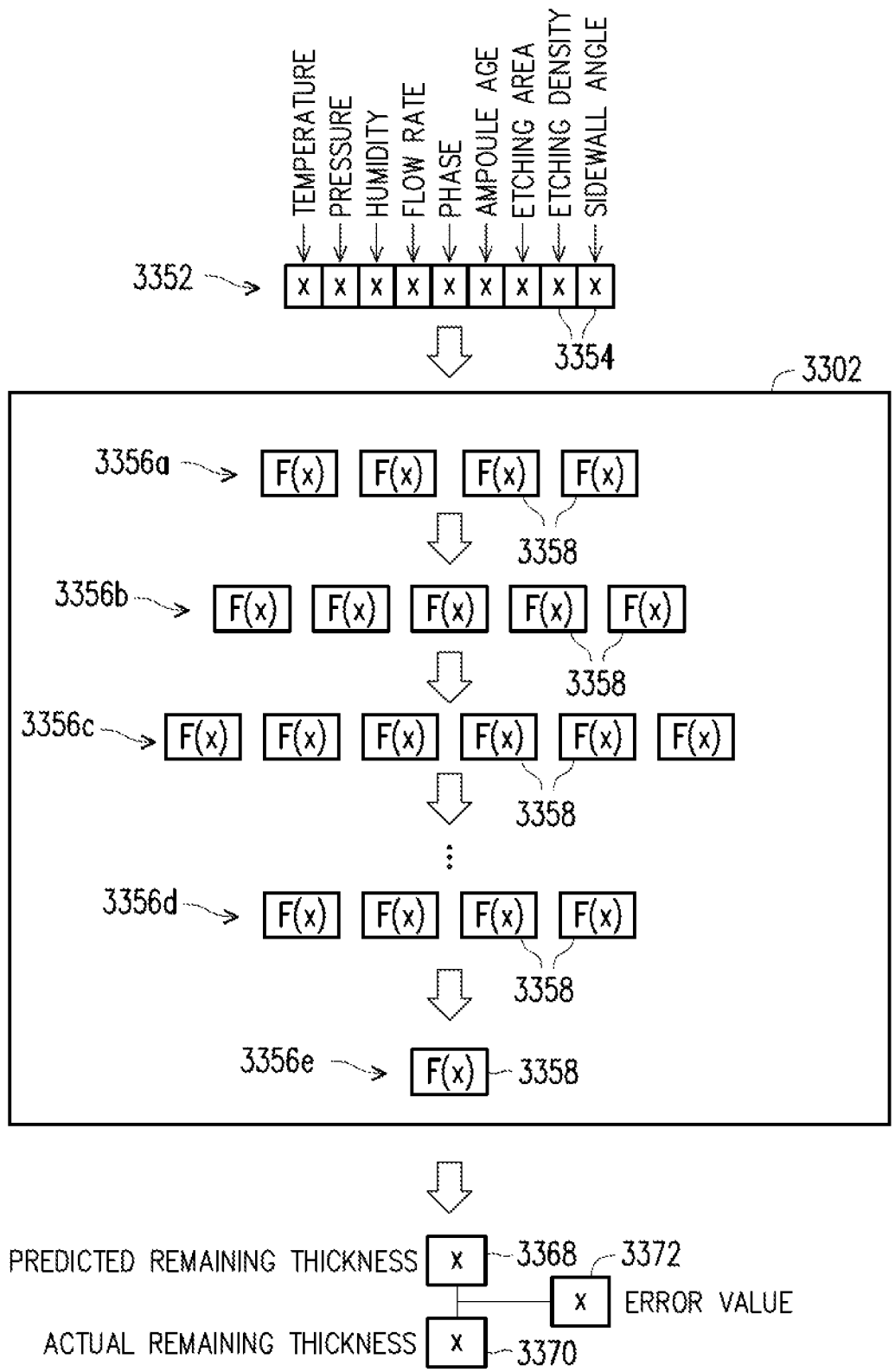

FIG. 23 is a block diagram illustrating operational aspects and training aspects of the analysis model 3302 of FIG. 22, according to one embodiment. The analysis model 3302 can be used to select parameters for ALE processes performed by the semiconductor process system 3200 of FIG. 20 to form the GAA devices 20N, 20C, 20D of FIGS. 1A-1B. As described previously, the training set data 3306 includes data related to a plurality of previously performed thin-film etching processes. Each previously performed thin-film etching process took place with particular process conditions and resulted in a thin-film having a particular characteristics. The process conditions for each previously performed thin-film etching process are formatted into a respective process conditions vector 3352. The process conditions vector includes a plurality of data fields 3354. Each data field 3354 corresponds to a particular process condition.

The example of FIG. 23 illustrates a single process conditions vector 3352 that will be passed to the analysis model 3302 during the training process. In the example of FIG. 23, the process conditions vector 3352 includes nine data fields 3354. A first data field 3354 corresponds to the temperature during the previously performed thin-film etching process. A second data field 3356 corresponds to the pressure during the previously performed thin-film etching process. A third data field 3354 corresponds to the humidity during the previously performed thin-film etching process. The fourth data field 3354 corresponds to the flow rate of etching materials during the previously performed thin-film etching process. The fifth data field 3354 corresponds to the phase (liquid, solid, or gas) of etching materials during the previously performed thin-film etching process. The sixth data field 3354 corresponds to the age of the ampoule used in the previously performed thin-film etching process. The seventh data field 3354 corresponds to a size of an etching area on a wafer during the previously performed thin-film etching process. The eighth data field 3354 corresponds to the density of surface features of the wafer utilized during the previously performed thin-film etching process. The ninth data field corresponds to the angle of sidewalls of surface features during the previously performed thin-film etching process. In practice, each process conditions vector 3352 can include more or fewer data fields than are shown in FIG. 23 without departing from the scope of the present disclosure. Each process conditions vector 3352 can include different types of process conditions without departing from the scope of the present disclosure. The particular process conditions illustrated in FIG. 23 are given only by way of example. Each process condition is represented by a numerical value in the corresponding data field 3354. For condition types that are not naturally represented in numbers, such as material phase, a number can be assigned to each possible phase.

The analysis model 3302 includes a plurality of neural layers 3356*a-e*. Each neural layer includes a plurality of nodes 3358. Each node 3358 can also be called a neuron. Each node 3358 from the first neural layer 3356*a* receives the data values for each data field from the process conditions vector 3352. Accordingly, in the example of FIG. 23, each node 3358 from the first neural layer 3356*a* receives nine data values because the process conditions vector 3352 has nine data fields. Each neuron 3358 includes a respective internal mathematical function labeled F(x) in FIG. 23. Each node 3358 of the first neural layer 3356*a* generates a scalar value by applying the internal mathematical function F(x) to the data values from the data fields 3354 of the process conditions vector 3352. Further details regarding the internal mathematical functions F(x) are provided below.

Each node 3358 of the second neural layer 3356*b* receives the scalar values generated by each node 3358 of the first neural layer 3356*a*. Accordingly, in the example of FIG. 23 each node of the second neural layer 3356*b* receives four scalar values because there are four nodes 3358 in the first neural layer 3356*a*. Each node 3358 of the second neural layer 3356*b* generates a scalar value by applying the respective internal mathematical function F(x) to the scalar values from the first neural layer 3356*a*.

Each node 3358 of the third neural layer 3356*c* receives the scalar values generated by each node 3358 of the second neural layer 3356*b*. Accordingly, in the example of FIG. 23 each node of the third neural layer 3356*c* receives five scalar values because there are five nodes 3358 in the second neural layer 3356*b*. Each node 3358 of the third neural layer 3356*c* generates a scalar value by applying the respective internal mathematical function F(x) to the scalar values from the nodes 3358 of the second neural layer 3356*b*.

Each node 3358 of the neural layer 3356*d* receives the scalar values generated by each node 3358 of the previous neural layer (not shown). Each node 3358 of the neural layer 3356*d* generates a scalar value by applying the respective internal mathematical function F(x) to the scalar values from the nodes 3358 of the second neural layer 3356*b*.

The final neural layer includes only a single node 3358. The final neural layer receives the scalar values generated by each node 3358 of the previous neural layer 3356*d*. The node 3358 of the final neural layer 3356*e* generates a data value 3368 by applying a mathematical function F(x) to the scalar values received from the nodes 3358 of the neural layer 3356*d*.

In the example of FIG. 23, the data value 3368 corresponds to the predicted remaining thickness of a thin film generated by process conditions data corresponding to values included in the process conditions vector 3352. In other embodiments, the final neural layer 3356*e* may generate multiple data values each corresponding to a particular thin-film characteristic such as thin-film crystal orientation, thin-film uniformity, or other characteristics of a thin film. The final neural layer 3356*e* will include a respective node 3358 for each output data value to be generated. In the case of a predicted thin film thickness, engineers can provide constraints that specify that the predicted thin film thickness 3368 must fall within a selected range, such as between 0 nm and 50 nm, in one example. The analysis model 3302 will adjust internal functions F(x) to ensure that the data value 3368 corresponding to the predicted thin film thickness will fall within the specified range.

During the machine learning process, the analysis model compares the predicted remaining thickness in the data value 3368 to the actual remaining thickness of the thin-film as indicated by the data value 3370. As set forth previously, the training set data 3306 includes, for each set of historical process conditions data, thin-film characteristics data indicating the characteristics of the thin-film that resulted from the historical thin-film etching process. Accordingly, the data field 3370 includes the actual remaining thickness of the thin-film that resulted from the etching process reflected in the process conditions vector 3352. The analysis model 3302 compares the predicted remaining thickness from the data value 3368 to the actual remaining thickness from the data value 3370. The analysis model 3302 generates an error value 3372 indicating the error or difference between the predicted remaining thickness from the data value 3368 and the actual remaining thickness from the data value 3370. The error value 3372 is utilized to train the analysis model 3302.

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x)=x1*w1+x2*w2+\ldots xn*w1+b.$$

In the equation above, each value x1-xn corresponds to a data value received from a node 3358 in the previous neural layer, or, in the case of the first neural layer 3356*a*, each value x1-xn corresponds to a respective data value from the data fields 3354 of the process conditions vector 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356*a*-3356*e*. After the analysis model 3302 adjusts the weighting values w1-wn, the analysis model 3302 again provides the process conditions vector 3352 to the input neural layer 3356*a*. Because the weighting values are different for the various nodes 3358 of the analysis model 3302, the predicted remaining thickness 3368 will be different than in the previous iteration. The analysis model 3302 again generates an error value 3372 by comparing the actual remaining thickness 3370 to the predicted remaining thickness 3368.

The analysis model 3302 again adjusts the weighting values w1-wn associated with the various nodes 3358. The analysis model 3302 again processes the process conditions vector 3352 and generates a predicted remaining thickness 3368 and associated error value 3372. The training process includes adjusting the weighting values w1-wn in iterations until the error value 3372 is minimized.

FIG. 23 illustrates a single process conditions vector 3352 being passed to the analysis model 3302. In practice, the training process includes passing a large number of process conditions vectors 3352 through the analysis model 3302, generating a predicted remaining thickness 3368 for each process conditions vector 3352, and generating associated error value 3372 for each predicted remaining thickness. The training process can also include generating an aggregated error value indicating the average error for all the predicted remaining thicknesses for a batch of process conditions vectors 3352. The analysis model 3302 adjusts the weighting values w1-wn after processing each batch of process conditions vectors 3352. The training process continues until the average error across all process conditions vectors 3352 is less than a selected threshold tolerance. When the average error is less than the selected threshold tolerance, the analysis model 3302 training is complete and the analysis model is trained to accurately predict the thickness of thin films based on the process conditions. The analysis model 3302 can then be used to predict thin-film thicknesses and to select process conditions that will result in a desired thin-film thickness. During use of the trained model 3302, a process conditions vector, representing current process condition for a current thin film etching process to be performed, and having the same format at the process conditions vector 3352, is provided to the trained analysis model 3302. The trained analysis model 3302 can then predict the thickness of a thin film that will result from those process conditions.

A particular example of a neural network based analysis model 3302 has been described in relation to FIG. 23. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 24:
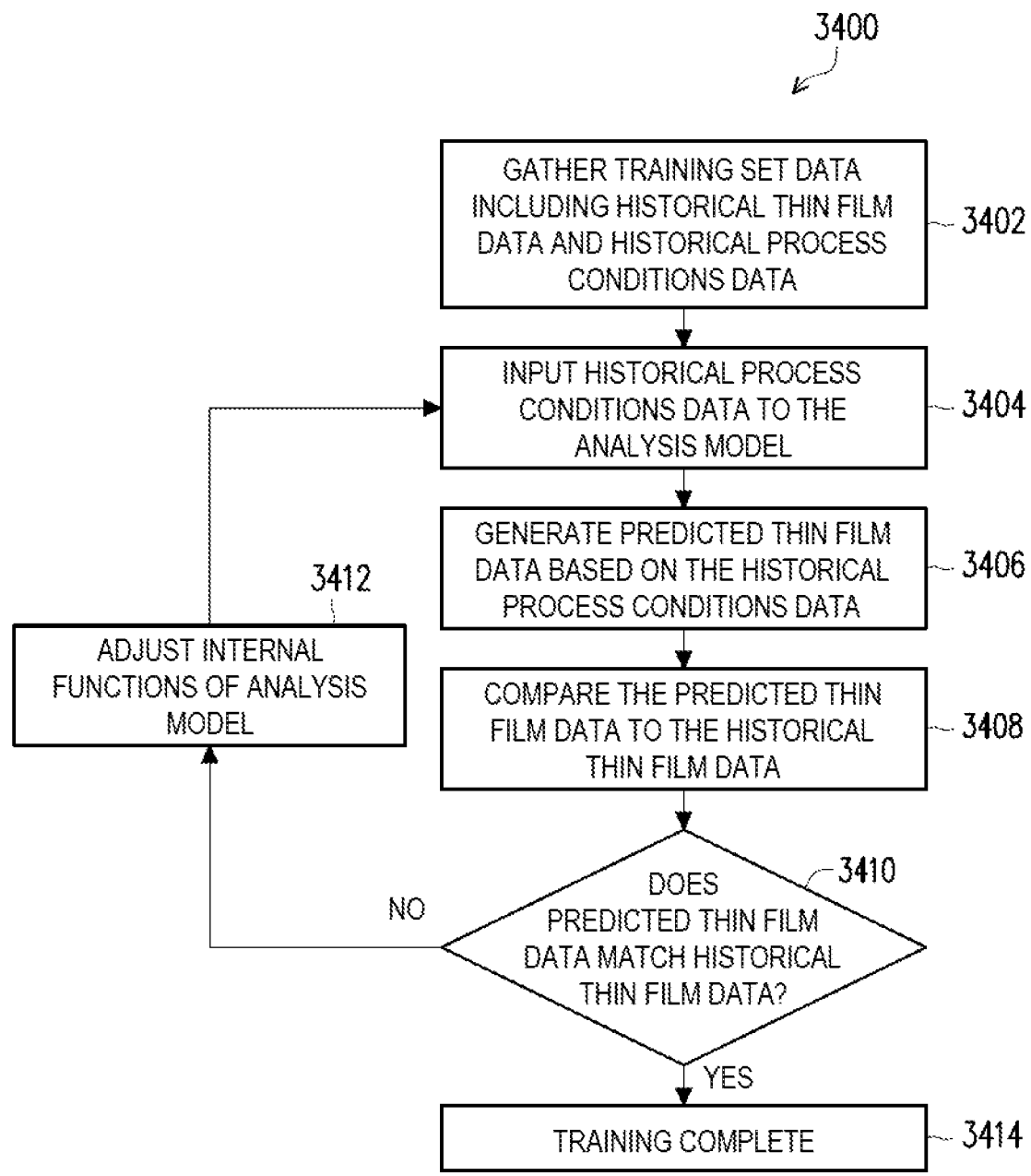

FIG. 24 is a flow diagram of a process 3400 for training an analysis model to identify process conditions that will result in proper etching of a thin film, according to one embodiment. One example of an analysis model is the analysis model 3302 of FIG. 22. The various steps of the process 3400 can utilize components, processes, and techniques described in relation to FIGS. 20-23. Accordingly, FIG. 24 is described with reference to FIGS. 20-23.

At 3402, the process 3400 gathers training set data including historical thin-film data and historical process conditions data. This can be accomplished by using a data mining system or process. The data mining system or process can gather training set data by accessing one or more databases associated with the semiconductor process system 3200 and collecting and organizing various types of data contained in the one or more databases. The data mining system or process, or another system or process, can process and format the collected data in order to generate a training set data. The training set data 3306 can include historical thin-film data 3308 and historical process conditions data 3310 as described in relation to FIG. 22.

At 3404, the process 3400 inputs historical process conditions data to the analysis model. In one example, this can include inputting historical process conditions data 3310 into the analysis model 3302 with the training module 3304 as described in relation to FIG. 22. The historical process conditions data can be provided in consecutive discrete sets to the analysis model 3302. Each discrete set can correspond to a single thin-film etching process or a portion of a single thin-film etching process. The historical process conditions data can be provided as vectors to the analysis model 3302. Each set can include one or more vectors formatted for reception processing by the analysis model 3302. The historical process conditions data can be provided to the analysis model 3302 in other formats without departing from the scope of the present disclosure.

At 3406, the process 3400 generates predicted thin-film data based on historical process conditions data. In particular, the analysis model 3302 generates, for each set of historical thin-film conditions data 3310, predicted thin-film data. The predicted thin-film data corresponds to a prediction of characteristics, such as the remaining thickness, of a thin film that would result from that particular set of process conditions. The predicted thin-film data can include thickness, uniformity, composition, crystal structure, or other aspects of a remaining thin film.

At 3408, the predicted thin-film data is compared to the historical thin-film data 3308. In particular, the predicted thin-film data for each set of historical process conditions data is compared to the historical thin-film data 3308 associated with that set of historical process conditions data. The comparison can result in an error function indicating how closely the predicted thin-film data matches the historical thin-film data 3308. This comparison is performed for each set of predicted thin-film data. In one embodiment, this process can include generating an aggregated error function or indication indicating how the totality of the predicted thin-film data compares to the historical thin-film data 3308. These comparisons can be performed by the training module 3304 or by the analysis model 3302. The comparisons can include other types of functions or data than those described above without departing from the scope of the present disclosure.

At 3410, the process 3400 determines whether the predicted thin-film data matches the historical thin-film data based on the comparisons generated at step 3408. For example, the process determines whether the predicted remaining thickness matches the actual remaining thickness after a historical etching process. In one example, if the aggregate error function is less than an error tolerance, then the process 3400 determines that the thin-film data matches the historical thin-film data. In one example, if the aggregate error function is greater than an error tolerance, then the process 3400 determines that the thin-film data does not match the historical thin-film data. In one example, the error tolerance can include a tolerance between 0.1 and 0. In other words, if the aggregate percentage error is less than 0.1, or 10%, then the process 3400 considers that the predicted thin-film data matches the historical thin-film data. If the aggregate percentage error is greater than 0.1 or 10%, then the process 3400 considers that the predicted thin-film data does not match the historical thin-film data. Other tolerance ranges can be utilized without departing from the scope of the present disclosure. Error scores can be calculated in a variety of ways without departing from the scope of the present disclosure. The training module 3304 or the analysis model 3302 can make the determinations associated with process step 3410.

In one embodiment, if the predicted thin-film data does not match the historical thin-film data 3308 at step 3410, then the process proceeds to step 3412. At step 3412, the process 3400 adjusts the internal functions associated with the analysis model 3302. In one example, the training module 3304 adjusts the internal functions associated with the analysis model 3302. From step 3412, the process returns to step 3404. At step 3404, the historical process conditions data is again provided to the analysis model 3302. Because the internal functions of the analysis model 3302 have been adjusted, the analysis model 3302 will generate different predicted thin-film data that in the previous cycle. The process proceeds to steps 3406, 3408 and 3410 and the aggregate error is calculated. If the predicted thin-film data does not match the historical thin-film data, then the process returns to step 3412 and the internal functions of the analysis model 3302 are adjusted again. This process proceeds in iterations until the analysis model 3302 generates predicted thin-film data that matches the historical thin-film data 3308.

In one embodiment, if the predicted thin-film data matches the historical thin-film data then process step 3410, in the process 3400, proceeds to 3414. At step 3414 training is complete. The analysis model 3302 is now ready to be utilized to identify process conditions and can be utilized in thin-film etching processes performed by the semiconductor process system 3200. The process 3400 can include other steps or arrangements of steps than shown and described herein without departing from the scope of the present disclosure.

Figure 25:
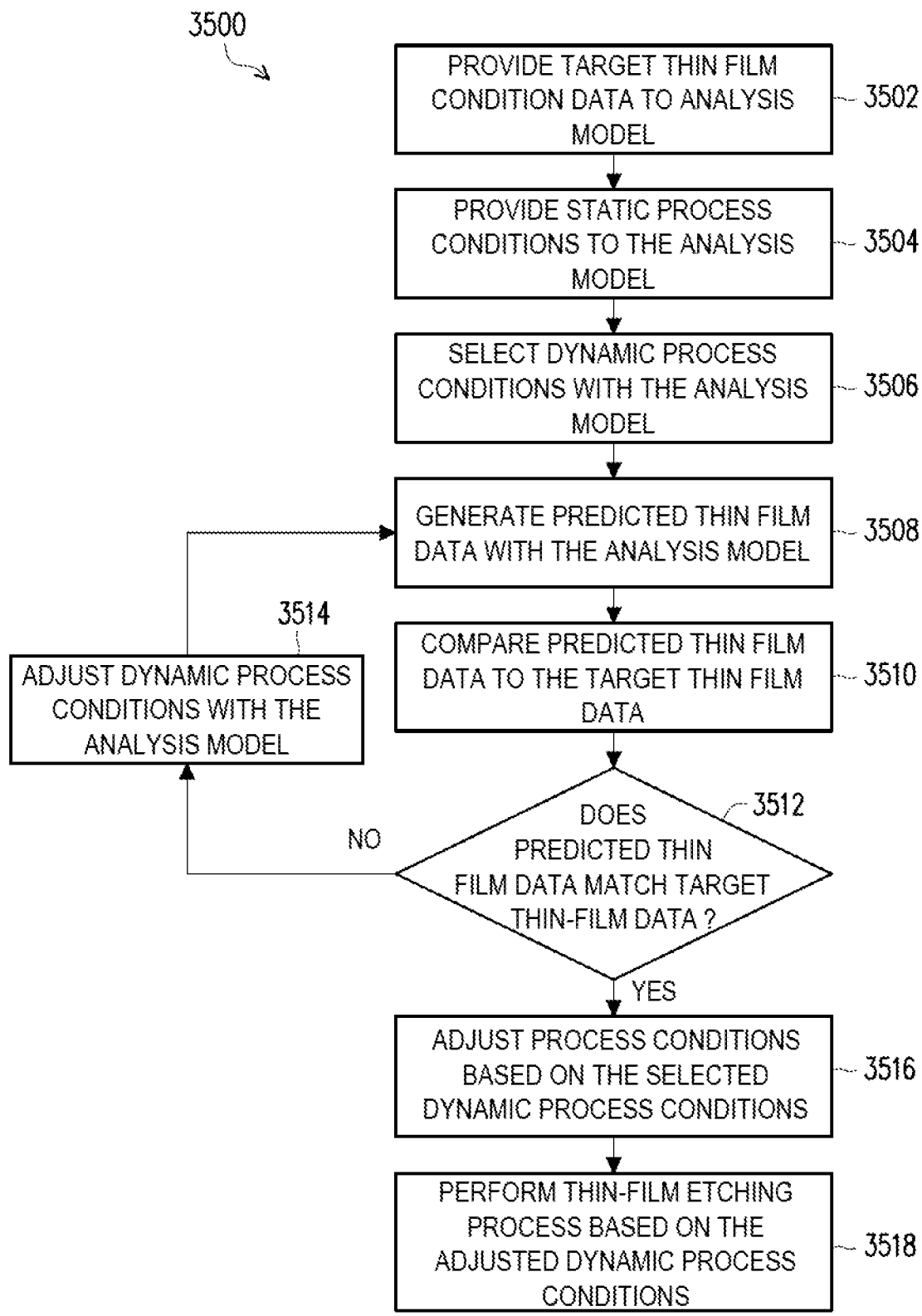

FIG. 25 is a flow diagram of a process 3500 for dynamically selecting process conditions for thin-film etching process and for performing a thin-film etching process, according to one embodiment. The various steps of the process 3500 can utilize components, processes, and techniques described in relation to FIGS. 20-24. Accordingly, FIG. 25 is described with reference to FIGS. 20-24.

At 3502, the process 3500 provides target thin-film conditions data to the analysis model 3302. The target thin-film conditions data identifies selected characteristics of a thin film to be formed by thin-film etching process. The target thin-film conditions data can include a target remaining thickness, a target composition, target crystal structure, or other characteristics of the thin film. The target thin-film conditions data can include a range of thicknesses. The target condition or characteristics that can be selected are based on thin film characteristic(s) utilized in the training process. In the example of FIG. 25, the training process focused on thin film thickness.

At 3504, the process 3500 provides static process conditions to the analysis model 3302. The static process conditions include process conditions that will not be adjusted for a next thin-film etching process. The static process conditions can include the target device pattern density indicating the density of patterns on the wafer on which the thin-film etching process will be performed. The static process conditions can include an effective plan area crystal orientation, an effective plan area roughness index, an effective sidewall area of the features on the surface of the semiconductor wafer, an exposed effective sidewall tilt angle, an exposed surface film function group, an exposed sidewall film function group, a rotation or tilt of the semiconductor wafer, process gas parameters (materials, phase of materials, and temperature of materials), a remaining amount of material fluid in the fluid sources 3208 and 3210, a remaining amount of fluid in the purge sources 3212 and 3214, a humidity within a process chamber, an age of an ampoule utilized in the etching process, light absorption or reflection within the process chamber, the length of pipes or conduits that will provide fluids to the process chamber, or other conditions. The static process conditions can include conditions other than those described above without departing from the scope of the present disclosure. Furthermore, in some cases, some of the static process conditions listed above may be dynamic process conditions subject to adjustment as will be described in more detail below. In the example of FIG. 25, dynamic process conditions include temperature, pressure, humidity, and flow rate. Static process conditions include phase, ampoule age, etching area, etching density, and sidewall angle.

At 3506, the process 3500 selects dynamic process conditions for the analysis model, according to one embodiment. The dynamic process conditions can include any process conditions not designated as static process conditions. For example, the training set data may include a large number of various types of process conditions data in the historical process conditions data 3310. Some of these types of process conditions will be defined the static process conditions and some of these types of process conditions will be defined as dynamic process conditions. Accordingly, when the static process conditions are supplied at operation 3504, the remaining types of process conditions can be defined as dynamic process conditions. The analysis model 3302 can initially select initial values for the dynamic process conditions. After the initial values have been selected for the dynamic process conditions, the analysis model has a full set of process conditions to analyze. In one embodiment, the initial values for the dynamic process conditions may be selected based on previously determined starter values, or in accordance with other schemes.

The dynamic process conditions can include the flow rate of fluids or materials from the fluid sources 3208 and 3210 during the etching process. The dynamic process conditions can include the flow rate of fluids or materials from the purge sources 3212 and 3214. The dynamic process conditions can include a pressure within the process chamber, a temperature within the process chamber, a humidity within the process chamber, durations of various steps of the etching process, or voltages or electric field generated within the process chamber. The dynamic process conditions can include other types of conditions without departing from the scope of the present disclosure.

At 3508, the analysis model 3302 generates predicted thin-film data based on the static and dynamic process conditions. The predicted thin-film data includes the same types of thin-film characteristics established in the target thin-film conditions data. In particular, the predicted thin-film data includes the types of predicted thin-film data from the training process described in relation to FIGS. 21-25. For example, the predicted thin-film data can include thin-film thickness, film composition, or other parameters of thin films.

At 3510, the process compares the predicted thin-film data to the target thin-film data. In particular, the analysis model 3302 compares the predicted thin-film data to the target thin-film data. The comparison indicates how closely the predicted thin-film data matches the target thin-film data. The comparison can indicate whether or not predicted thin-film data falls within tolerances or ranges established by the target thin-film data. For example, if the target thin-film thickness is between 1 nm and 9 nm, then the comparison will indicate whether the predicted thin-film data falls within this range.

At 3512, if the predicted thin-film data does not match the target thin-film data, then the process proceeds to 3514. At 3514, the analysis model 3302 adjusts the dynamic process conditions data. From 3514 the process returns to 3508. At 3508, the analysis model 3302 again generates predicted thin-film data based on the static process conditions and the adjusted dynamic process conditions. The analysis model then compares the predicted thin-film data to the target thin-film data at 3510. At 3512, if the predicted thin-film data does not match the target thin-film data, then the process proceeds to 3514 and the analysis model 3302 again adjusts the dynamic process conditions. This process proceeds until predicted thin-film data is generated that matches the target thin-film data. If the predicted thin-film data matches the target thin-film data 3512, then the process proceeds to 3516.

At 3516, the process 3500 adjusts the thin-film process conditions of the semiconductor process system 3200 based on the dynamic process conditions that resulted in predicted thin-film data within the target thin-film data. For example, the control system 3224 can adjust fluid flow rates, etching step durations, pressure, temperature, humidity, or other factors in accordance with the dynamic process conditions data.

At 3518, the semiconductor process system 3200 performs a thin-film etching process in accordance with the adjusted dynamic process conditions identified by the analysis model. In one embodiment, the thin-film etching process is an ALE process. However, other thin-film etching processes can be utilized without departing from the scope of the present disclosure. In one embodiment, the semiconductor process system 3200 adjusts the process parameters based on the analysis model between individual etching stages in a thin-film etching process. For example, in an ALE process, the thin-film is etched one layer at a time. The analysis model 3302 can identify parameters to be utilized for etching of the next layer. Accordingly, the semiconductor process system can adjust etching conditions between the various etching stages.

Embodiments may provide advantages. The GAA capacitors 20C, 20D including either the heavily doped channels 26 or the channels 28, respectively, allow for an increase in device density. The ability to stack wafers including the GAA capacitors 20C, 20D with wafers either including or free of the GAA capacitors 20C, 20D allows for an increase in design flexibility, and a novel way to form highly dense DRAM packages.

In accordance with at least one embodiment, a device comprises a substrate; a first nanostructure over the substrate, comprising a semiconductor having a first resistance; a second nanostructure over the substrate, offset laterally from the first nanostructure, at about the same height above the substrate as the first nanostructure, comprising a conductor having a second resistance lower than the first resistance; a first gate structure over and wrapped around the first nanostructure; and a second gate structure over and wrapped around the second nanostructure.

In accordance with at least one embodiment, a device comprises a first capacitor of a second wafer. The first capacitor comprises a first channel having a first end contacting a first epitaxial region, and a second end contacting a second epitaxial region; a first gate structure over and wrapped around the first channel; and a first contact over and contacting the first epitaxial region. The device further comprises a first transistor of a first wafer bonded to the second wafer, the first transistor overlying the first capacitor. The first transistor comprises a second channel having a first end contacting a third epitaxial region, and a second end contacting a fourth epitaxial region; a second gate structure over and wrapped around the second channel; and a backside via contacting the third epitaxial region, and electrically connected to the first epitaxial region.

In accordance with at least one embodiment, a method comprises forming a first semiconductor fin protruding from a substrate; forming a first gate structure over the first semiconductor fin; forming first channels of the first semiconductor fin by etching regions of the first semiconductor fin exposed by the first gate structure; reducing resistivity of the first channels of the first semiconductor fin to below about 100 ohms/square; and forming first and second source/drain regions on either side of the first gate structure and the first channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device, comprising:
a substrate;
a first nanostructure over the substrate, including a semiconductor having a first resistance;
a second nanostructure over the substrate, offset laterally from the first nanostructure, including a conductor having a second resistance lower than the first resistance, the second resistance being less than about 100 ohms/square;
a first gate structure over and wrapped around the first nanostructure; and
a second gate structure over and wrapped around the second nanostructure.

2. The device of claim 1, wherein:
the first nanostructure includes dopants in the semiconductor at a first doping concentration;
the conductor of the second nanostructure includes the semiconductor and the dopants at a second doping concentration; and
a ratio of the second doping concentration to the first doping concentration is at least about 100.

3. The device of claim 2, wherein the dopants comprise boron, aluminum, gallium, indium, or a combination thereof.

4. The device of claim 1, wherein the conductor of the second nanostructure comprises a metal nitride.

5. The device of claim 4, wherein the metal nitride comprises TiN or TaN.

6. The device of claim 1, wherein:
the first nanostructure is a nanosheet or nanowire of a field effect transistor; and
the second nanostructure is a nanosheet or nanowire of an integrated capacitor.

7. The device of claim 1, further comprising:
a first source/drain in contact with the first and second nanostructures;
a first contact over and contacting a first side of the first source/drain; and
a backside via under and contacting a second side of the first source/drain that is opposite the first side.

8. A device, comprising:
a first capacitor of a second die, the first capacitor including:
a first source/drain;
a second source/drain;
a first channel having a first end contacting the first source/drain, and a second end contacting the second source/drain; and
a first contact over and contacting the first source/drain; and
a first transistor of a first die bonded to the second die, the first transistor overlying the first capacitor, the first transistor including:
a third source/drain;
a fourth source/drain;
a second channel having a first end contacting the third source/drain, and a second end contacting the fourth source/drain; and
a backside via contacting the third source/drain, and electrically connected to the first source/drain.

9. The device of claim 8, wherein the first channel comprises a semiconductor doped at a doping concentration in a range of about $10^{16}$ atoms/cm$^3$ to about $10^{21}$ atoms/cm$^3$.

10. The device of claim 8, wherein the first channel comprises a metal nitride.

11. The device of claim 8, further comprising:
a second transistor of the second die; and
a third transistor of the first die;
wherein the third transistor overlies the second transistor, and a fifth source/drain of the third transistor is electrically connected to a sixth source/drain of the second transistor by at least one metal-to-metal bond at an interface of the first die and the second die.

12. The device of claim 11, wherein a third channel of the second transistor has a doping concentration less than about $10^{13}$ atoms/cm$^3$.

13. The device of claim 8, wherein the backside via is separated from the fourth source/drain by a buffer layer.

14. A method, comprising:
forming a stack of nanostructures over a substrate;
reducing resistivity of the nanostructures to below about 100 ohms/square;
forming a first gate structure over the stack of nanostructures;
forming first channels by etching regions of the nanostructures exposed by the first gate structure; and
forming first and second source/drain regions on either side of the first gate structure and the first channels.

15. The method of claim 14, wherein the reducing resistivity comprises:
doping semiconductor layers of the nanostructures to a dopant concentration between about $10^{16}$ atoms/cm$^3$ to about $10^{21}$ atoms/cm$^3$.

16. The method of claim 15, wherein the doping is by a solid phase diffusion process.

17. The method of claim 15, wherein the doping is performed on regions of a wafer exposed by a mask for forming capacitors, and the mask overlies at least regions of the wafer for forming active transistors.

18. The method of claim 14, wherein the reducing resistivity includes:
replacing the first channels with a metal nitride.

19. The method of claim 18, wherein the reducing resistivity includes:
replacing the first and second source/drain regions with the metal nitride.

20. The method of claim 18, further comprising:
forming a barrier layer on the substrate prior to forming the stack, wherein the barrier layer is between the first channels and the substrate.

* * * * *